US012757710B2

(12) United States Patent
Chen et al.

(10) Patent No.: US 12,757,710 B2
(45) Date of Patent: Oct. 6, 2026

(54) SEMICONDUCTOR DEVICE STRUCTURE INCLUDING FORKSHEET TRANSISTORS AND METHODS OF FORMING THE SAME

(71) Applicant: TAIWAN SEMICONDUCTOR MANUFACTURING COMPANY, LTD., Hsinchu (TW)

(72) Inventors: Hong-Chih Chen, Changhua (TW); Chun-Sheng Liang, Changhua (TW); Yu-San Chien, Hsinchu (TW); Wei-Chih Kao, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 702 days.

(21) Appl. No.: 18/099,952

(22) Filed: Jan. 22, 2023

(65) Prior Publication Data

US 2024/0178128 A1 May 30, 2024

Related U.S. Application Data

(60) Provisional application No. 63/428,638, filed on Nov. 29, 2022.

(51) Int. Cl.
*H10W 20/00* (2026.01)
*H10D 30/67* (2025.01)
(Continued)

(52) U.S. Cl.
CPC ........ *H10W 20/42* (2026.01); *H10D 30/6729* (2025.01); *H10D 30/6757* (2025.01);
(Continued)

(58) Field of Classification Search
CPC ............... H01L 23/5226; H01L 23/485; H01L 21/76807; H01L 21/76895; H10D 30/6729; H10D 30/6757; H10D 30/6735; H10D 62/121; H10D 64/017; H10D 84/0149; H10D 84/0158; H10D 84/038; H10D 84/83; H10D 84/85
(Continued)

(56) References Cited

U.S. PATENT DOCUMENTS 9,105,490 B2 8/2015 Wang et al.
9,236,267 B2 1/2016 De et al.
(Continued)

*Primary Examiner* — Duy T Nguyen
*Assistant Examiner* — Jiyoung Oh
(74) *Attorney, Agent, or Firm* — NZ Carr Law Office

(57) ABSTRACT

A semiconductor device structure includes a first dielectric wall, a plurality of first semiconductor layers vertically stacked and extending outwardly from a first side of the first dielectric wall, a plurality of second semiconductor layers vertically stacked and extending outwardly from a second side of the first dielectric wall. The structure also includes a first gate electrode layer surrounding at least three surfaces of each of the first semiconductor layers, the first gate electrode layer having a first conductivity type, and a second gate electrode layer surrounding at least three surfaces of each of the second semiconductor layers, the second gate electrode layer having a second conductivity type opposite the first conductivity type. The structure further includes a gate bridge contact disposed on the first dielectric wall, and a gate via contact disposed on the gate bridge contact.

20 Claims, 47 Drawing Sheets

(51) Int. Cl.

| | |
|---|---|
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10W 20/42*** | (2026.01) |

(52) U.S. Cl.
CPC ......... *H10D 62/121* (2025.01); *H10D 64/017* (2025.01); *H10D 84/0149* (2025.01); *H10D 84/0158* (2025.01); *H10D 84/038* (2025.01)

(58) Field of Classification Search
USPC .......................................................... 257/734
See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2020/0105672 | A1* | 4/2020 | Madhavan ............ H01L 23/535 |
| 2020/0286891 | A1* | 9/2020 | Subramanian ....... H10D 64/017 |
| 2020/0328208 | A1* | 10/2020 | Chiang .............. H10D 84/0158 |
| 2021/0126113 | A1* | 4/2021 | Lin .................... H10D 30/6219 |

* cited by examiner

SEMICONDUCTOR DEVICE STRUCTURE INCLUDING FORKSHEET TRANSISTORS AND METHODS OF FORMING THE SAME

CROSS-REFERENCE TO RELATED APPLICATIONS

This application claims priority to U.S. Provisional Application Ser. No. 63/428,638 filed Nov. 29, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-14A are cross-sectional side views of various stages of manufacturing the semiconductor device structure taken along line A-A of FIG. 3C, in accordance with some embodiments.

FIGS. 3B-14B are cross-sectional side views of various stages of manufacturing the semiconductor device structure taken along line B-B of FIG. 3C, in accordance with some embodiments.

FIGS. 3C-14C are top views of the semiconductor device structure of FIG. 2 in accordance with some embodiments.

FIGS. 15A-26A are cross-sectional views of various stages of manufacturing the semiconductor device structure taken along line A-A of FIG. 14C, in accordance with some embodiments.

FIGS. 15B-26B are cross-sectional side views of various stages of manufacturing the semiconductor device structure taken along line B-B of FIG. 14C, in accordance with some embodiments.

FIGS. 15C-26C are top views of various stages of manufacturing the semiconductor device structure of FIG. 14A.

FIG. 5A-1 is a cross-sectional view of one of various stages of manufacturing the semiconductor device structure, in accordance with some embodiments.

FIG. 8A-1 is a cross-sectional view of one of various stages of manufacturing the semiconductor device structure, in accordance with some embodiments.

FIGS. 20A-1 and 20A-2 illustrate cross-sectional views of one of various stages of manufacturing the semiconductor device structure, in accordance with some alternative embodiments.

FIGS. 21D-26D illustrate cross-sectional side views of various stages of manufacturing the semiconductor device structure taken along line D-D of FIG. 21C, in accordance with some embodiments.

FIG. 23A-1 illustrates an enlarged view of a portion of the semiconductor device structure of FIG. 23A, in accordance with some embodiments.

FIG. 26A-1 illustrates an enlarged view of a portion of the semiconductor device structure of FIG. 26A, in accordance with some embodiments.

FIG. 26C-1 is a top view of the semiconductor device structure of FIG. 26C showing locations of various devices/elements, in accordance with some embodiments.

DETAILED DESCRIPTION

Figure 1:
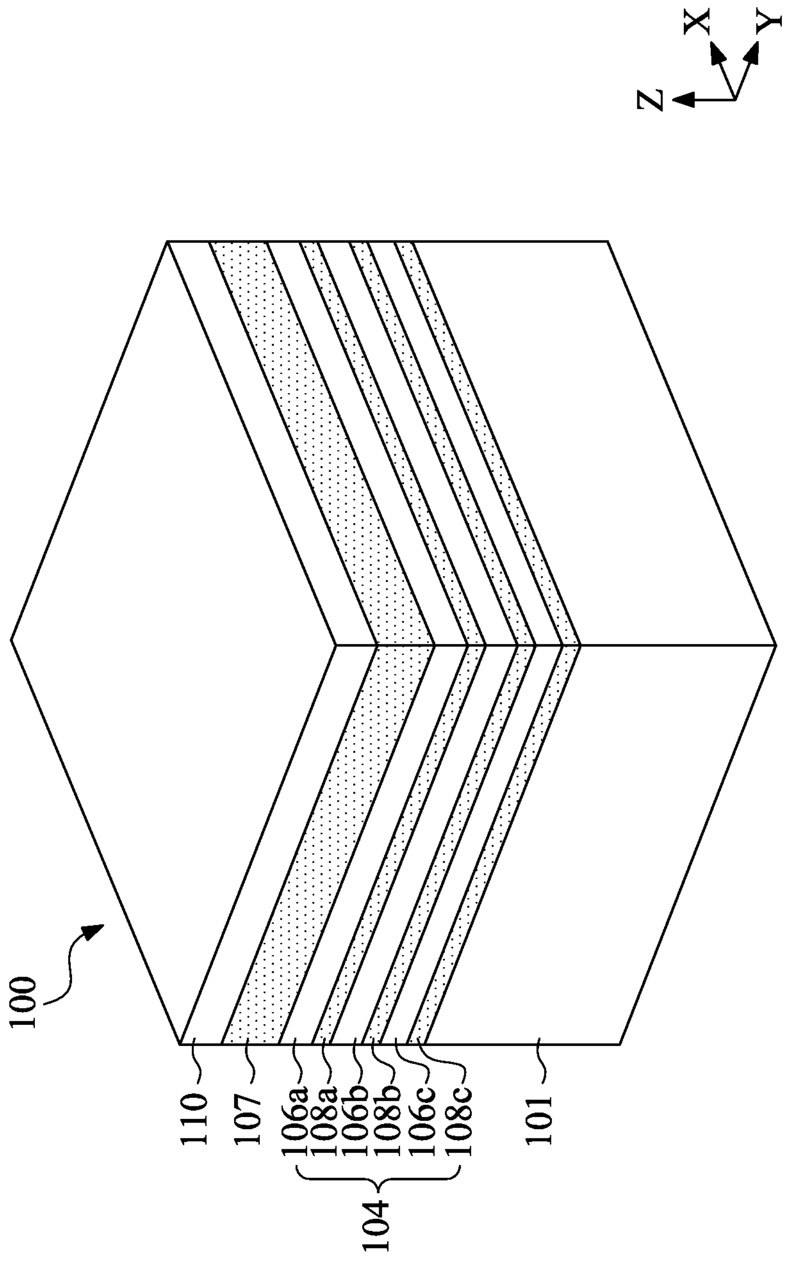
FIGS. 1-2 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-28 show exemplary sequential processes for manufacturing a semiconductor device structure 100, in accordance with some embodiments. It is understood that additional operations can be provided before, during, and after processes shown by FIGS. 1-28, and some of the operations described below can be replaced or eliminated, for additional embodiments of the method. The order of the operations/processes may be interchangeable.

FIG. 1 is a perspective view of one of various stages of manufacturing the semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been doped with impurities (e.g., dopants having p-type or n-type conductivity). Depending on circuit design, the dopants may be, for example boron for a p-type (or p-channel) field effect transistor (FET) and phosphorus for an n-type (or n-channel) FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 (**106*a*-106*c*) and second semiconductor layers 108 (108*a*-108*c*). In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108** may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channels of the semiconductor device structure 100, which are to be constructed as forksheet FETs in later fabrication stages. As will be discussed in more details below, in forksheet FETs, both n-channel FETs and p-channel FETs are integrated in the same device structure. A dielectric wall separates the n-channel FETs and p-channel FETs. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. Portions of the nanosheet channel(s) of the semiconductor device structure 100 may be surrounded by a gate electrode. For example, the nanosheet channel(s) of a forksheet transistor may have at least three surfaces surrounded by the gate electrode. While the semiconductor device structure 100 is shown to include forksheet transistors, the semiconductor device structure 100 may include also include nanosheet transistor(s). The nanosheet transistors may be referred to as nanowire transistors, gate-all-around (GAA) transistors, multi-bridge channel (MBC) transistors, or any transistors having the gate electrode surrounding the channels.

It is noted that while three layers of the first semiconductor layers 106 and three layers of the second semiconductor layers 108 are alternately arranged as illustrated in FIG. 1, it can be appreciated that any number of first and second semiconductor layers 106, 108 can be formed in the stack of semiconductor layers 104, depending on the predetermined number of channels for the semiconductor device structure 100. In some embodiments, the number of first semiconductor layers 106, which is the number of channels, is between 2 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The substrate 101 may include a sacrificial layer 107 on the stack of semiconductor layers 104. The sacrificial layer 107 protects the stack of semiconductor layers 104 during the subsequent processes and is removed along with a portion of a cladding layer 132 (FIG. 8A) prior to formation of the sacrificial gate stack (FIG. 9A). In cases where the first semiconductor layer 106 of the stack of semiconductor layers 104 is Si, the sacrificial layer 107 includes SiGe that can be epitaxially grown on the first semiconductor layer 106.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. The second semiconductor layers 108 may eventually be removed and serve to define a vertical distance between adjacent channels for the semiconductor device structure 100. The sacrificial layer 107 may have a thickness that is equal, less, or greater than the thickness of the first semiconductor layer 106. The thickness of the sacrificial layer 107 may range from about 2 nm to 50 nm. The thickness of the first semiconductor layer 106, the second semiconductor layer 108, and the sacrificial layer 107 may vary depending on the application and/or device performance considerations.

A mask structure 110 is formed over the sacrificial layer 107. The mask structure 110 may include an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The mask structure 110 may be formed by any suitable deposition process, such as chemical vapor deposition (CVD) process.

Figure 2:
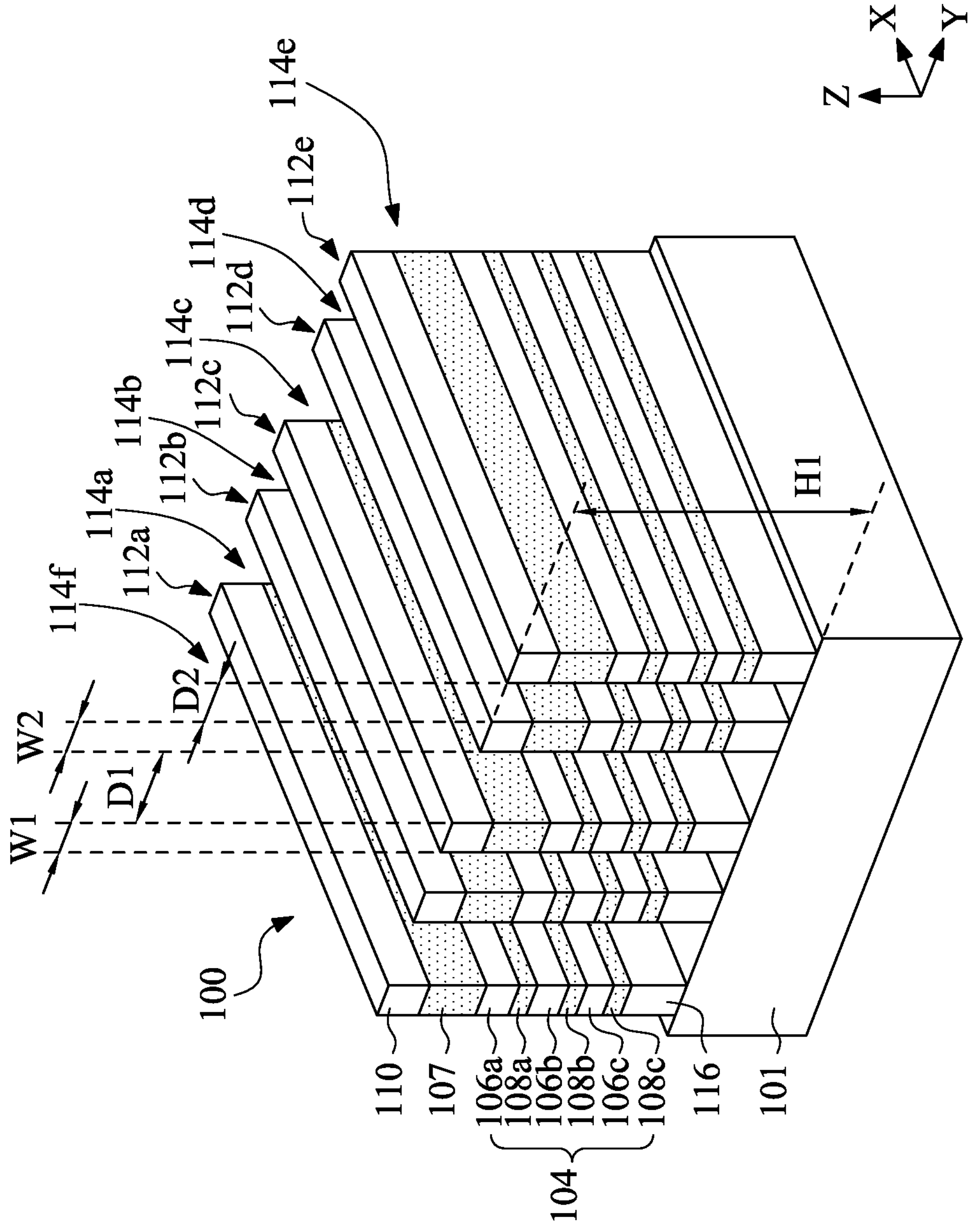
Figure 3A:
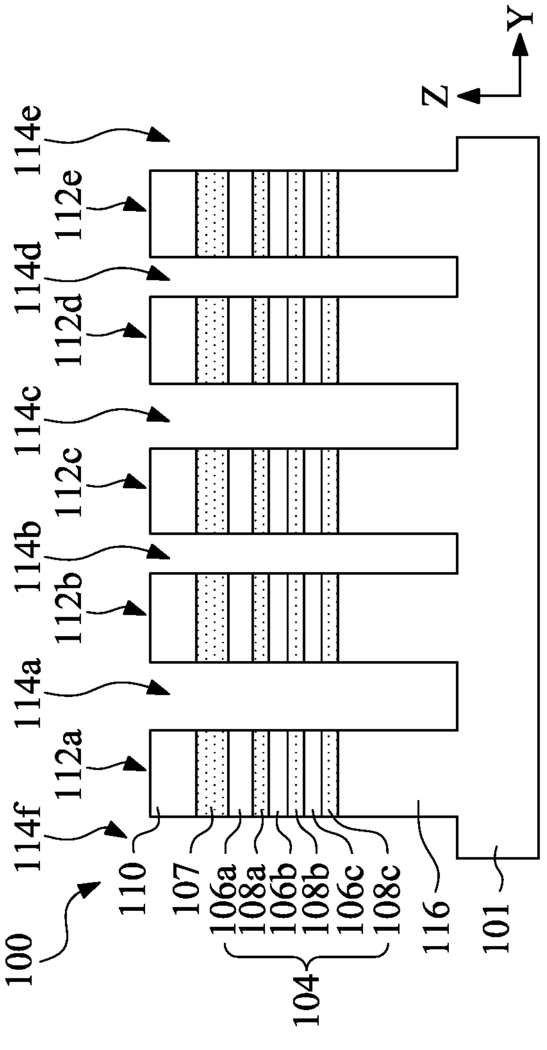
Figure 3B:
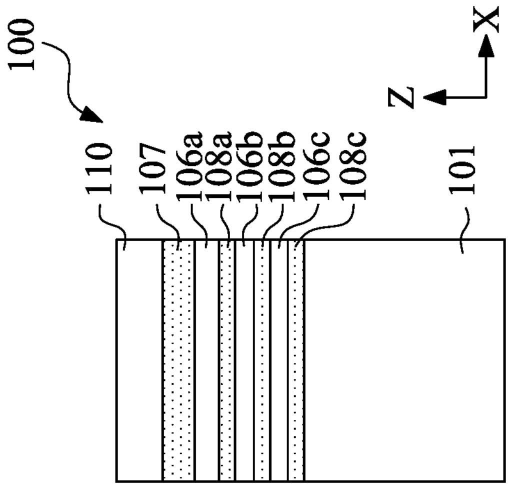
Figure 3C:
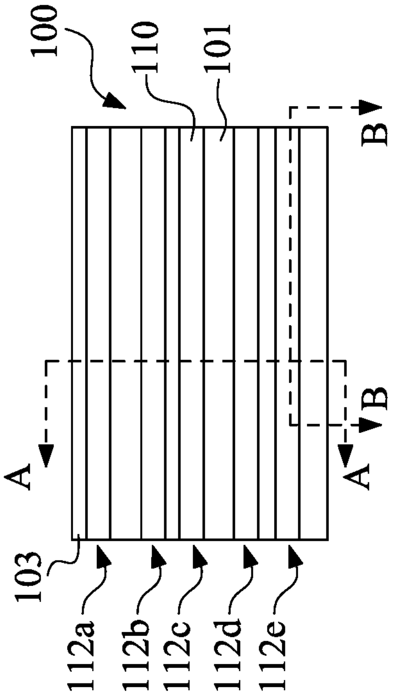

FIG. 2 is a perspective view of one of the various stages of manufacturing the semiconductor device structure 100, in accordance with some embodiments. Fin structures 112 (112*a*-112*e*) are formed from the stack of semiconductor layers 104. Each fin structure 112 has an upper portion including the semiconductor layers 106, 108 and a lower portion which includes a well portion 116 formed from the substrate 101. The fin structures 112 may be fabricated using multi-patterning operations including photo-lithography and etching processes. The etching process can include dry etching, wet etching, reactive ion etching (RIE), and/or other suitable processes. The etching process forms trenches 114 (e.g., 114*a*-114*f*) in unprotected regions through the mask structure 110, through the stack of semiconductor layers 104, and into the substrate 101, thereby leaving the plurality of extending fin structures 112 (e.g., 112*a-e*). The trenches 114 extend along the X direction. The trenches 114 may be etched using a dry etch (e.g., RIE), a wet etch, and/or combination thereof.

As shown in FIG. 2, each fin structure 112*a-e* may have a height H1 in a range of about 25 nm to about 300 nm. The fin structure 112*a-e* may have a width W1. The width W1 may correspond to the device's channel width. In one embodiment, the width W1 is in a range between 5 nm to about 120 nm. The fins 112*a-e* may be separated from each other by a distance. The distance between adjacent fin structures may be defined by the distance between a first sidewall of one fin structure and a second sidewall of the adjacent fin structure facing the first sidewall. For example, the fin structure 112*c* and the fin structure 112*d* are separated by a distance D1. The fin structure 112*d* and the fin structure 112*e* are separated by a distance D2. The first and second distances D1, D2 may vary depending on the layouts of the fin structures in a SRAM cell and/or a logic cell. In one embodiment shown in FIG. 2, the distance D1 is greater than the distance D2. The distance D2 may be in a range from about 2 nm to about 40 nm, for example about 3 nm to about 30 nm. With the smaller distance D2 (i.e., reduced fin-to-fin spacing) between the fin structures 112*c* and 112*d*, layers of a dielectric wall 119 (FIG. 5A) subsequently formed in the trench 114*d* may merge, while the trench 114*c* between the fin structures 112*c* and 112*d* remains open after the deposition of layers of the dielectric wall due to the wider distance D1. The merged layers of the dielectric wall allow the nanosheet channels to attach to both sides of the dielectric feature wall and form forksheet transistors at a later stage. The reduced fin-to-fin spacing and fork-like nanosheet transistors enable greater device density (even with greater channel width) and superior area and performance scalability.

While not shown, the width of the fin structures 112*a*-112*e* may vary depending on the channel width of the devices needed in the semiconductor device structure 100. The devices with a wider channel may be more suitable for high-speed applications, such as a NAND device. The devices with a narrower channel may be more suitable for low-power and low-leakage applications, such as an inverter device. Trenches with wider width (e.g., trench 114*c*) may be formed in regions where devices/transistors require higher voltage current and/or higher performance, while trenches with narrower width (e.g., trench 114*b*) may be formed in regions where greater density of devices/transistors is desired.

Depending on the design layouts of the SRAM cell, the trenches 114*e* and 114*f* may have a width corresponding to the distance D1 or the distance D2. In one embodiment shown in FIG. 2, the trench 114*e* has a width corresponding to the distance D1, and the trench 114*f* has a width corresponding to the distance D2. In some embodiments, a fin structure (not shown) having a width greater than W1 may be disposed adjacent to and spaced apart the fin structure 112*a* by the trench 114*f*. Likewise, a fin structure (not shown) having a width greater than W2 may be disposed adjacent to and spaced apart the fin structure 112*e* by the trench 114*e*.

FIGS. 3C-14C are top views of the semiconductor device structure 100 of FIG. 2, which may represent a portion of the layout of active fin structures in a SRAM cell 103. For example, a 6T SRAM cell may include two pull-up (PU) transistors, two pass-gate (PG) transistors, and two pull-down (PD) transistors. In one embodiment shown in FIGS. 3C-14C, the fin structures 112*b* and 112*c* can be used to form PD transistors or PG transistors and the fin structure 112*a* can be used to form PU transistors in the 6T SRAM cell. FIGS. 3A-14A are cross-sectional side views of various stages of manufacturing the semiconductor device structure 100 taken along line A-A of FIG. 3C, in accordance with some embodiments. FIGS. 3B-14B are cross-sectional side views of various stages of manufacturing the semiconductor device structure 100 taken along line B-B of FIG. 3C, in accordance with some embodiments.

Figure 4A:
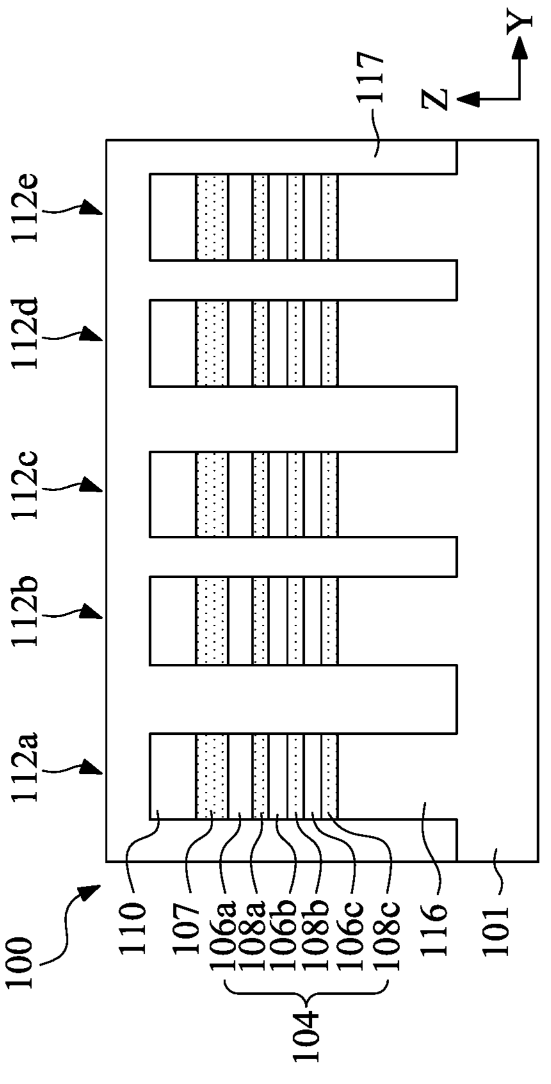
Figure 4B:
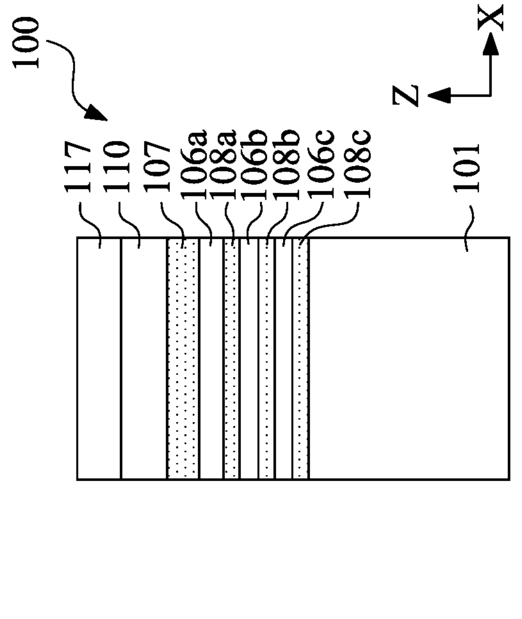
Figure 4C:
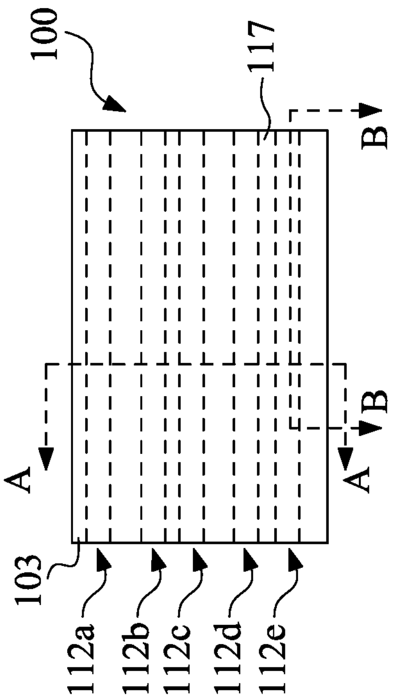

In FIGS. 4A-4C, a dielectric material 117 is formed in the trenches 114*a*-114*f* and over the top surface of the mask structure 110. The dielectric material 117 is deposited so that the fins 112*a-e* are embedded in the dielectric material 117. The dielectric material 117 may include, but are not limited to, SiOx, SiN, SiON, SiCN, SiOCN, $AlSi_xO_y$, $Al_2O_3$, hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), zirconium oxide (ZrO), zirconium silicon oxide (ZrSiO), titanium oxide (TiO), tantalum oxide ($Ta_2O_5$), yttrium oxide ($Y_2O_3$), any suitable low-k materials, any suitable high-k materials, or any combination thereof. The dielectric material 117 may be formed by any suitable process, such as a chemical vapor deposition (CVD), plasma enhanced CVD (PECVD), flowable CVD (FCVD), atomic layer deposition (ALD), or physical vapor deposition (PVD) process.

Figure 5C:
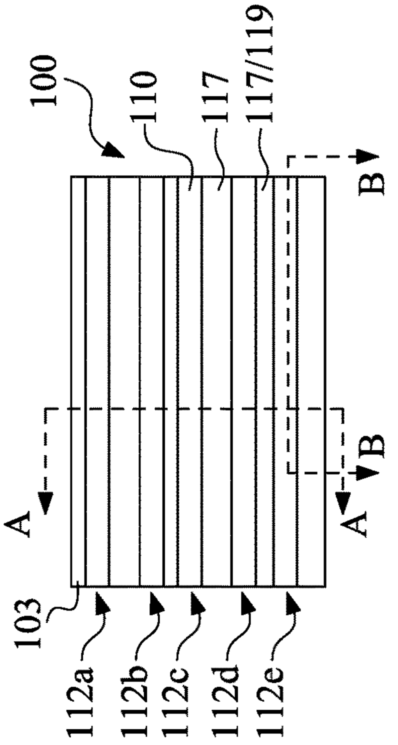
Figure 5B:
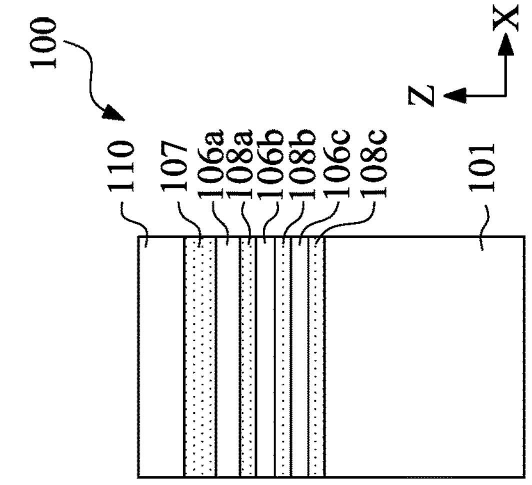
Figure 5A:
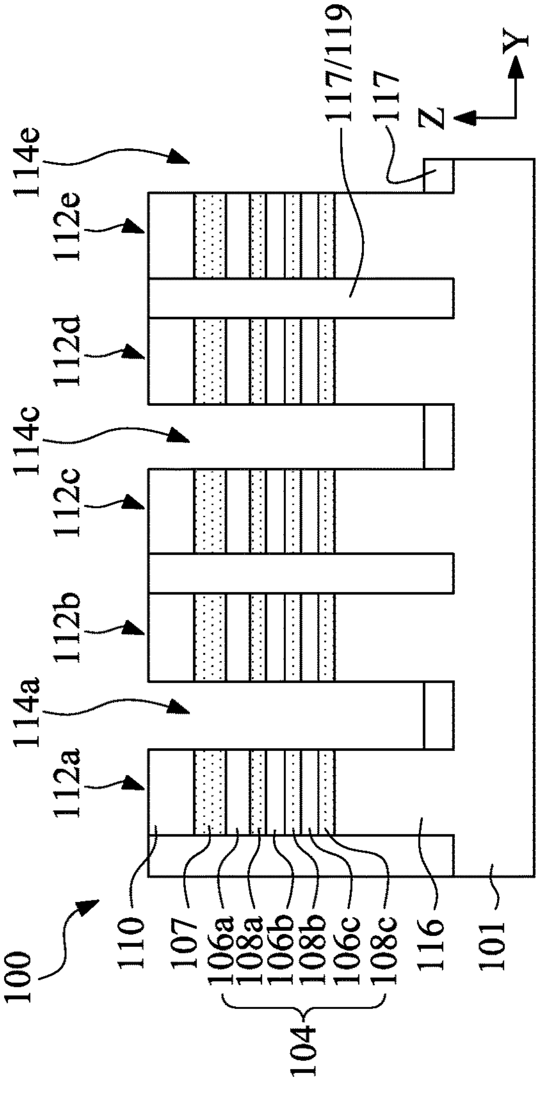
Figures 1, 5A:
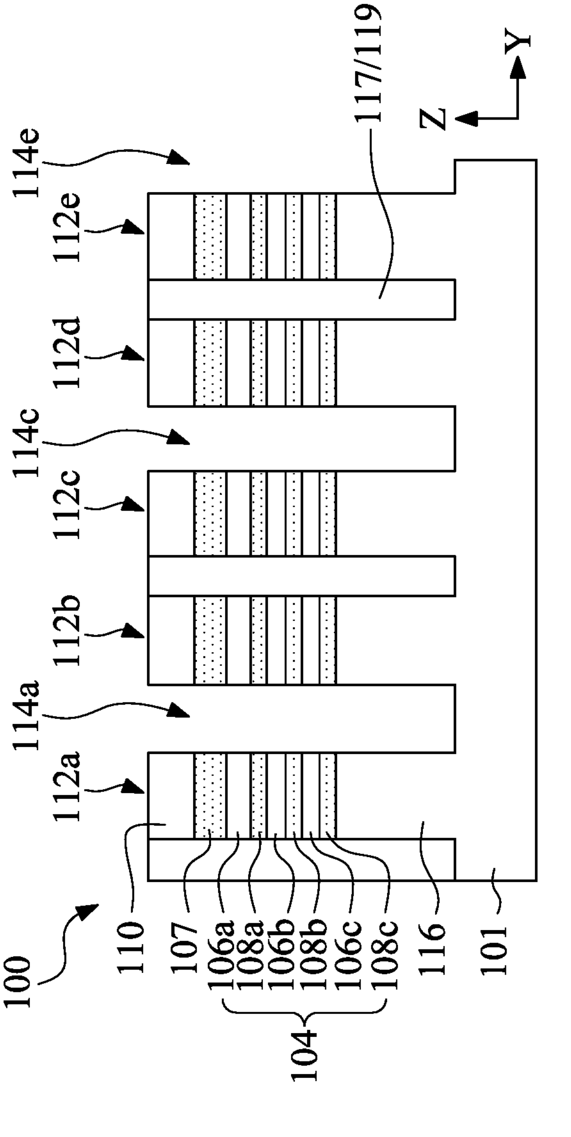

In FIGS. 5A-5C, a planarization operation, such as a chemical mechanical polishing (CMP) method, is performed such that the top of the sacrificial layers 107 is exposed. Next, a removal process is performed to remove the dielectric material 117 from the trenches 114*a* and 114*c*. The removal process may be any suitable etch process, such as dry etch, wet, etch, or a combination thereof. The removal process may be selective etch processes that remove portions of dielectric material 117 but not the mask structure 110, the sacrificial layers 107, the first semiconductor layers 106, and the second semiconductor layers 108. Because the trenches 114*a* and 114*c* have a larger dimension (i.e., distance D1, FIG. 2) in the Y direction compared to that of the trench 114*b*, 114*d*, 114*e*, 114*f* (FIG. 2), the etchant removes more of the dielectric material 117 in the trenches 114*a* and 114*c* than the dielectric material 117 in the trenches 114*b*, 114*d*, 114*e*, 114*f*. As a result, the dielectric material 117 in the trenches 114*a*, 114*c*, 114*d* are etched at a faster rate than the etch rate of the dielectric material 117 in the trench 114*b*. The removal process is performed until the dielectric material 117 in the trenches 114*b*, 114*d*, 114*e*, 114*f* are completely etched away. In some embodiments, bottom portions of the dielectric material 117 in the trenches 114*b*, 114*d*, 114*e*, 114*f* may remain, as shown in FIGS. 5A and 5C. In some embodiments, the removal process is continued until the dielectric material 117 in the trenches 114*b*, 114*d*, 114*e*, 114*f* are completely etched away. In some embodiments, the removal process is continued until the dielectric material 117 in the trenches 114*a*, 114*c*, 114*e* are completely etched away, such as an alternative embodiment shown in FIG. 5A-1. In one exemplary embodiment, the dielectric material 117 remaining in the trenches 114*b*, 114*d*, 114*f* becomes a dielectric wall 119. The dielectric wall 119 extends all the way down to the well portions 116 of the substrate 101. Each dielectric wall 119 isolates adjacent active fin structures (e.g., fin structures 112*b*, 112*c* and fin structures 112*d*, 112*e*), which are to be formed as a forksheet transistor in a SRAM cell. The dielectric walls 119 avoid electrical shorts at transistors, such as two adjacent pull-up transistors in the SRAM cell. While not shown, the top of the dielectric walls 119 may be slightly etched and has a concave profile due to etching effects from the removal process on the dielectric material 117.

Figure 6C:
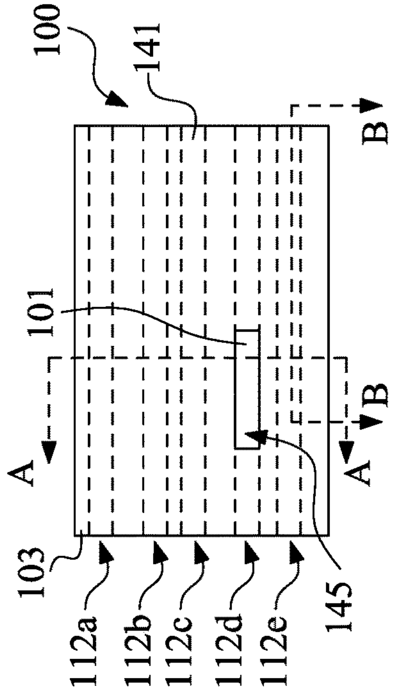
Figure 6B:
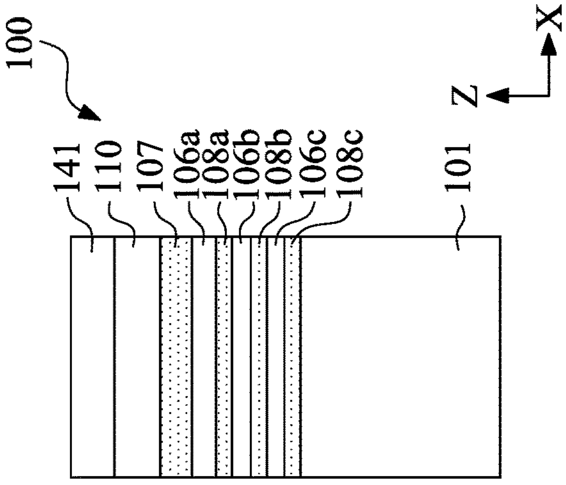
Figure 6A:
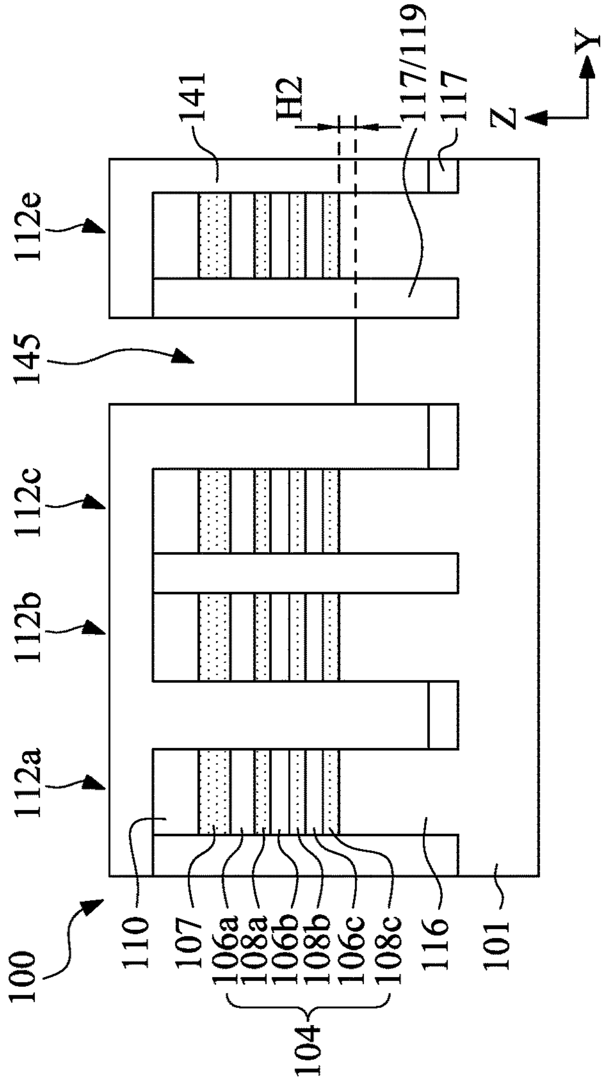

In FIGS. 6A-6C, a resist layer 141 is formed on the exposed surfaces of the semiconductor device structure 100. The resist layer 141 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique. In cases where the dielectric material 117 in the trenches 114*a*, 114*c*, 114*e* were completely removed, the resist layer 141 will fill up the trenches 114*a*, 114*c*, 114*e* entirely. In either case, the resist layer 141 is patterned to expose certain regions of the semiconductor device structure 100. Depending on the design layout, portions of the fin structures 112*a-e* at certain regions may be removed. In one embodiment, the resist layer 141 is patterned so that the fin structure 112*d* at one side of the dielectric wall 119 is removed. The removal of the portion of the fin structure 112*d* forms an end cut 145 in the fin structure 112*d*. Therefore, the remaining fin structure 112*d* along the X-direction is segmented. The segmentation isolates some of the transistors from another. The end cut 145 may have any shape (e.g., a rectangular shape), depending on the application/design layout. In one embodiment, the end cut 145 extends along the X-direction and has a width similar to the width of the fin structure 112*d*. The end cut 145 may be performed by protecting portions of the fin structures by the resist layer 141. The exposed portions of the fin structure (e.g., fin structure 112*d*) not covered by the resist layer 141 are removed in one or more etch processes. In one embodiment shown in FIG. 6A, the etch processes remove the fin structure 112*d* (e.g., the stack of semiconductor layers 104 and the well portion 116) to expose the sidewalls of the dielectric wall 119. The etch processes are performed so that the top surface of the fin structure 112*d* is at a level of, or slightly below an interface defined by the bottommost second semiconductor layer 108*c* and the well portion 116. Alternatively, the etch processes may be performed until the top portion of the substrate 101 is exposed. That is, the entire fin structure 112*d* is removed. In one embodiment, the etch processes are performed so that the top surface of the fin structure 112*d* is at an elevation below the interface defined by the bottommost second semiconductor layer 108*c* and the well portion 116 by a height H2 of about 1 nm to about 3 nm.

In some embodiments, which can be combined with any other embodiments of the present disclosure, the end cut 145 may be omitted. That is, the fin structure 112*d* is not removed, as shown in FIG. 8A-1. In such cases, the 112*d* may serve as connect gate and use gate off-state voltage during the operation. In some embodiments, after the end cut 145 is formed (e.g., FIG. 6A), an insulating layer may be deposited in the end cut 145. The insulating layer may have any shape depending on the profile of the end cut 145.

Figure 7C:
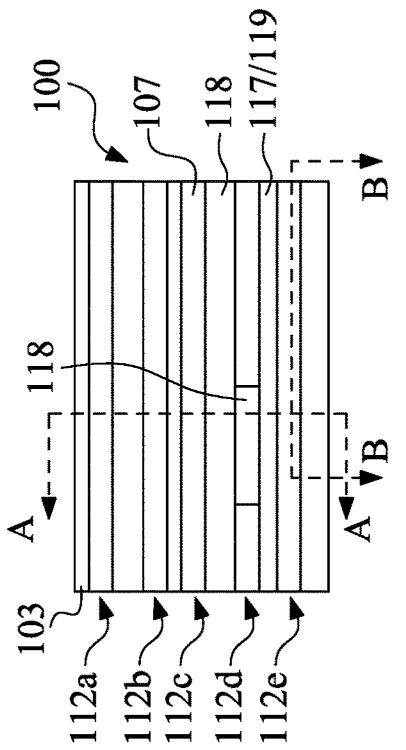
Figure 7B:
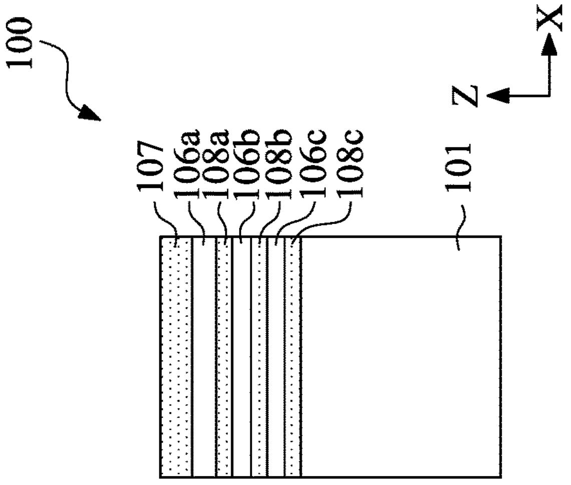
Figure 7A:
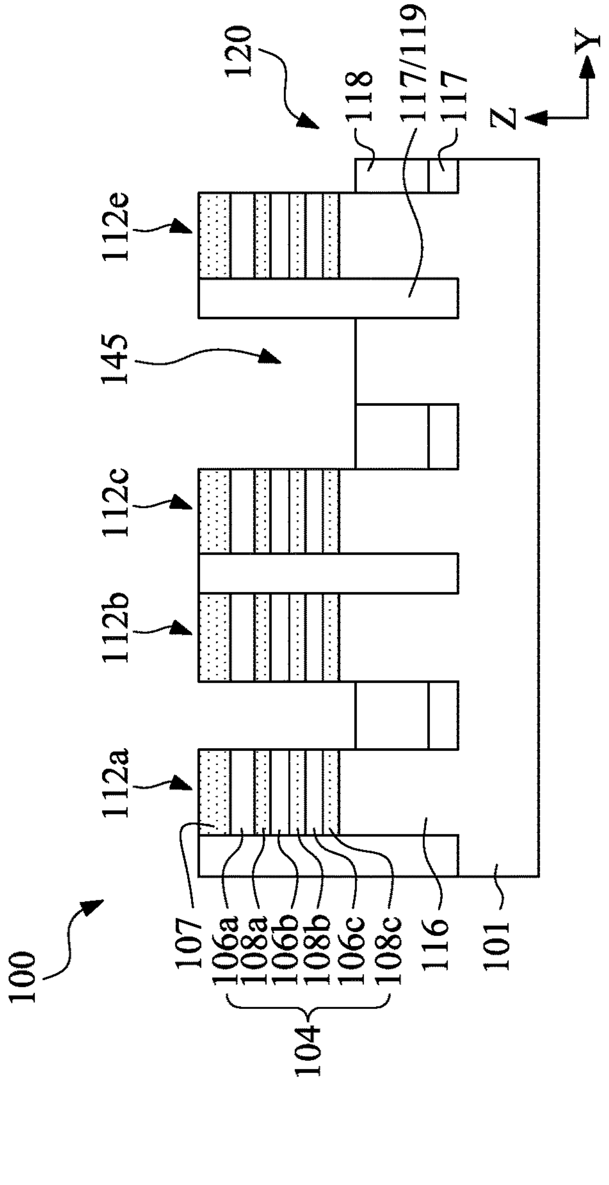

In FIGS. 7A-7C, after formation of the end cut 145 in the fin structure 112*d*, the resist layer 141 is removed using any suitable removal process, such as ashing, dry etch, wet etch, or a combination thereof. Then, an insulating material 118 is formed on the substrate 101. The insulating material 118 fills the trenches 114*a*, 114*c*, 114*e* (FIG. 5A), and the end cut 145 between neighboring fin structures 112 until the fin structures 112 are embedded in the insulating material 118. The insulating material 118 may be made of silicon oxide, silicon nitride, silicon oxynitride (SiON), SiOCN, SiCN, fluorine-doped silicate glass (FSG), a low-k dielectric material, or any suitable dielectric material. In some embodiments, the insulating material 118 may be formed of a material different from the dielectric wall 118. The insulating material 118 may be formed by any suitable method, such as low-pressure chemical vapor deposition (LPCVD), plasma enhanced CVD (PECVD) or flowable CVD (FCVD).

Then, a planarization operation, such as a chemical mechanical polishing (CMP) method and/or an etch-back method, is performed to remove the insulating material 118 and the mask structures 110 until the top of the fin structures 112 (e.g., the sacrificial layer 107) is exposed. Next, the insulating material 118 is recessed to form an isolation region (or shallow trench isolation (STI) region) 120. The recess of the insulating material 118 exposes portions of the fin structures 112, such as the stack of semiconductor layers 104. A top surface of the insulating material 118 may be level with or slightly below an interface defined by the bottommost second semiconductor layer 108*c* and the well portion 116. In some embodiments, the insulating material 118 is recessed so that the top surface of the insulating material 118 and the top surface of the remaining fin structure 112*d* are substantially co-planar.

Figure 8C:
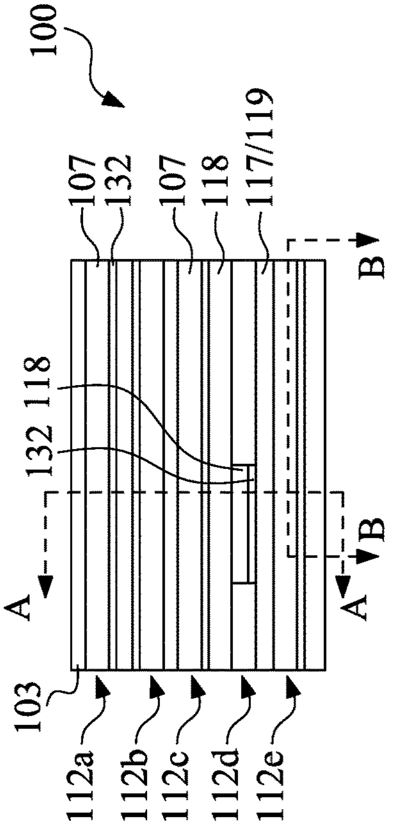
Figure 8B:
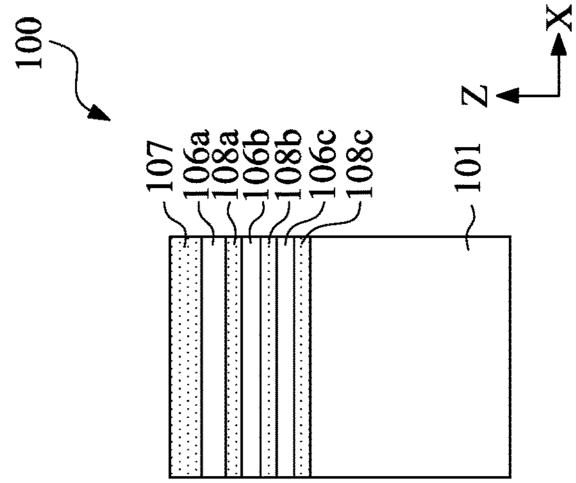
Figure 8A:
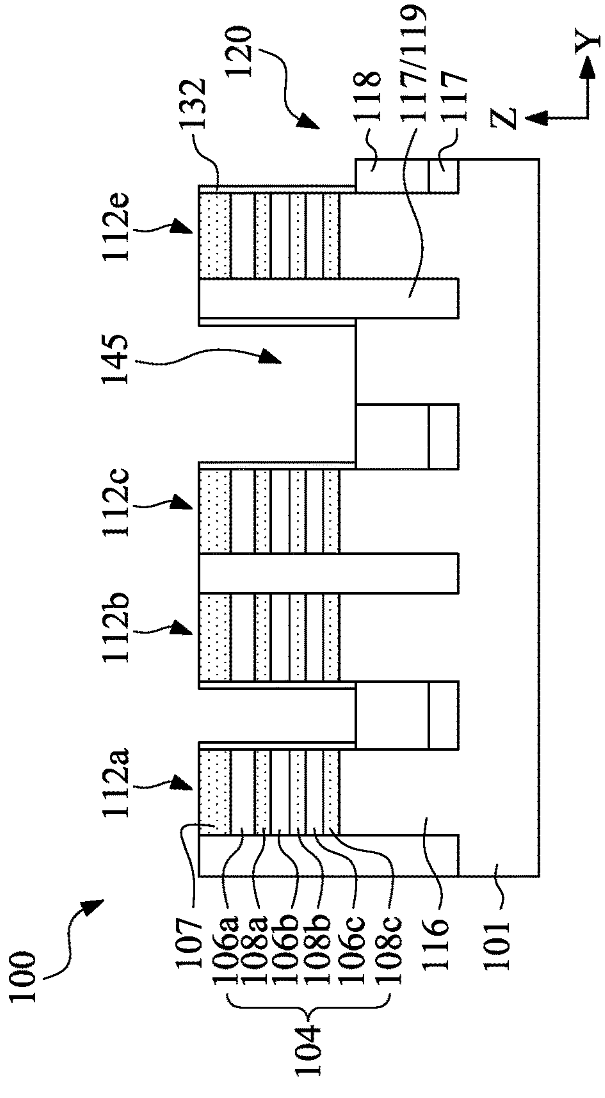
Figures 1, 8A:
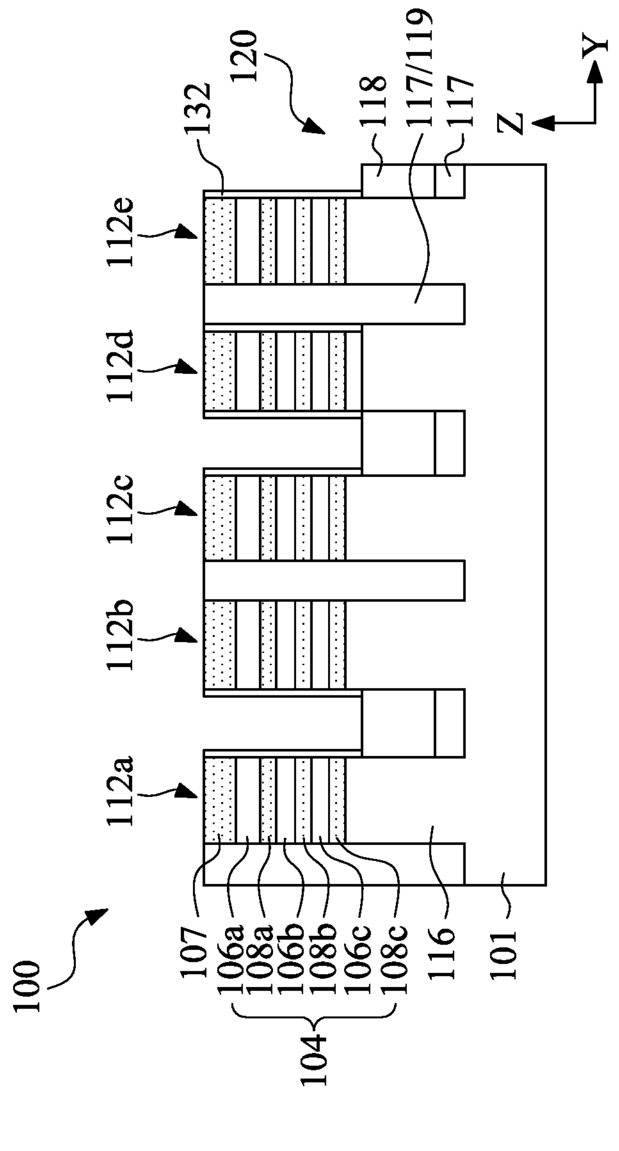

In FIGS. 8A-8C, a cladding layer 132 is formed on the sidewalls of the stack of semiconductor layers 104. In some embodiments, the cladding layer 132 is also formed on the exposed surfaces of the dielectric wall 119. The cladding layer 132 may be formed on the exposed surfaces of the stack of semiconductor layers 104, the sacrificial layer 107, the dielectric wall 119, and the isolation region 120. The cladding layer 132 may be formed by a conformal process, such as an ALD process. Next, portions of the cladding layer 132 are removed by an anisotropic etch process so that the cladding layer 132 on horizontal surfaces of the fin structures 112*a*, 112*b*, 112*c*, 112*e* (e.g., top surfaces of the sacrificial layer 107), the dielectric wall 119, and the insulating material 118 is removed. The removal process does not remove the cladding layer 132 formed on the vertical surfaces (e.g., the sidewalls) of the fin structures 112*a*, 112*b*, 112*c*, 112*e* and the dielectric wall 119. The cladding layer 132 may have a thickness ranging from about 2 nm to about 20 nm, for example about 5 nm to about 13 nm. In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 may include SiGe. The cladding layer 132 and the second semiconductor layer 108 may be removed subsequently to create space for the gate electrode layer.

Figure 9C:
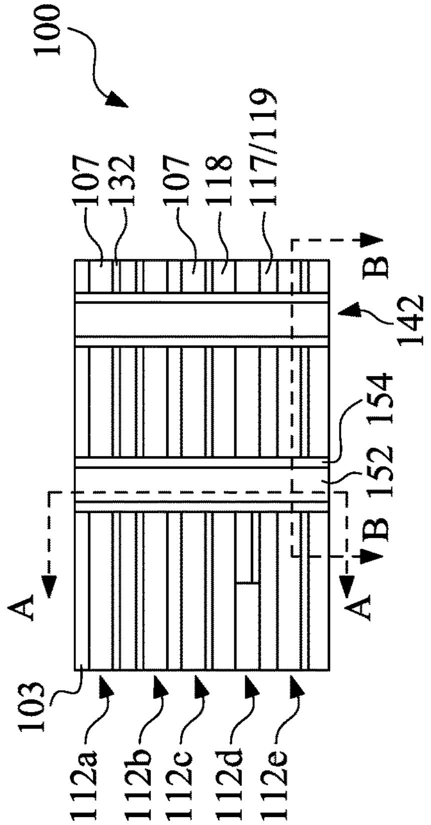
Figure 9B:
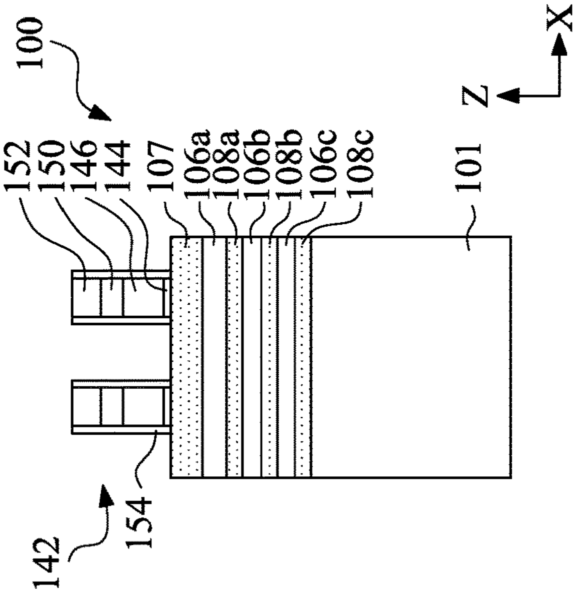
Figure 9A:
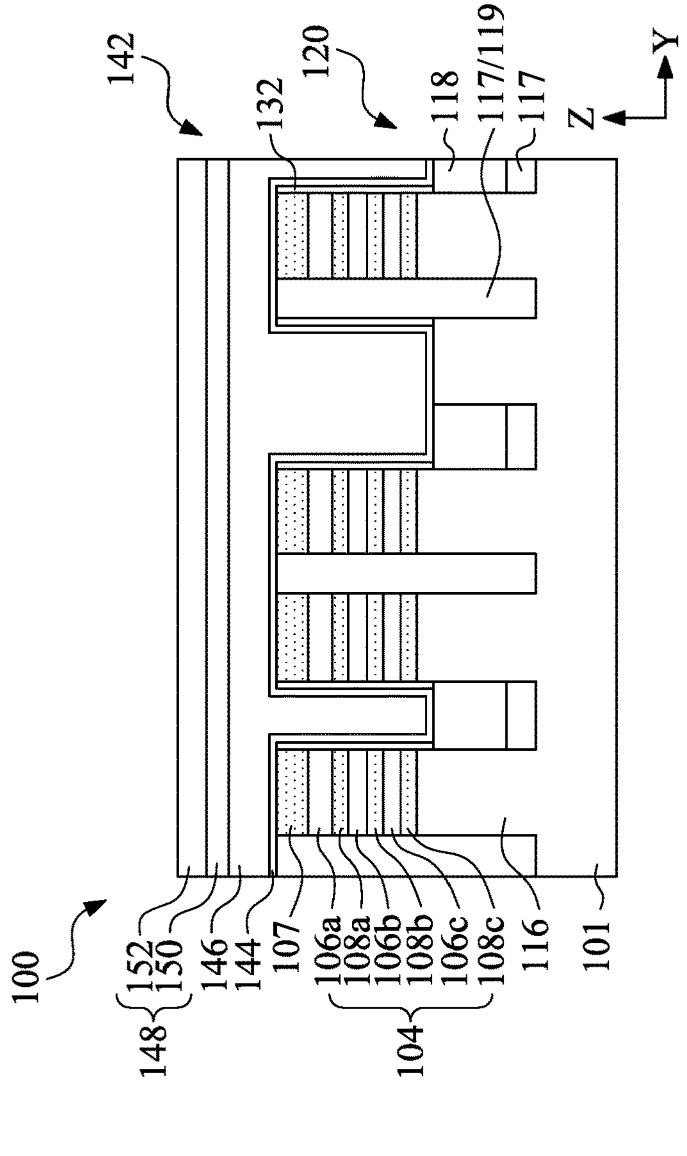

In FIGS. 9A-9C, one or more sacrificial gate stacks 142 are formed on the semiconductor device structure 100. The sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as $SiO_2$, SiN, a high-k dielectric material, and/or other suitable dielectric material. In some embodiments, the sacrificial gate dielectric layer 144 may be deposited by a CVD process, a sub-atmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

Figure 10C:
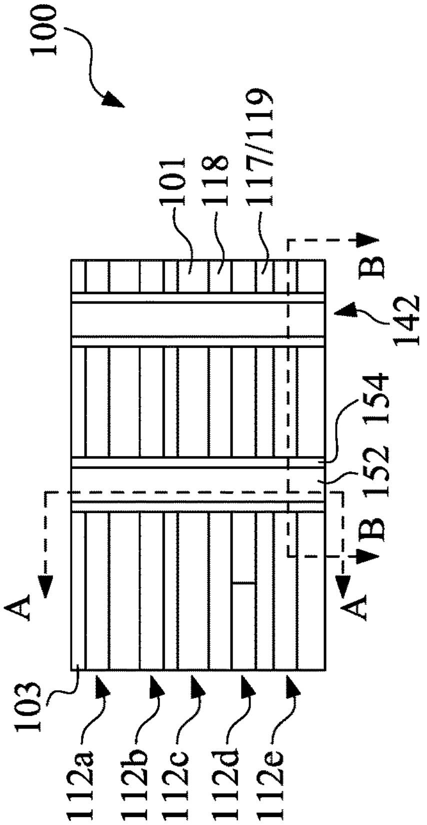
Figure 10B:
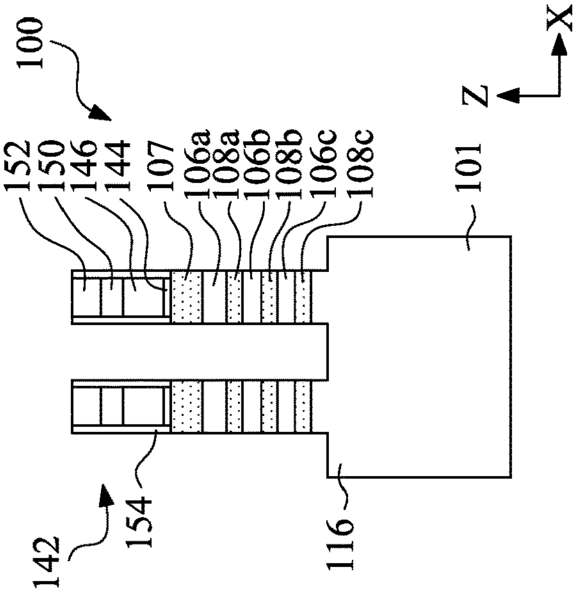

The sacrificial gate stacks 142 may be formed by first depositing blanket layers of the sacrificial gate dielectric layer 144, the sacrificial gate electrode layer 146, and the mask structure 148, followed by patterning and etching processes. By patterning the sacrificial gate stack 142, the stacks of semiconductor layers 104 of the fins 112*a*-112*e* are partially exposed on opposite sides of the sacrificial gate stack 142. While two sacrificial gate stacks 142 are shown, the number of the sacrificial gate stacks 142 is not limited to two. More than two sacrificial gate stacks 142 may be arranged along the X-direction in some embodiments. Next, a spacer 154 is formed on sidewalls of the sacrificial gate stacks 142, as shown in FIGS. 10B and 10C. The spacer 154 may be formed by first depositing a conformal layer (e.g., by an ALD process) that is subsequently etched back (e.g., by RIE) to form sidewall spacers 154. During the anisotropic etch process, most of the spacer 154 is removed from horizontal surfaces, such as the tops of the fin structures 112*a*-112*e*, the cladding layers 132, the dielectric walls 119, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

Figure 10A:
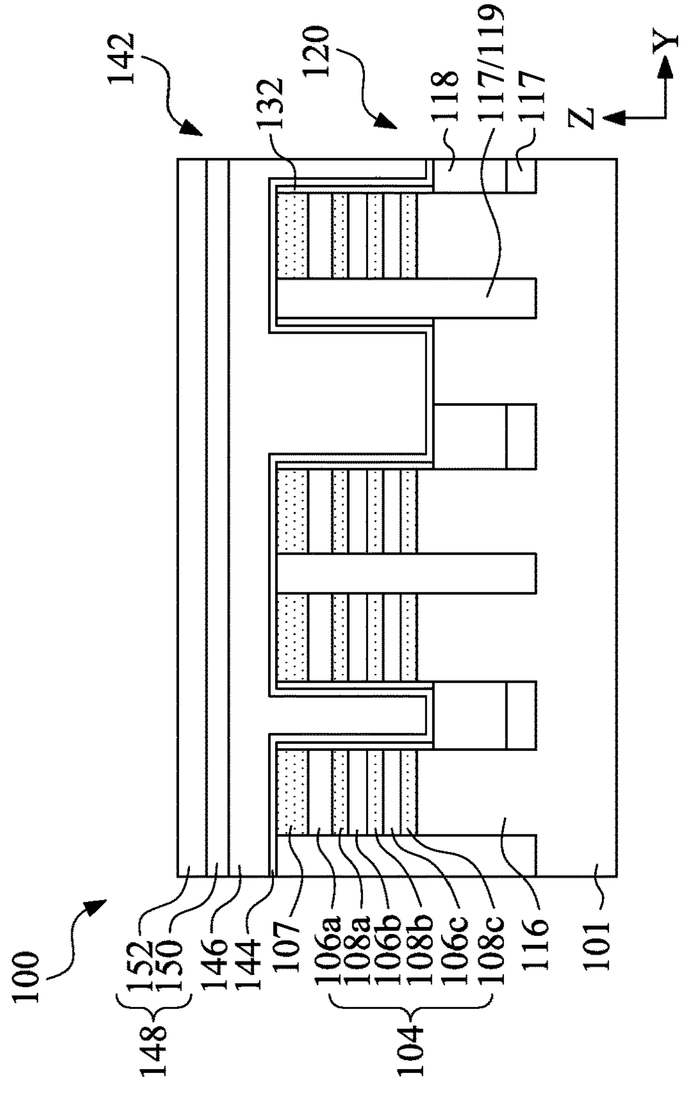

In FIGS. 10A-10C, exposed portions of the fin structures 112 and exposed portions of the cladding layers 132 not covered by the sacrificial gate stacks 142 and the spacers 154 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116, as shown in FIG. 10B. In some embodiments, the exposed portions of the fin structures 112 are recessed to a level at or slightly below the top surface of the insulating material 118. During removal of the portions of the fin structures 112 and the cladding layers 132, portions of the dielectric walls 119 not covered by the sacrificial gate stacks 142 and the spacers 154 may also be removed. Therefore, the etch processes should be performed so that the height of the dielectric walls 119 between the adjacent subsequent epitaxial S/D features (e.g., epitaxial S/D features 160 in FIGS. 13A-13C) is still enough to prevent the epitaxial S/D features of a NMOS device from merging with the epitaxial S/D features of a PMOS device.

Figure 11C:
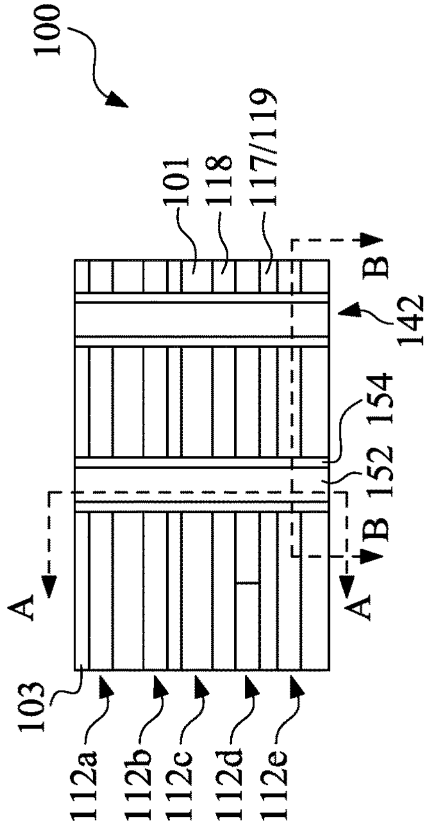
Figure 11B:
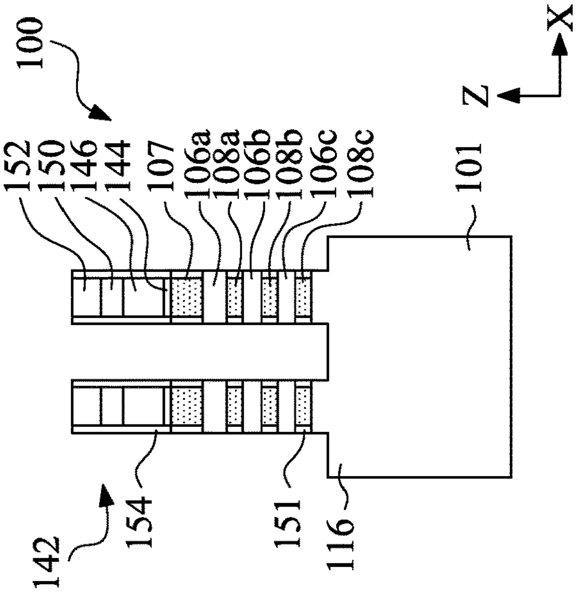
Figure 11A:
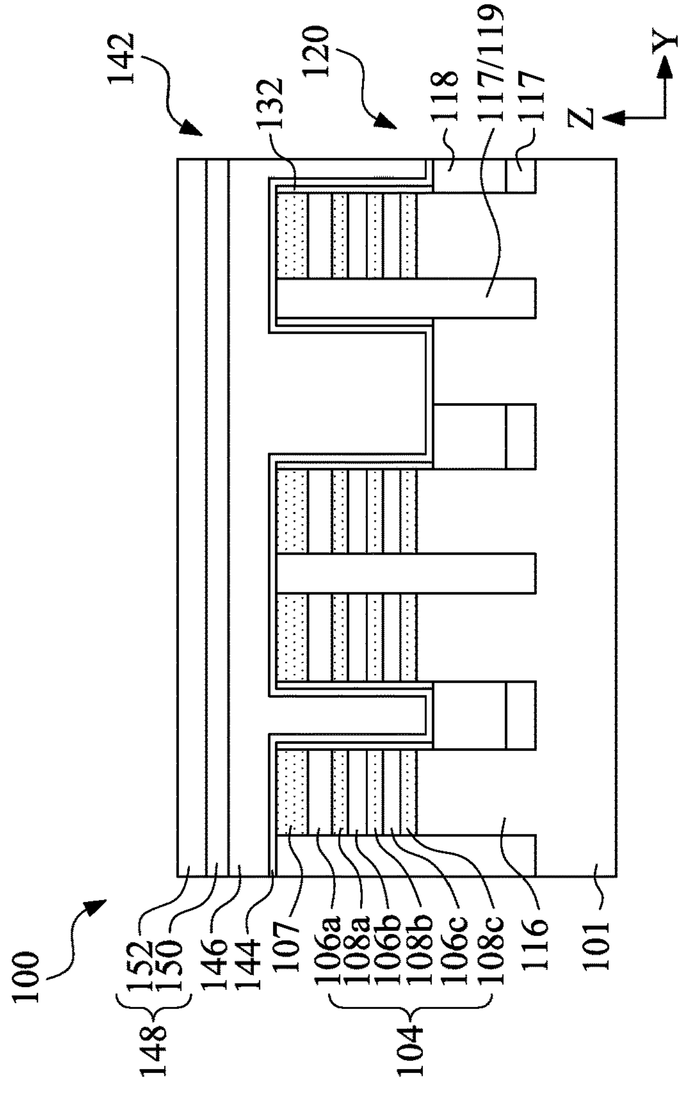

In FIGS. 11A-11C, edge portions of each second semiconductor layer 108 (e.g., 108*a*, 108*b*) of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 151. The dielectric spacers 151 may be made of a low-K dielectric material, such as SiON, SiCN, SiOC, SiOCN, or SiN. The dielectric spacers 151 may be formed by first forming a conformal dielectric layer using a conformal deposition process, such as ALD, followed by an anisotropic etching to remove portions of the conformal dielectric layer other than the dielectric spacers 151. The dielectric spacers 151 are protected by the first semiconductor layers 106 during the anisotropic etching process. The remaining second semiconductor layers 108 (e.g., 108*a*, 108*b*, 108*c*) are capped between the dielectric spacers 151 along the X direction.

Figure 12C:
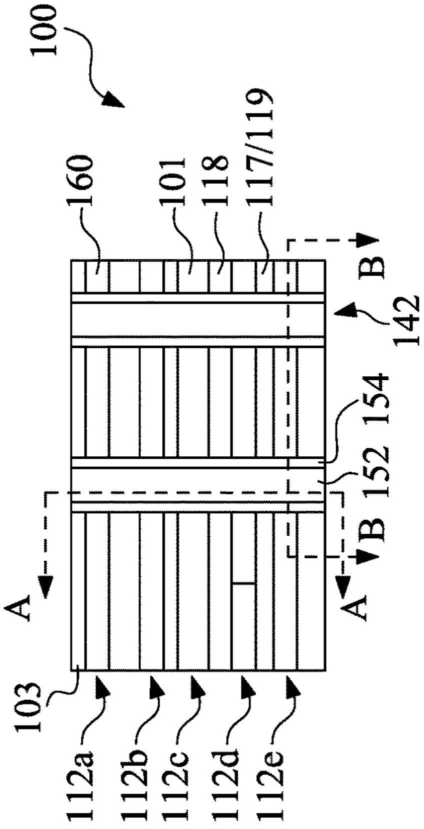
Figure 12B:
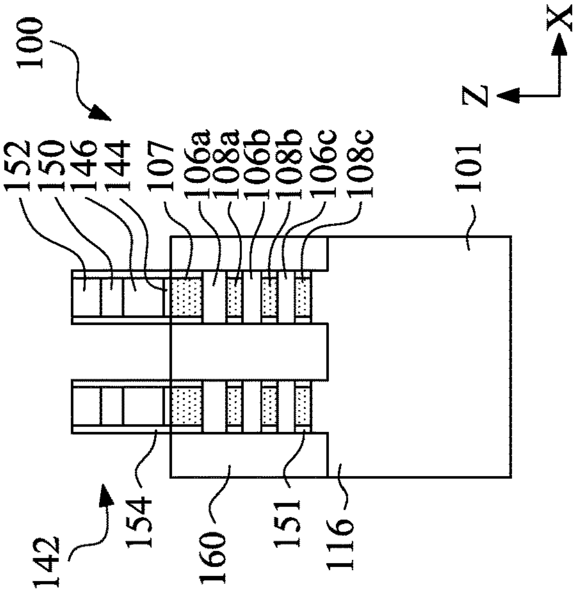
Figure 12A:
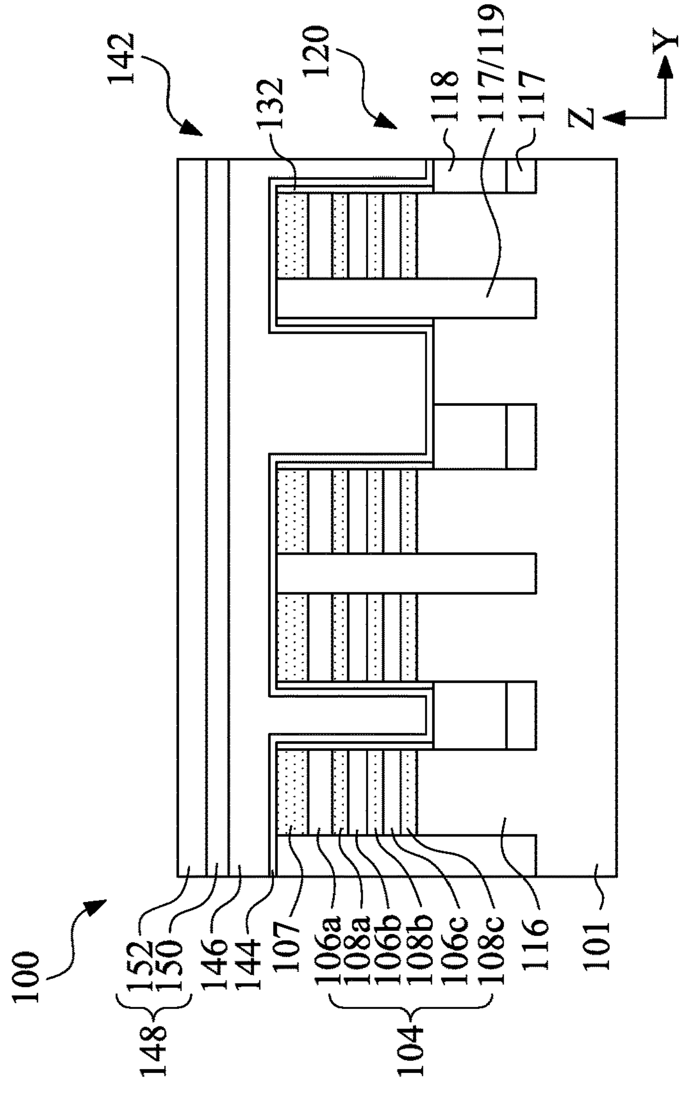

In FIGS. 12A-12C, epitaxial S/D features 160 are formed on the well portions 116 of the fin structures 112*a*-112*e*. The epitaxial S/D features 160 may be the S/D regions. For example, one of a pair of epitaxial S/D features 160 located on one side of the stack of semiconductor layers 104 can be a source region, and the other of the pair of epitaxial S/D features 160 located on the other side of the stack of semiconductor layers 104 can be a drain region. A pair of epitaxial S/D features 160 includes a source epitaxial feature 160 and a drain epitaxial feature 160 connected by the nanosheet channels (i.e., the first semiconductor layers 106). Source/drain region(s) may refer to a source or a drain, individually or collectively dependent upon the context. In this disclosure, a source and a drain are interchangeably used, and the structures thereof are substantially the same.

For n-channel FETs, the epitaxial S/D features 160 may include one or more layers of Si, SiP, SiC, SiCP, or a group III-V material (InP, GaAs, AlAs, InAs, InAlAs, InGaAs). In some embodiments, the epitaxial S/D features 160 may be doped with n-type dopants, such as phosphorus (P), arsenic (As), etc, for n-type devices. For p-channel FETs, the epitaxial S/D features 160 may include one or more layers of Si, SiGe, SiGeB, Ge, or a group III-V material (InSb, GaSb, InGaSb). In some embodiments, the epitaxial S/D features 160 may be doped with p-type dopants, such as boron (B). The epitaxial S/D features 160 may grow both vertically and horizontally to form facets, which may correspond to crystalline planes of the material used for the substrate 101. The epitaxial S/D features 160 may be formed by an epitaxial growth method using CVD, ALD or MBE.

Figure 13C:
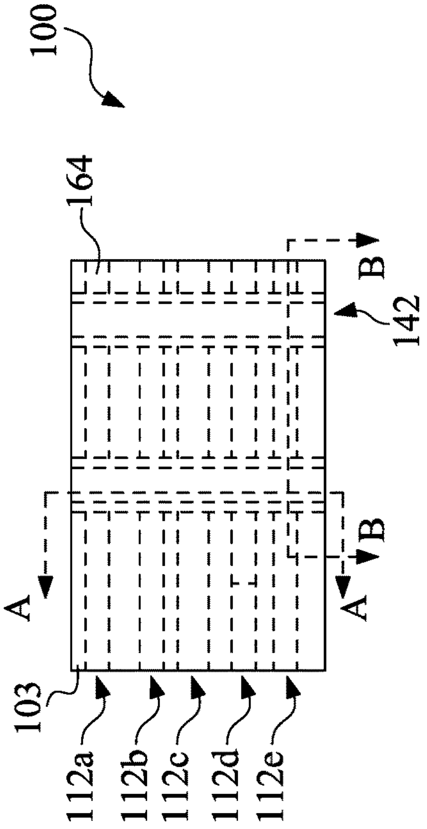
Figure 13B:
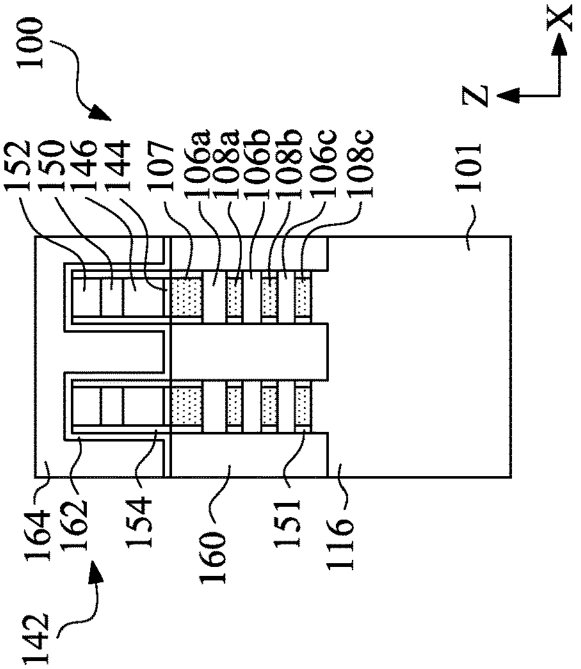
Figure 13A:
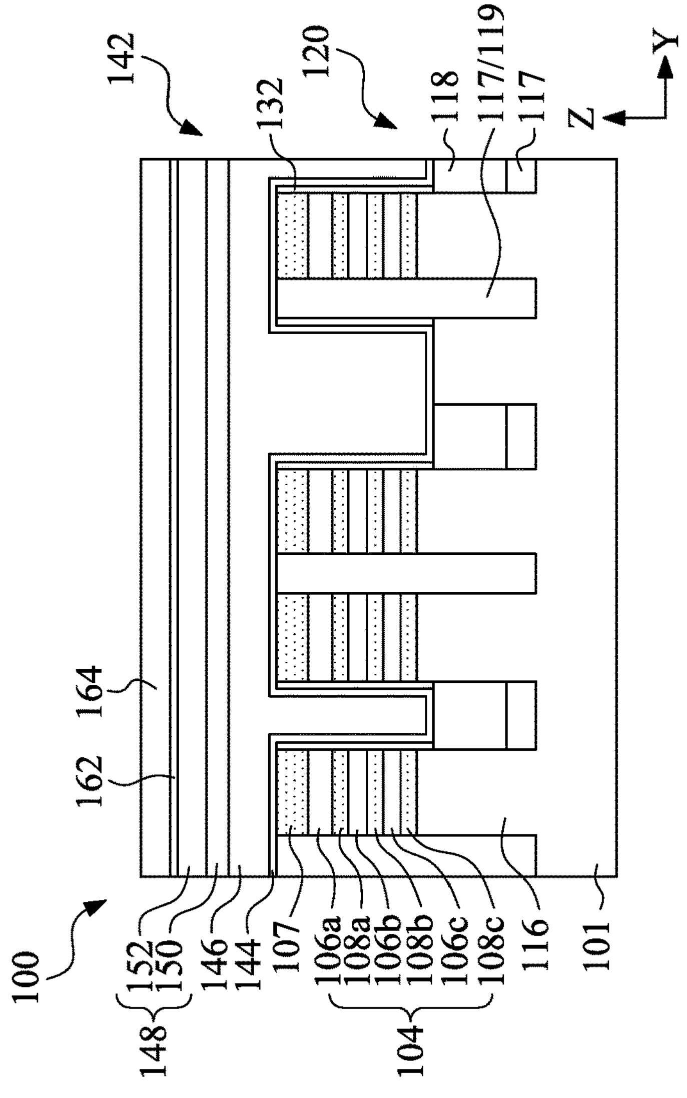

In FIGS. 13A-13C, a contact etch stop layer (CESL) 162 is formed on the epitaxial S/D features 160, the tops of dielectric walls 119, and the nitrogen-containing layer 152 of the mask structure 148. The CESL 162 is also formed on a portion of the insulating material 118 and the top surface of the recessed fin structure 112*d* adjacent the end cut 145 (FIG. 8A). The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, a first interlayer dielectric (ILD or ILD0) layer 164 is formed on the CESL 162. The materials for the first ILD layer 164 may include an oxide formed from tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 14C:
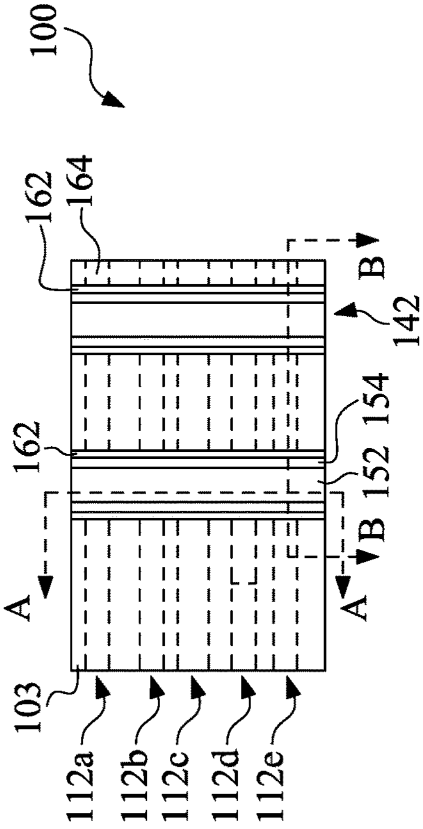
Figure 14B:
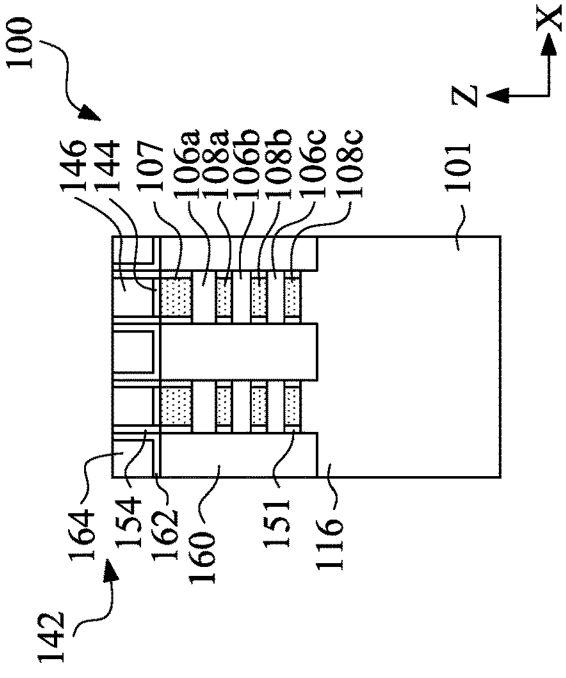
Figure 14A:
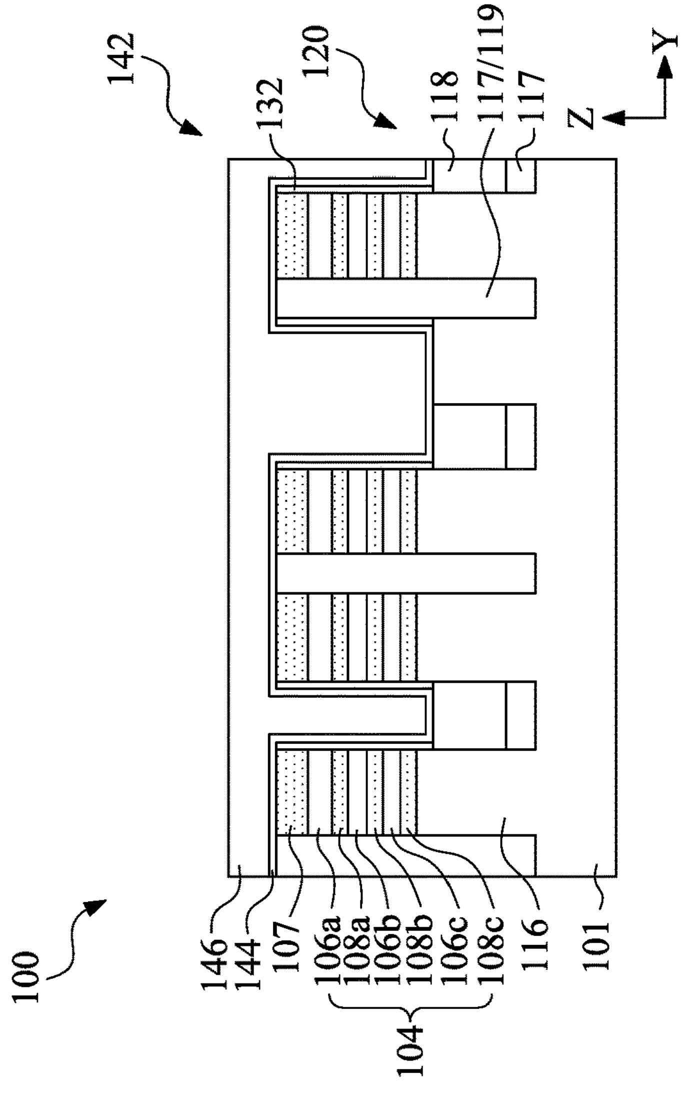

In FIGS. 14A-14C, a planarization process, such as a CMP process, is performed until the tops of the sacrificial gate electrode layer 146 and the spacers 154 are exposed. The planarization process removes portions of the first ILD layer 164 and the CESL 162 disposed on the sacrificial gate stacks 142. In some embodiments, the first ILD layer 164 may be recessed to a level at the top of the sacrificial gate electrode layer 146. In such cases, a nitrogen-containing layer (not shown), such as a SiCN layer, may be formed on the recessed first ILD layer 164 to protect the first ILD layer 164 during subsequent etch processes.

Figure 15A:
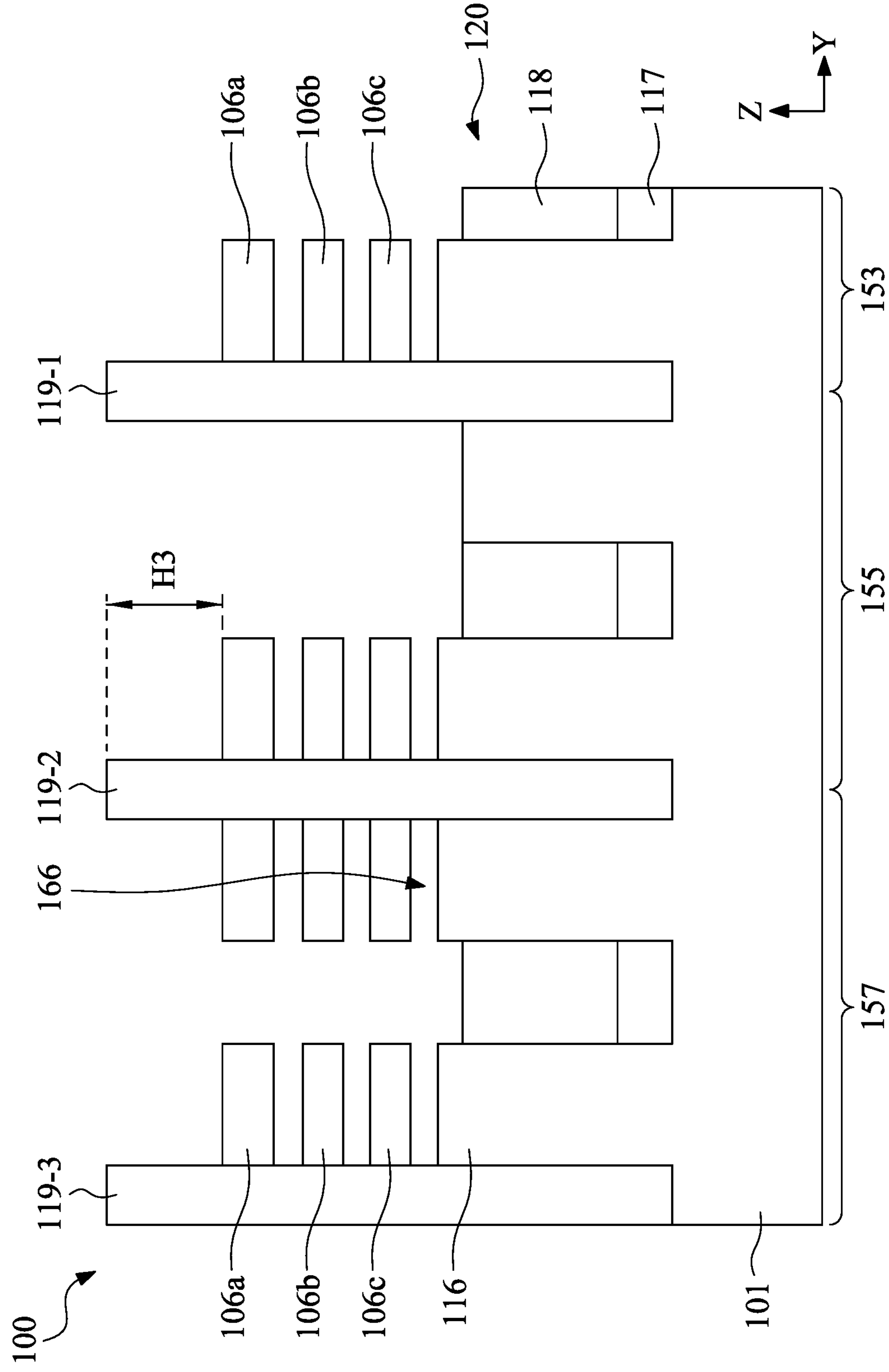
Figure 15C:
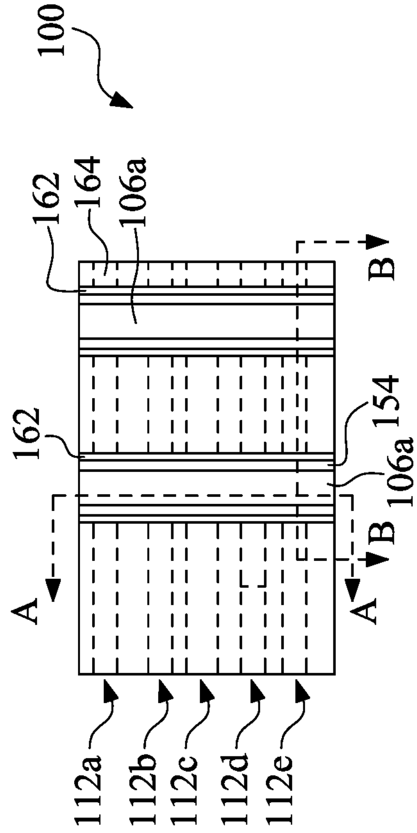
Figure 15B:
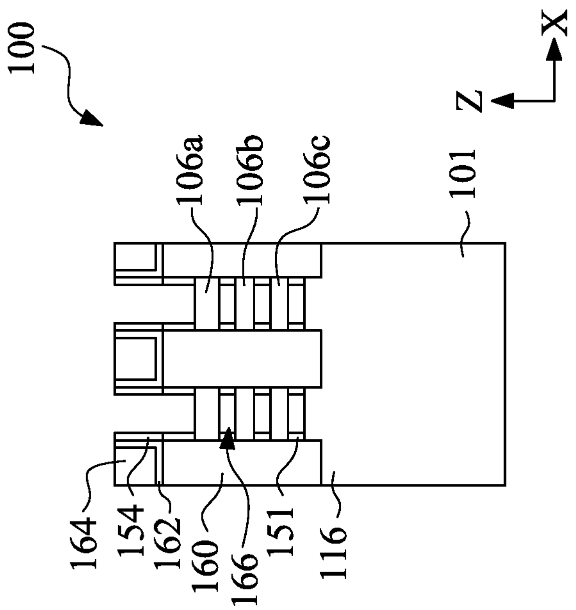

FIGS. 15A-26A are cross-sectional views of various stages of manufacturing the semiconductor device structure 100 taken along line A-A of FIG. 14C, in accordance with some embodiments. FIGS. 15C-26C are top views of various stages of manufacturing the semiconductor device structure 100 of FIG. 14A. FIGS. 15B-26B are cross-sectional side views of various stages of manufacturing the semiconductor device structure 100 taken along line B-B of FIG. 14C, in accordance with some embodiments. In FIGS. 15A-15C, the sacrificial gate electrode layer 146 (FIG. 14A) and the sacrificial gate dielectric layer 144 (FIG. 14A) are removed, exposing the top surfaces of the cladding layers 132 and the stacks of semiconductor layers 104 (e.g., topmost first semiconductor layer 106*a*). The sacrificial gate electrode layer 146 may be first removed by any suitable process, such as dry etch, wet etch, or a combination thereof, followed by the removal of the sacrificial gate dielectric layer 144, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 146 but not the spacers 154, the dielectric walls 119, the CESL 162, and the first ILD layer 164.

Next, the sacrificial layers 107, cladding layers 132 and the second semiconductor layers 108 are removed. The removal process exposes portions of the dielectric walls 119, the first semiconductor layers 106, and a portion of the insulating material 118. The removal process may be any suitable processes, such as dry etch, wet etch, or a combination thereof. The removal process may be a selective etch process that removes the sacrificial layers 107, the cladding layers 132 and the second semiconductor layers 108 but not the first semiconductor layers 106, the spacers 154, the dielectric walls 119, and the CESL 162. In cases where the sacrificial layers 107, the cladding layers 132, and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106 (e.g., first semiconductor layers 106*a*, 106*b*, 106*c*) protruded from opposing sides of the first dielectric feature 130. Specifically, each of the first semiconductor layers 106*a*, 106*b*, 106*c* has a first end in contact with the dielectric wall 119 and a second end (i.e., distal end) extending away from the first end, as shown in FIG. 15A. Having the first end of the first semiconductor layers 106*a*, 106*b*, 106*c* directly connected to a portion of the first dielectric feature 130 saves the space for subsequent metal gate and increases the overall pattern density. The portions of the first semiconductor layers 106 not covered by the dielectric spacers 151 are exposed in the openings 166. The first semiconductor layers 106*a-c* from the fins 112*a*, 112*b*, 112*c*, 112*e* serve as nanosheet channel regions for forksheet transistors to be formed at regions 153, 155, 157.

In some embodiments, the first semiconductor layers 106*a-c* at the region 153 on one side of the dielectric walls 119 (e.g., dielectric walls 119-1 and 119-3) may be designated as a N-type FET or P-type FET of the forksheet transistor, the first semiconductor layers 160*a-c* at the region 155 between the dielectric wall 119-2 and the dielectric wall 119-1 may be designated as a P-type FET or N-type FET of the forksheet transistor, and the first semiconductor layers 106*a-c* at the region 157 between the dielectric wall 119-2 and the dielectric wall 119-3 may be designated as a N-type FET or P-type FET of the forksheet transistor. The region 155 may be disposed along the Y-direction between the region 153 and the region 157. In one exemplary embodiment shown in FIG. 15A, the first semiconductor layers 106*a-c* at the region 153 on the right-hand side of the dielectric wall 119-1 is designated as a N-type FET of the forksheet transistor, the first semiconductor layers 106*a-c* at the region 155 on the right-hand side of the dielectric wall 119-2 is designated as a P-type FET of the forksheet transistor, and the first semiconductor layers 106*a-c* at the region 157 is designated as a N-type FET of the forksheet transistor. Alternatively, the first semiconductor layers 106*a-c* at the region 153 on the right-hand side of the dielectric wall 119-1 may be designated as a P-type FET of the forksheet transistor, the first semiconductor layers 106*a-c* at the region 155 on the right-hand side of the dielectric wall 119-2 may be designated as a N-type FET of the forksheet transistor, and the first semiconductor layers 106*a-c* at the region 157 may be designated as a P-type FET of the forksheet transistor. It should be noted that while the region 155 is shown as immediately adjacent to the regions 153, 157, the regions 153, 155 and 157 may be separated from each other by other devices, transistors, or features.

In some embodiments, the top surface of the dielectric walls 119 (e.g., dielectric wall 119-2) is higher than the top surface of the topmost first semiconductor layer 106*a* by a height H3. The height H3 may be in a range of about 25 nm to about 60 nm. The height H3 may be adjusted in accordance with the application and may be done during formation of the fin structures 112*a-e* as discussed above with respect to FIG. 3A and/or during removal of the mask structure 110 as discussed above with respect to FIG. 7A.

Figure 16A:
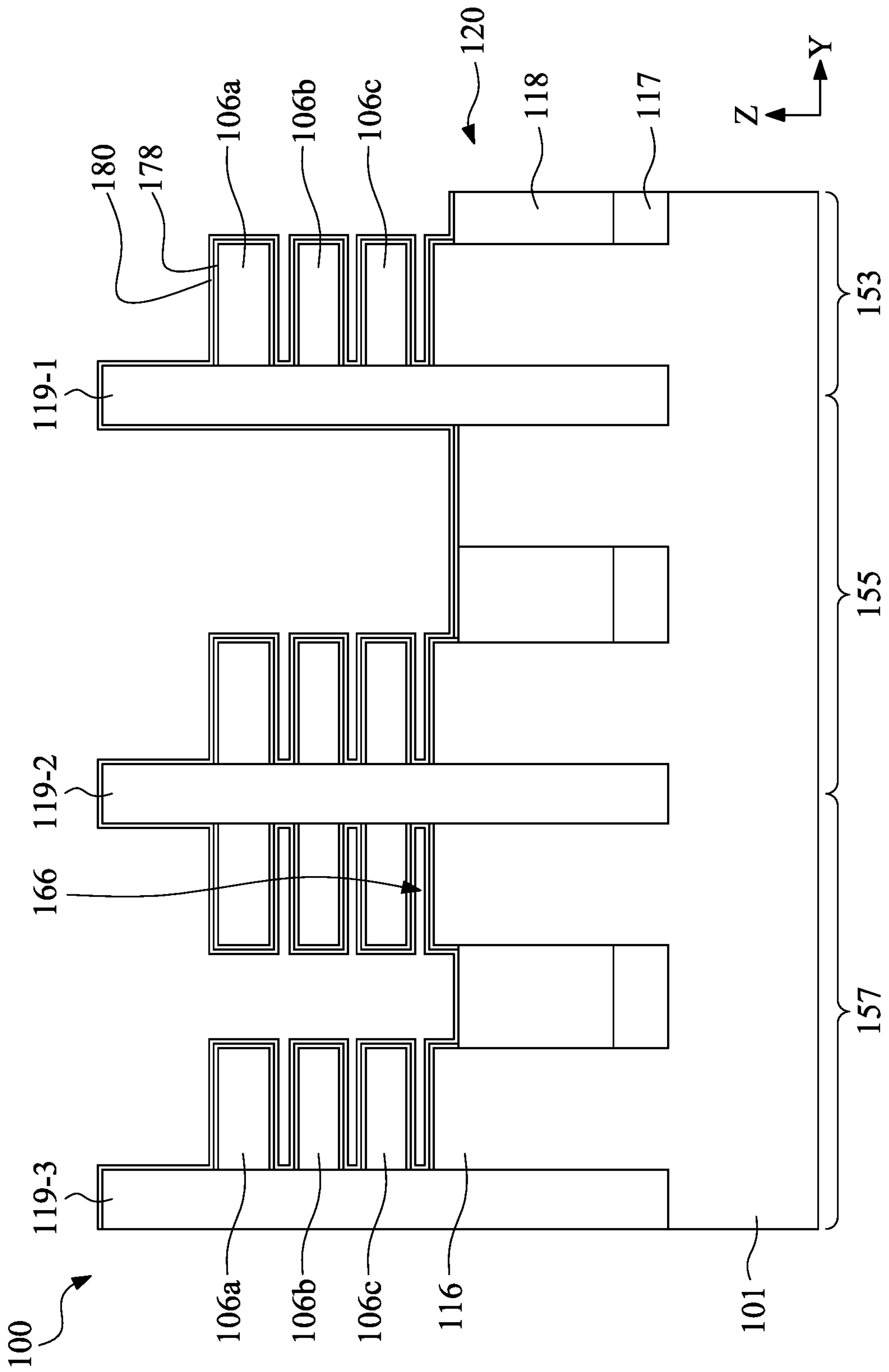
Figure 16C:
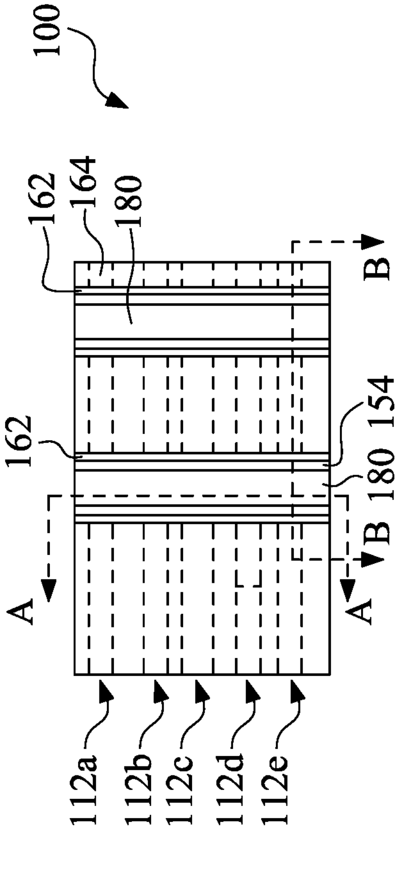
Figure 16B:
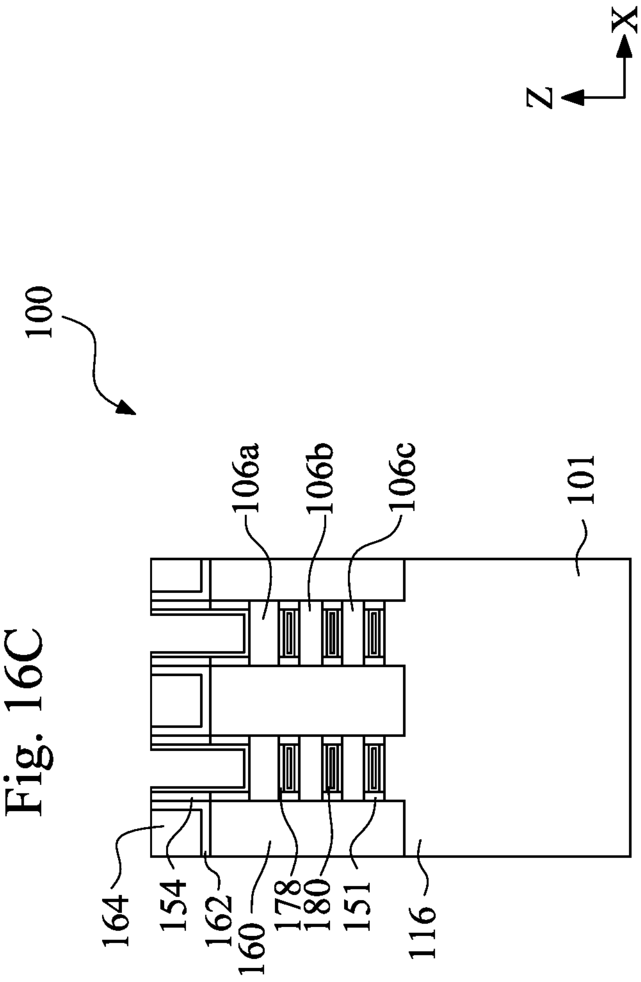

In FIGS. 16A-16C, an interfacial layer (IL) 178 is formed to surround at least three surfaces (except for the surfaces being in contact with the dielectric wall 119) of the first semiconductor layers 106 (e.g., first semiconductor layers 106*a*, 106*b*, 106*c*). The IL 178 may also form on the exposed surfaces of the well portion 116 of the substrate 101 and the insulating material 118. In some embodiments, the IL 178 may form on the first semiconductor layers 106 but not on the exposed dielectric walls 119. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD. The thickness of the IL 178 is chosen based on device performance considerations. In some embodiments, the IL 178 has a thickness ranging from about 0.5 nm to about 2 nm.

Next, a high-k (HK) dielectric layer 180 is formed on the exposed surfaces of the semiconductor device structure 100. In some embodiments, the HK dielectric layer 180 is formed on the IL 178, a portion of the insulating material 118, and on the exposed surfaces of the dielectric walls 119, as shown in FIG. 16A. Suitable materials for the HK dielectric layer 180 may include, but are not limited to, SiN, SiON, SiCN, SiOCN, $AlSi_xO_y$, $Al_2O_3$, or the like. Other suitable high-k materials, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), zirconium oxide (ZrO), zirconium silicon oxide (ZrSiO), titanium oxide (TiO), tantalum oxide ($Ta_2O_5$), yttrium oxide ($Y_2O_3$), or any suitable material having a k value greater than 7, may also be used. The HK dielectric layer 180 may be a conformal layer formed by a conformal process, such as an ALD process or a CVD process. The HK dielectric layer 180 may have a thickness of about 0.5 nm to about 3 nm, which may vary depending on the application.

Figure 17A:
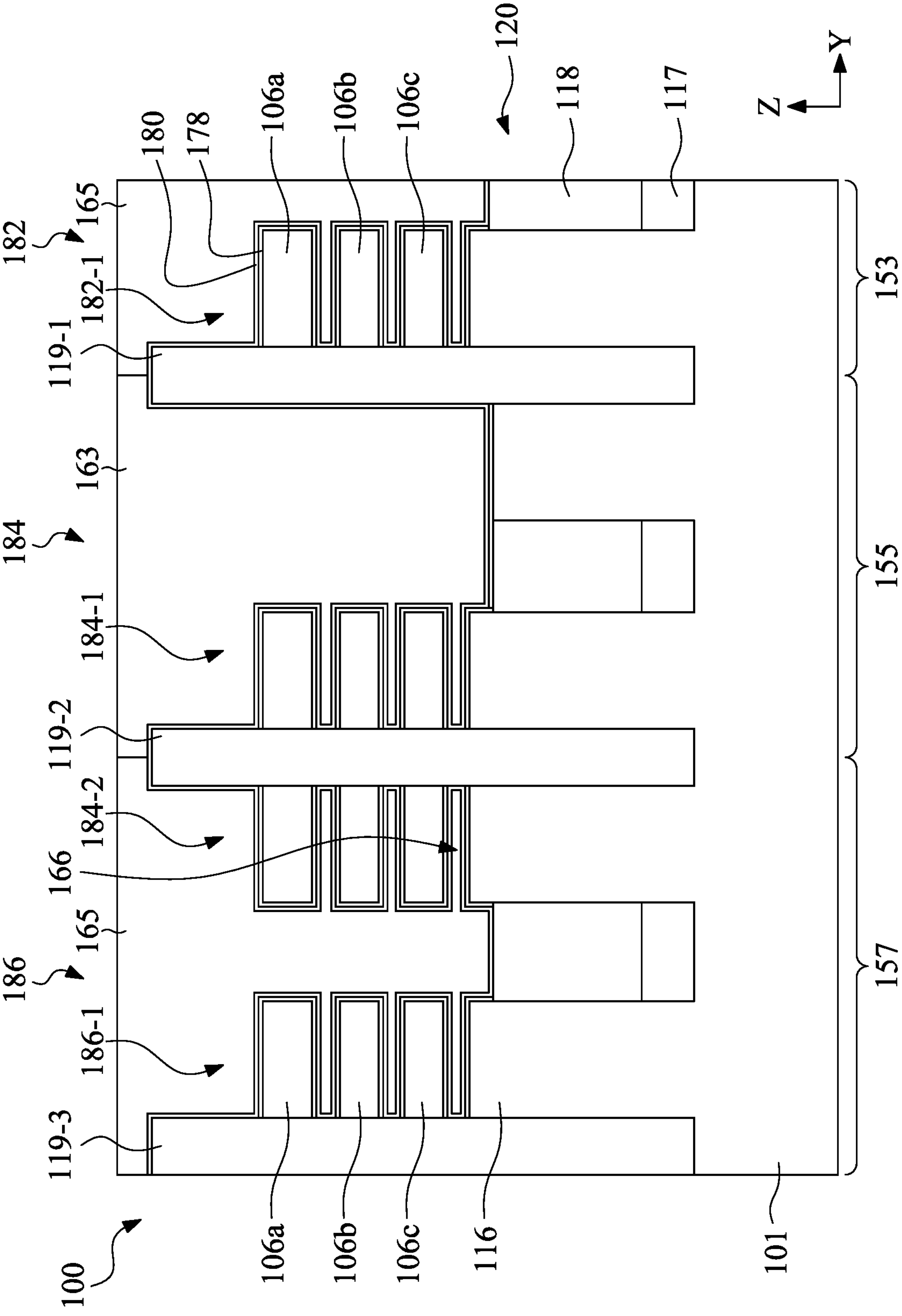
Figure 17C:
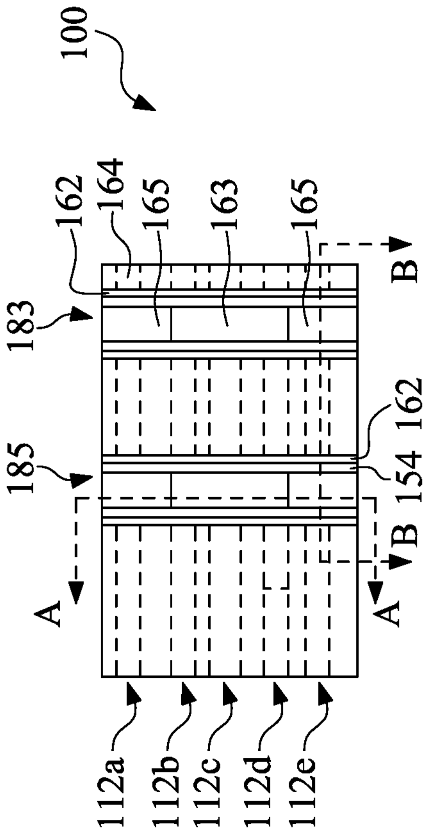
Figure 17B:
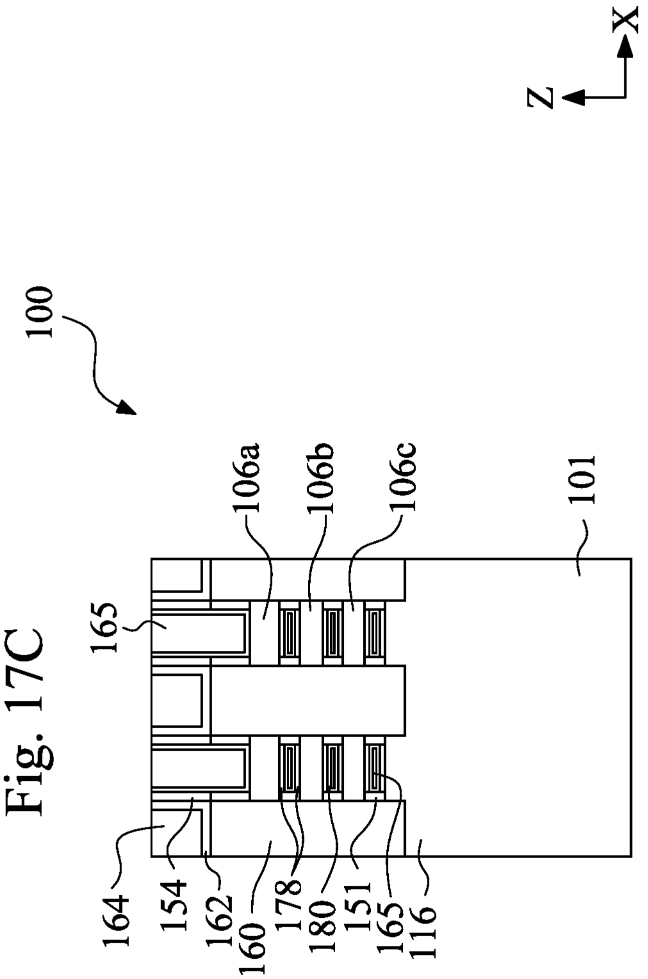

In FIGS. 17A-17C, after formation of the IL 178 and the HK dielectric layer 180, a first gate electrode layer 165 and a second gate electrode layer 163 are formed in the openings 166 (FIG. 16A). In some embodiments, the first gate electrode layer 165 may be formed in the openings 166 at the regions 153 and 157, and the second gate electrode layer 163 may be formed in the openings 166 at the region 155. The first gate electrode layer 165 is formed on the HK dielectric layer 180 to surround a portion of each first semiconductor layer 106*a*, 106*b*, 106*c* and over the insulating material 118. The first gate electrode layer 165 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The first and second gate electrode layers 165, 163 may be formed by first forming the first gate electrode layer 165 in the openings 166 at regions 153, 155, 157. The first gate electrode layer 165 may be deposited so that at least the forksheet transistors to be formed at the regions 153, 155, 157 are submerged in the first gate electrode layer 165. The first gate electrode layer 165 may be formed to a predetermined height above the dielectric wall 119. In some embodiments, the first gate electrode layer 165 is deposited to a height over a top surface of the HK dielectric layer 180 over the dielectric wall 119. In some embodiments, the first gate electrode layer 165 may be formed using multiple layers, each layer deposited sequentially adjacent to each other using a highly conformal deposition process such as ALD. Other deposition technique such as PVD, CVD, or electroplating may also be used. Thereafter, a patterned resist layer (not shown) is formed to cover N-type FETs, such as N-type FETs of the forksheet transistors at the regions 153 and 157, while the P-type FETs, such as P-type FETs of the forksheet transistors at the region 155, are left uncovered. The patterned resist layer may be formed by first forming a blanket layer on the semiconductor device structure 100, followed by patterning and etching processes to remove portions of the blanket layer at selected regions to form the patterned resist layer. The patterned resist layer may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique.

While not shown, the first gate electrode layer 165 may include a capping layer, a barrier layer, an n-metal work function layer, a p-metal work function layer, and a fill material. The capping layer and the barrier layer may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed of a material different from the capping layer. The n-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed from a metallic material such as W, Al, Cu, TiN, Ti, TiAiN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

Next, portions of the first gate electrode layer 165 at the region 155 not covered by the patterned resist layer are removed and a second gate electrode layer 163 is formed in the region where the first gate electrode layer 165 was removed. The patterned resist layer 141 protects portions of first gate electrode layer 165 at the regions 153 and 157 so that the first gate electrode layer 165 at the region 155 are removed. The first gate electrode layer 165 may be removed using any suitable processes, such as dry etch, wet etch, or a combination thereof. The removal process may be a selective etch process that removes the first gate electrode layer 165 but not the HK dielectric layer 180. Thereafter, the second gate electrode layer 163 is formed on the exposed HK dielectric layer 180 and in the region where the first gate electrode layer 165 was removed. The second gate electrode layer 163 may be deposited so that at least the forksheet transistors at the regions 155 are submerged in the second gate electrode layer 163. The second gate electrode layer 163 surrounds a portion of each first semiconductor layer 106 at the region 155. In some embodiments, the second gate electrode layer 163 is deposited so that the top surface of the second gate electrode layer 163 is substantially co-planar with the first gate electrode layer 165. In some embodiments, the second gate electrode layer 163 is chemically different than the first gate electrode layer 165. Alternatively, the second gate electrode layer 163 may include the same material as the first gate electrode layer 165. Likewise, the second gate electrode layer 163 may be formed using multiple layers, each layer deposited sequentially adjacent to each other using a highly conformal deposition process such as ALD. The second gate electrode layer 163 may also include a capping layer, a barrier layer, an n-metal work function layer, a p-metal work function layer, such as those used for the first gate electrode layer 165. Each layer in the first and second gate electrode layers 165, 163 may be chosen depending on the threshold voltage and application of the NMOS or PMOS devices needed for regions 153, 155, 157.

After the formation of the first and second gate electrode layers 165, 163, the patterned resist layer is removed using any suitable removal process, such as ashing, dry etch, wet etch, or a combination thereof. As a result of the formation of the first and second gate electrode layers 165, 163, the metal gate structures 183, 185 are formed and extended along the Y-direction. The forksheet transistors 182, 184, 186 are therefore formed at the regions 153, 155 and 157, respectively. In one exemplary embodiment, the forksheet transistor 182 includes a NMOS device 182-1 extending outwardly from one side of the dielectric wall 119-1, a PMOS device 184-1 extending outwardly form one side of the dielectric wall 119-2, a NMOS device 184-2 extending outwardly from another side of the dielectric wall 119-2, and a NMOS device 186-1 extending outwardly from one side of the dielectric wall 119-3.

Figure 18A:
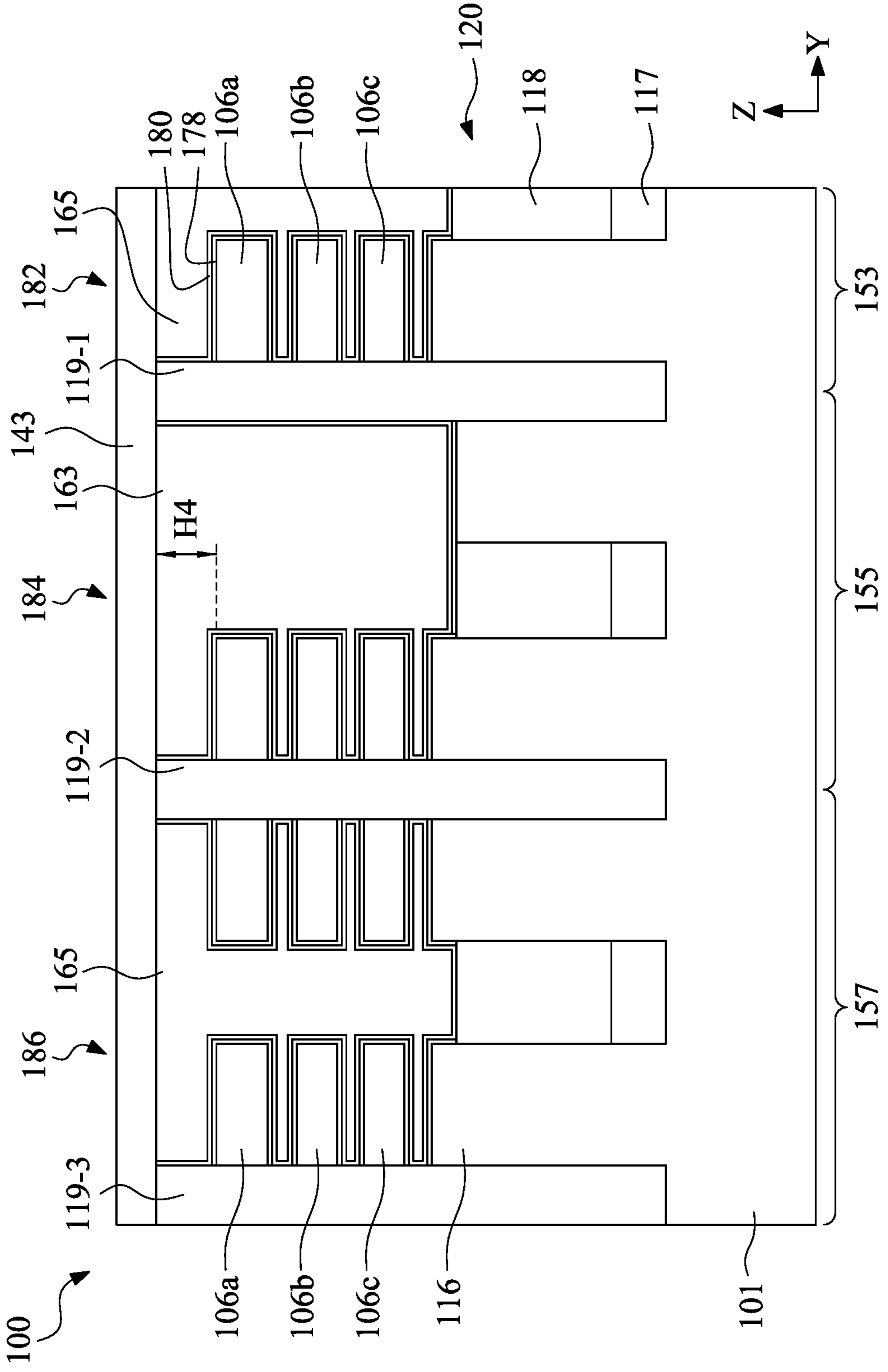
Figure 18C:
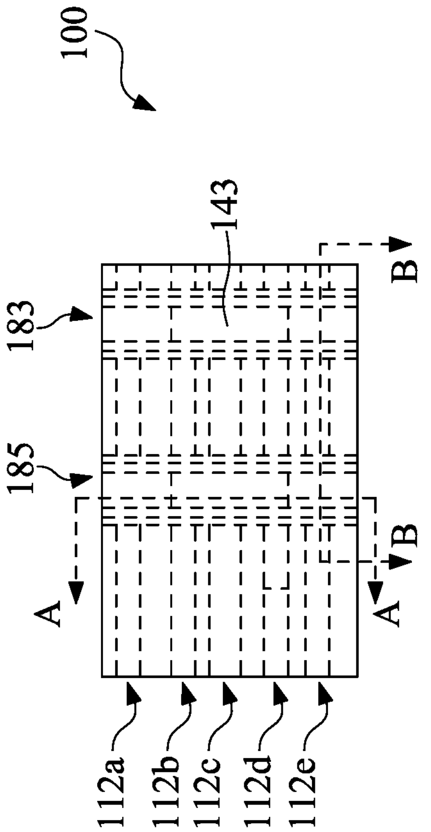
Figure 18B:
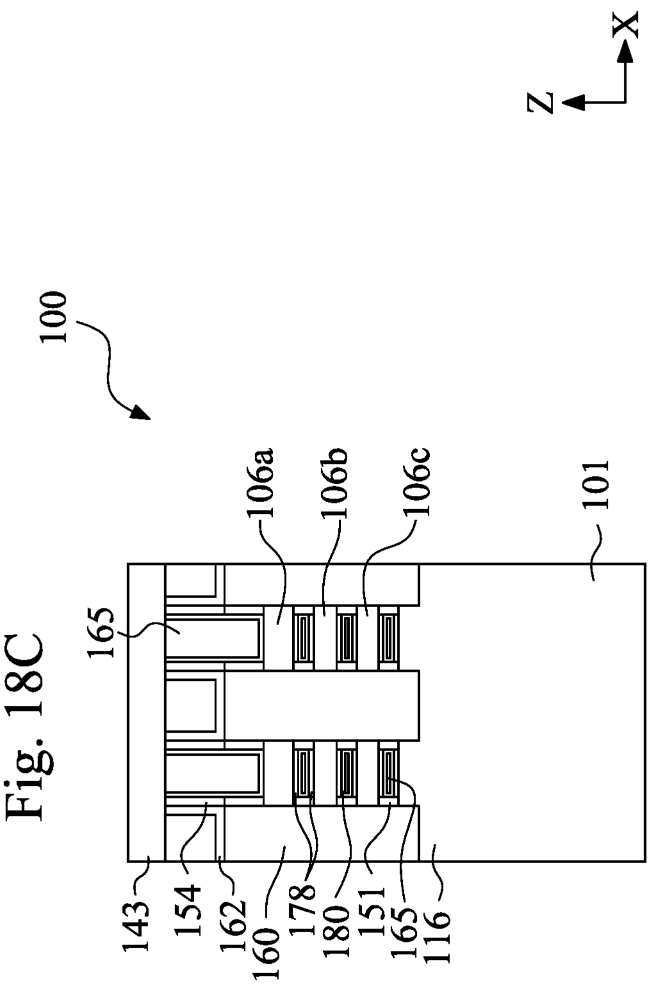

In FIGS. 18A-18C, a planarization operation, such as a CMP method, is performed. The planarization operation may be performed until the top surface of the dielectric walls 119 is exposed. In some embodiments, the CMP method may use a $NH_4OH$ or KOH based slurry for polishing. At this stage, the top surface of the dielectric walls 119, the HK dielectric layer 180, and the first and second gate electrode layers 165, 163, and the first ILD layer 164 are substantially co-planar. As a result of the planarization operation, the N-type FETs of the forksheet transistors at the regions 153, 155, 157 are separated from each other by the dielectric walls 119. In some embodiments, the planarization operation is performed so that the height between the top surface of the dielectric walls 119 (e.g., dielectric wall 119-2) and the top surface of the topmost first semiconductor layer 106*a* is reduced from the height H3 (FIG. 15A) to the height H4. The height H4 may be referred to as a gate height. In various embodiments, the height H4 is about 15 nm or less, for example about 3 nm to about 10 nm. When the gate height is kept at about 15 nm or below, the overlap distance between the subsequent metal gate contact and the subsequent source/drain metal contact is reduced, which in turn reduces overall capacitance for the device. However, if the height H4 is less than about 3 nm, the subsequent gate contact vias (e.g., gate contact via 190) may accidently punch into/through the dielectric walls 119 and result in an open circuit failure. On the other hand, if the height H4 is over 15 nm, the benefit associated with having a reduced gate height is diminished.

Next, a mask layer 143 is formed on the semiconductor device structure 100. The mask layer 143 may be any suitable masking material. In some embodiments, the mask layer 143 is formed of a nitrogen-containing material, such as silicon nitride (SiN). The mask layer 143 may be a single layer photoresist or a tri-layer photoresist. For example, the mask layer 143 may use the same material as the resist layer 141 and may be deposited using the same fashion as the resist layer 141. As will be discussed below with respect to FIGS. 19A-19C, the mask layer 143 is to be patterned to define regions where cut metal gate (CMG) openings are needed in accordance with the design layout.

Figure 19A:
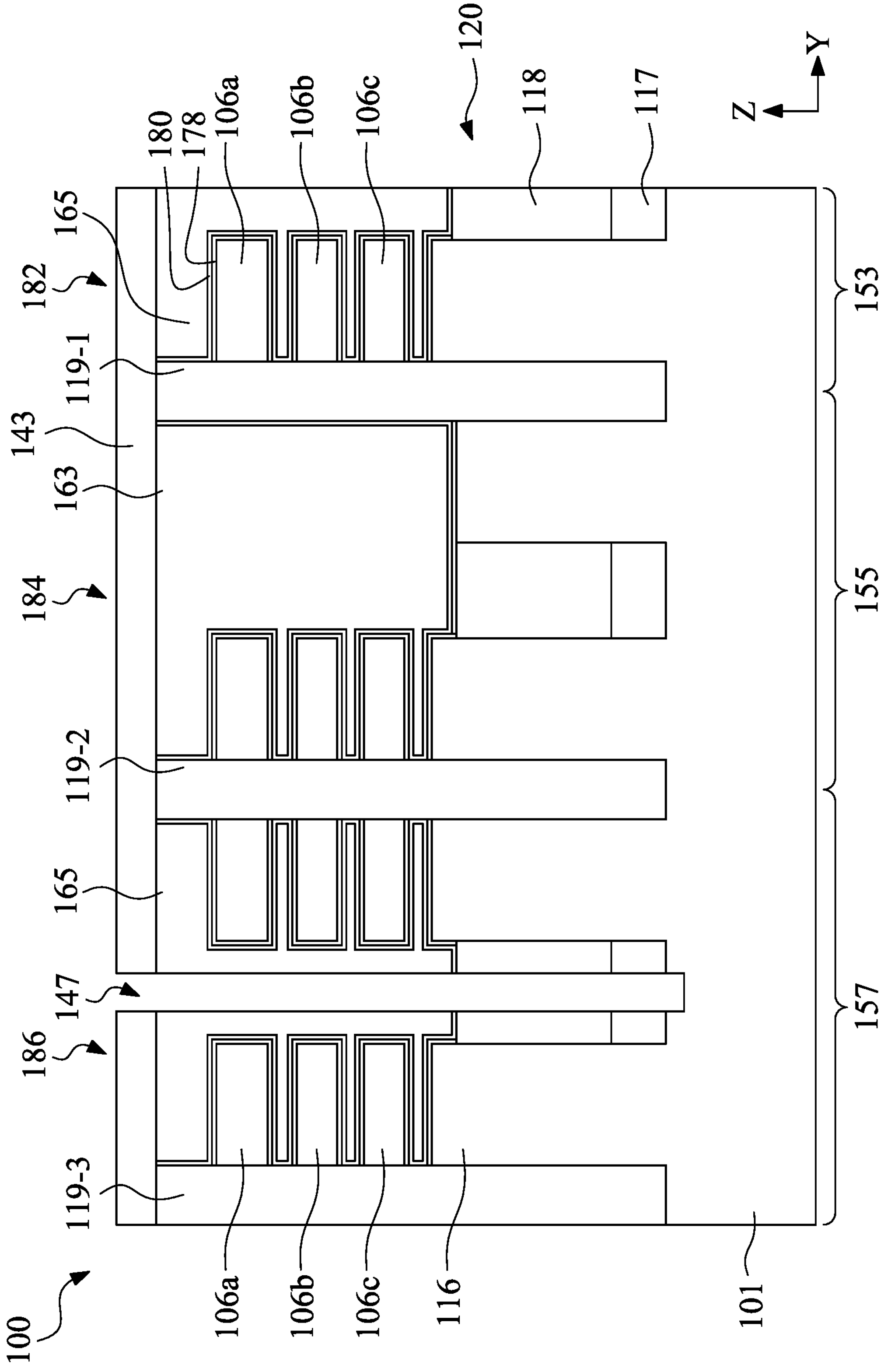
Figure 19C:
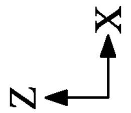
Figure 19C:
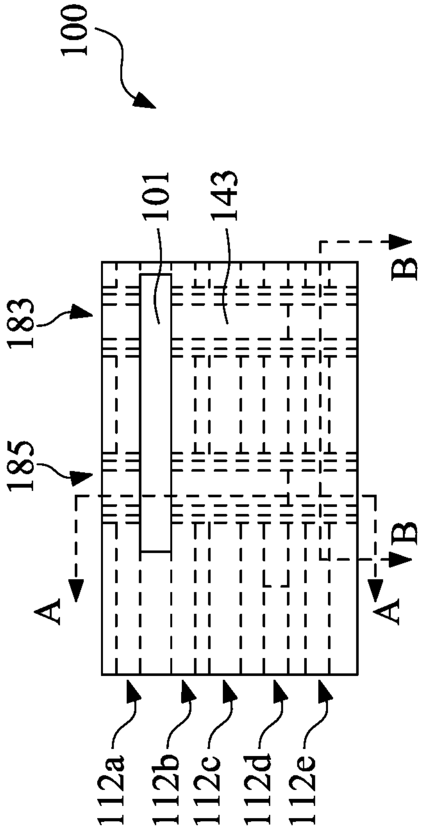
Figure 19B:
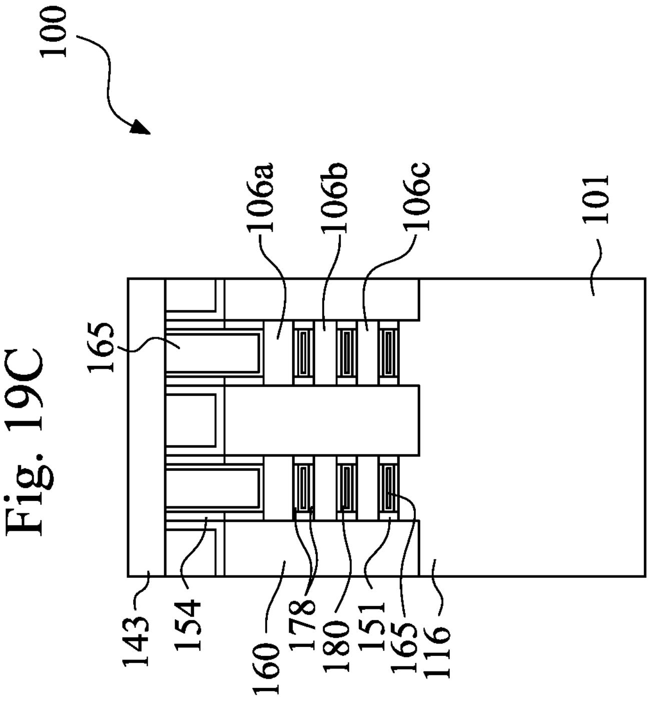

In FIGS. 19A-19C, the mask layer 143 is patterned to define regions where CMG openings 147 are to be formed. As can be seen in FIG. 19B, the CMG opening 147 separates the metal gates 183, 185 into two metal gate stacks, respectively. A gate-cut process is then performed using the patterned mask layer 143 as an etching mask. The gate-cut process may be a dry etch, wet etch, reactive ion etch (RIE), and/or other suitable processes. The gate-cut process removes portions of the first gate electrode layer 165, the HK dielectric layer 180, the insulating material 118, and the dielectric material 117 to expose a top surface of the substrate 101. In some embodiments, the gate-cut process may be an over-etch process that removes a portion of the substrate 101. In such cases, the CMG openings 147 may extend into a portion of the exposed substrate 101. The etch process may use one or more etchant gases such as $BCl_3$, $Cl_2$, $SiCl_4$, or any suitable etchant chemicals. The CMG openings 147 are to be filled a dielectric material and form isolation structures. The isolation structures ensure the two metal gate stacks obtained from cutting the metal gate structures 183, 185 are not in electrical contact with each other. Short circuiting therebetween is therefore prevented In FIGS. 20A-20C, the CMG openings 147 (FIG. 19A) are filled with a dielectric material. The CMG openings filling with the dielectric material form an isolation structure or so-called cut metal gate (CMG) structure 149. The dielectric material may be made of an oxygen-containing material, such as silicon oxide; a nitrogen-containing material, such as SiN, silicon oxynitride (SiON), SiOCN, SiCN; a low-K dielectric material; or any suitable dielectric material. The dielectric material may include the same or different material than the insulating material 118, and may be formed by any suitable process, such as a CVD, PECVD, FCVD, or ALD process. Once the CMG structures 149 are formed, a planarization process, such as a CMP process, may be performed to remove portions of the dielectric material formed over the mask layer 143. The planarization process is performed until a portion of the dielectric walls 119 is exposed. In one embodiment, the CMG structure 149 extends through the first gate electrode layer 165, the HK dielectric layer 180, the insulating material 118, the dielectric material 117, and into the substrate 101. The CMG structure 149 within the insulating material 118 may have a depth of about 0 nm to about 60 nm. After the planarization process, the top surfaces of the CMG structure 149, the first gate electrode layer 165, the second electrode layer 163, the HK dielectric layer 180, and the dielectric walls 119 are substantially co-planar.

Having the CMG structure 149 formed at the regions between adjacent dielectric walls 119 (e.g., dielectric walls 119-2 and 119-3) is advantageous because the CMG structure 149 is less likely to land on (and damage) the dielectric walls 119 (e.g., dielectric wall 119-1) due to larger spacing between the adjacent dielectric walls 119. Even if the CMG structure 149 is slightly misaligned, the CMG structure 149 can still properly separate the gate structures as intended without the risk of damaging the dielectric walls 119.

Figure 20A:
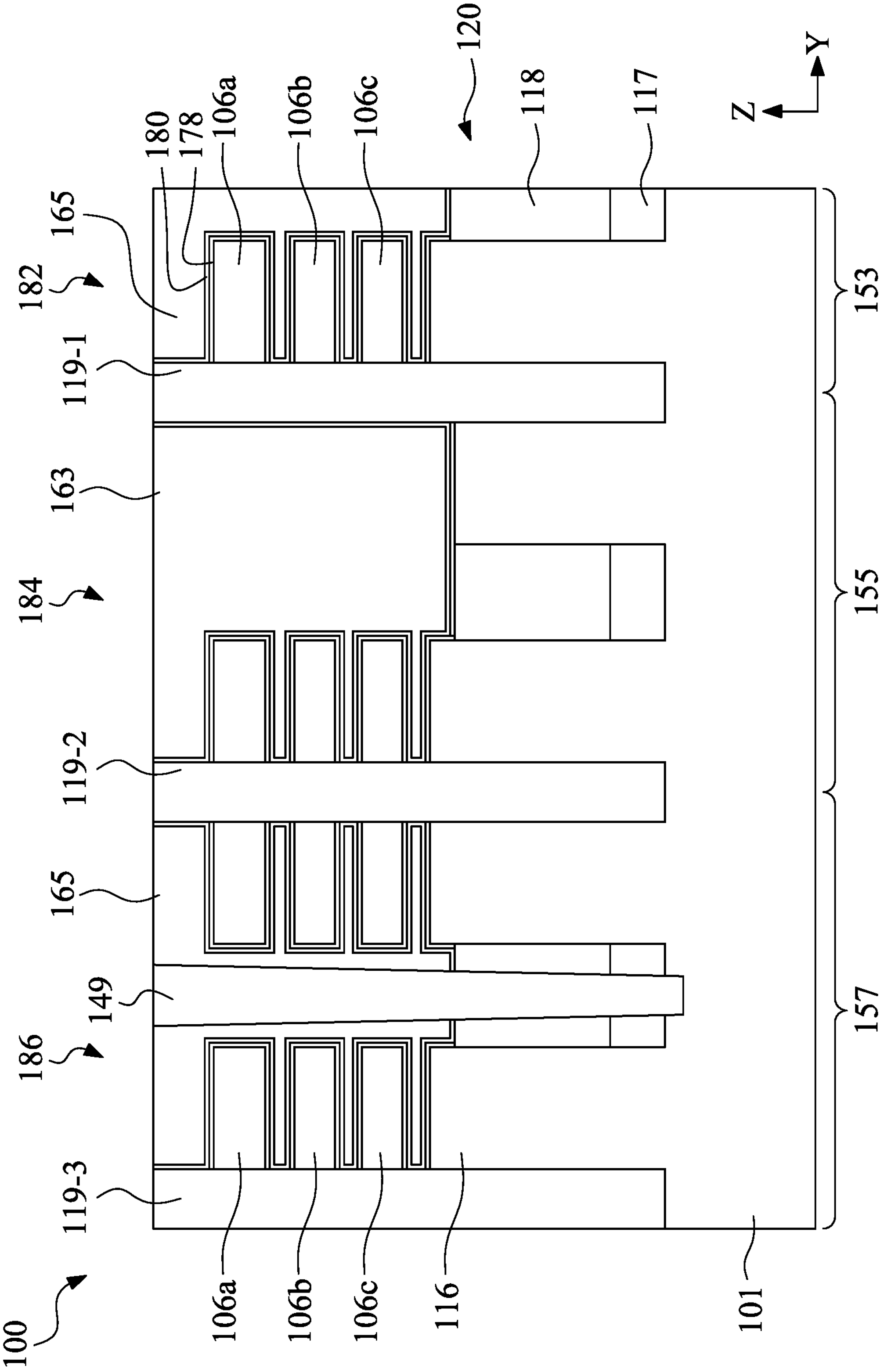
Figure 20C:
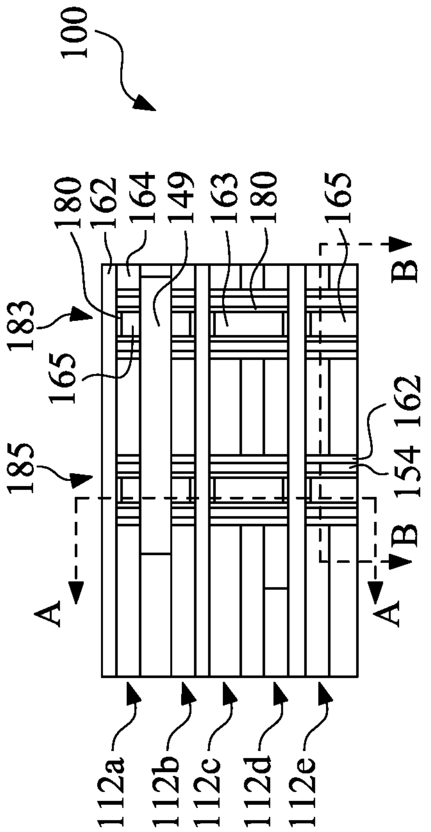
Figure 20B:
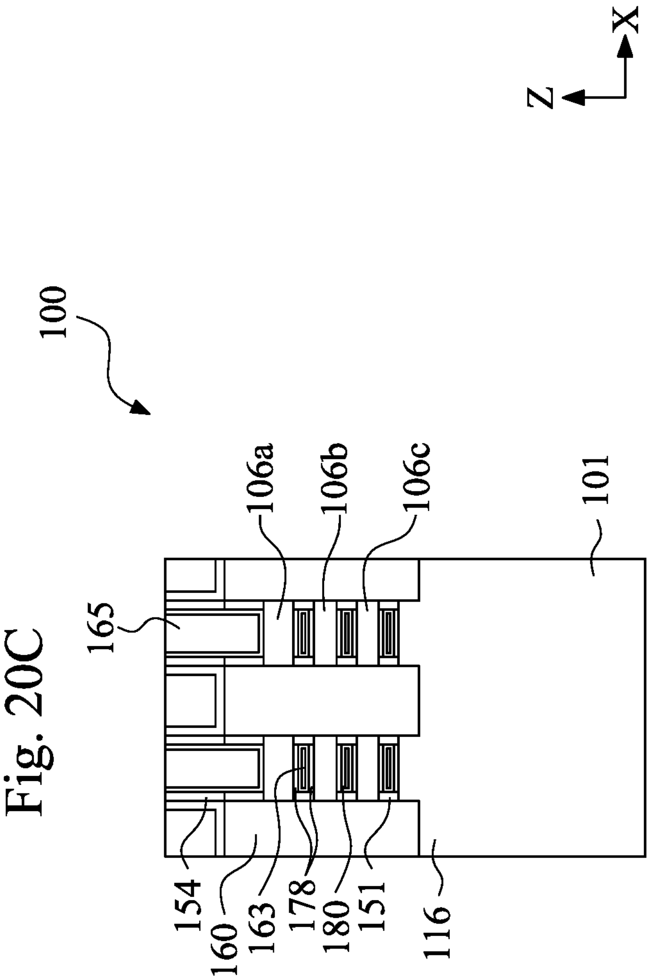
Figures 1, 20A:
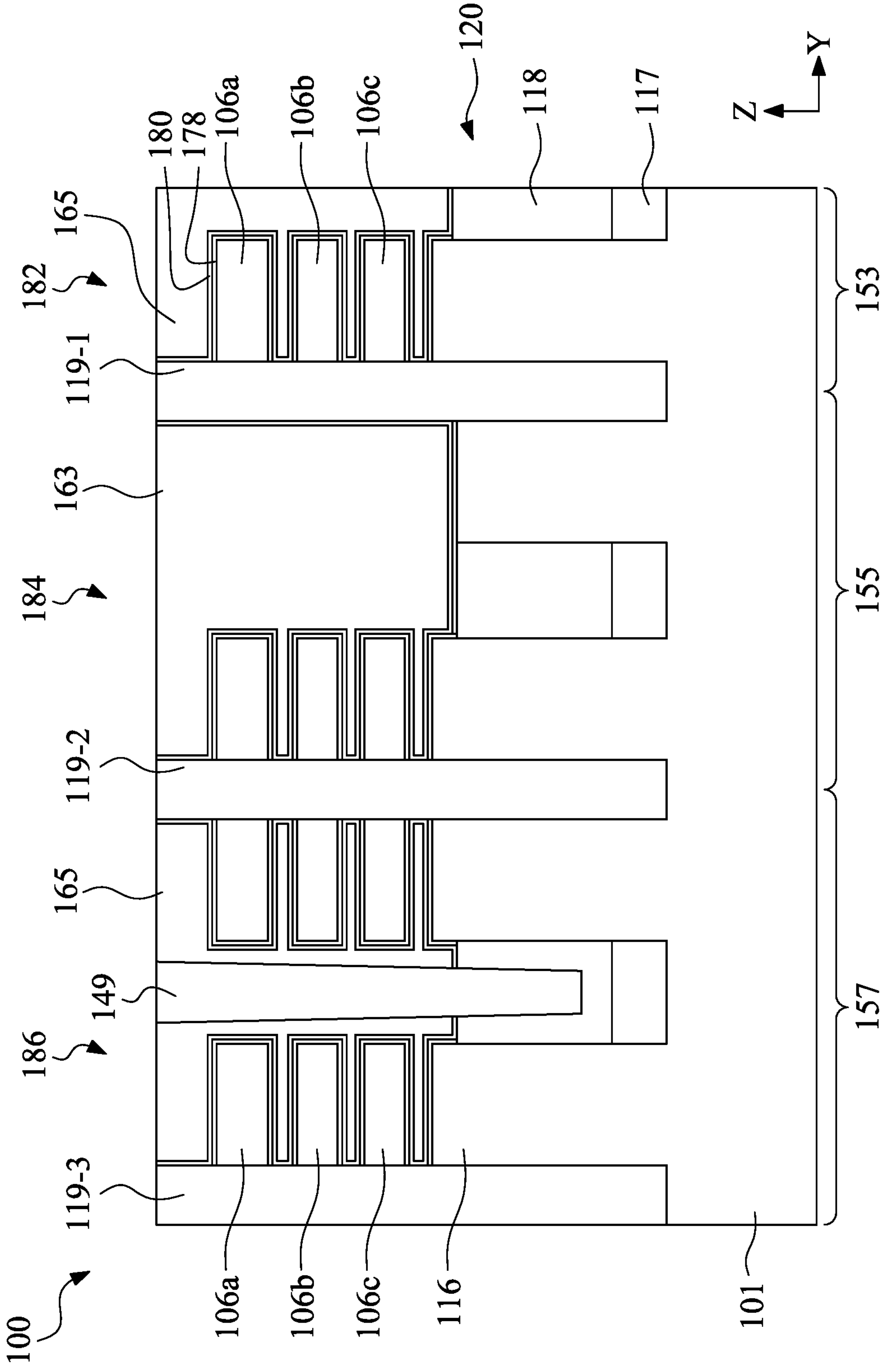
Figures 2, 20A:
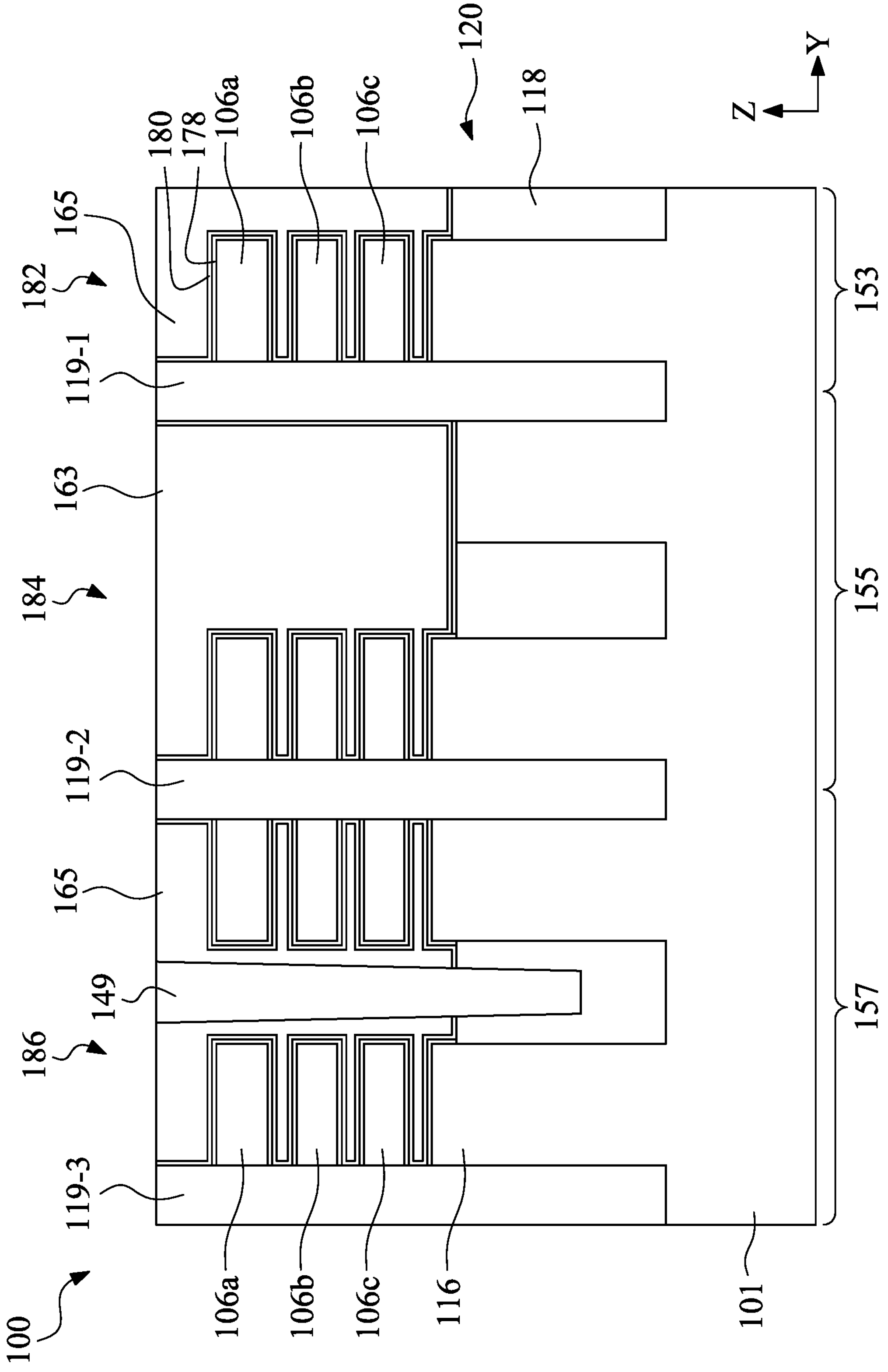

FIGS. 20A-1 and 20A-2 illustrate cross-sectional views of one of various stages of manufacturing the semiconductor device structure 100 in accordance with some alternative embodiments. The embodiment in FIG. 20A-1 is substantially identical to that shown in FIG. 20A except that the CMG structure 149 does not extend into a portion of the exposed substrate 101. Instead, the CMG structure 149 extends into a portion of the insulating material 118. In some embodiments, the CMG structure 149 extends into the insulating material 118 without touching the dielectric material 117. Likewise, the embodiment in FIG. 20A-2 is substantially identical to that shown in FIG. 20A except that the dielectric material 117 was previously removed from the trenches 114*a*, 114*c*, 114*e* during the removal process, as the alternative embodiment shown in FIG. 5A-1. In this embodiment, the CMG structure 149 extends into a portion of the insulating material 118 without touching the exposed substrate 101.

Figure 21A:
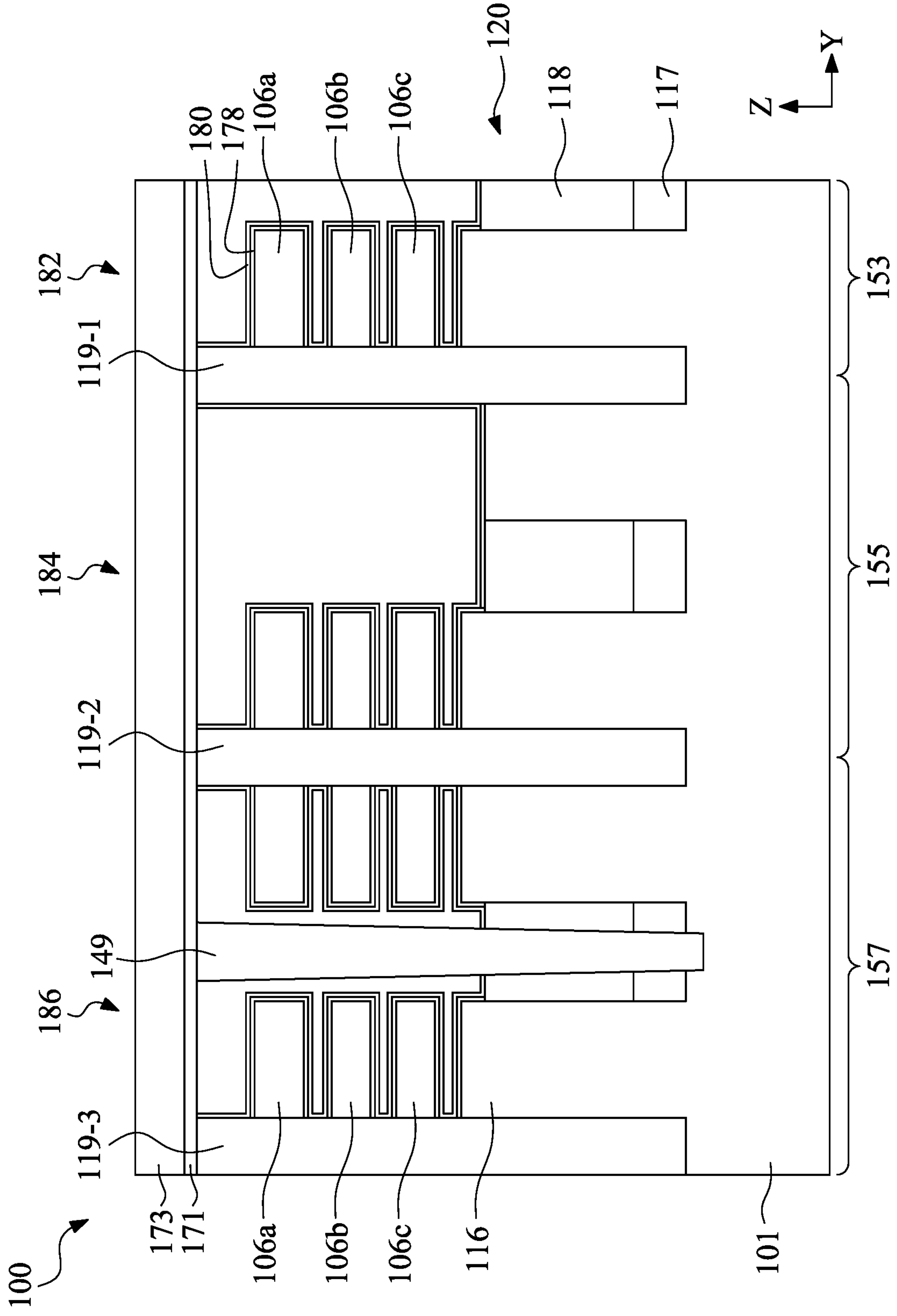
Figure 21C:
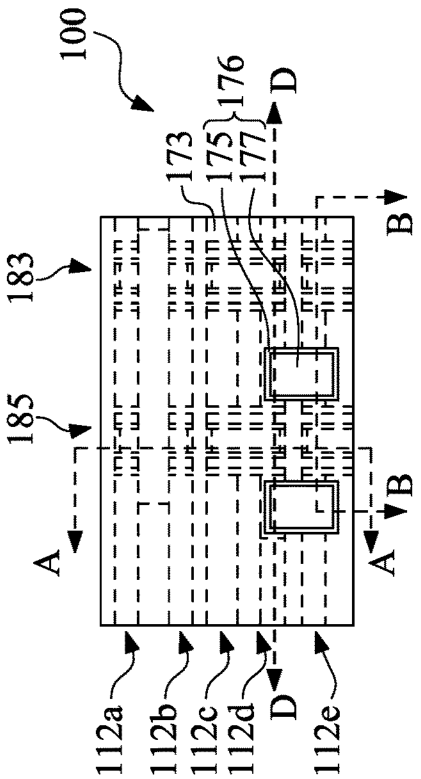
Figure 21B:
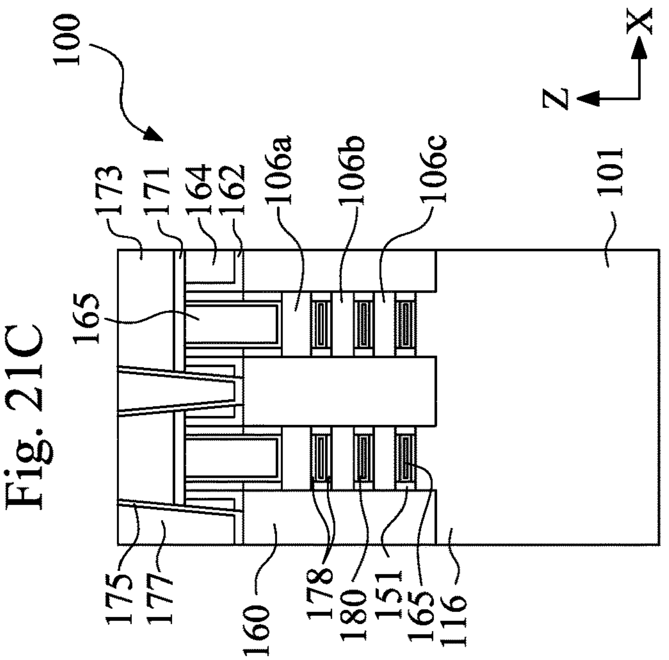
Figure 21D:
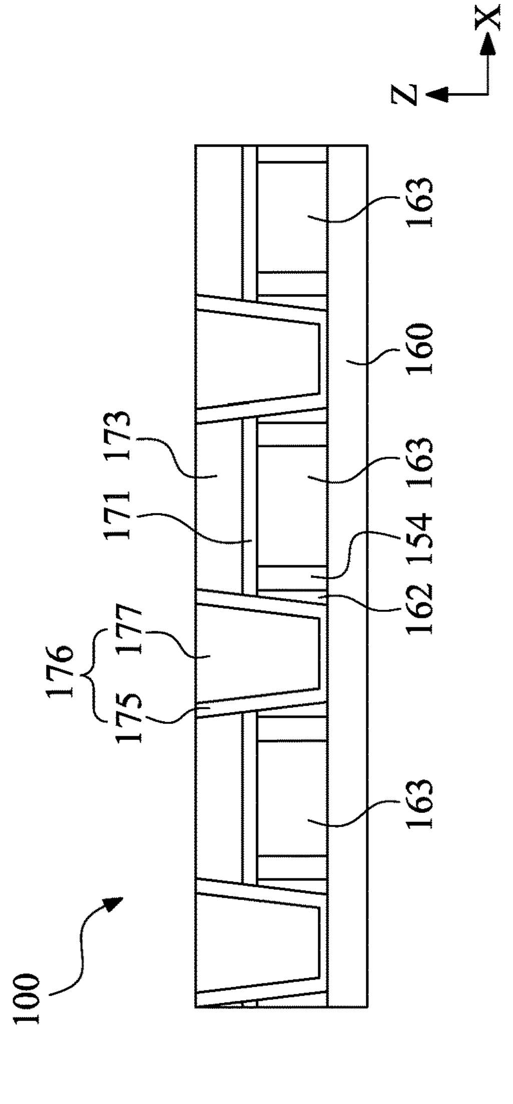
Figure 22A:
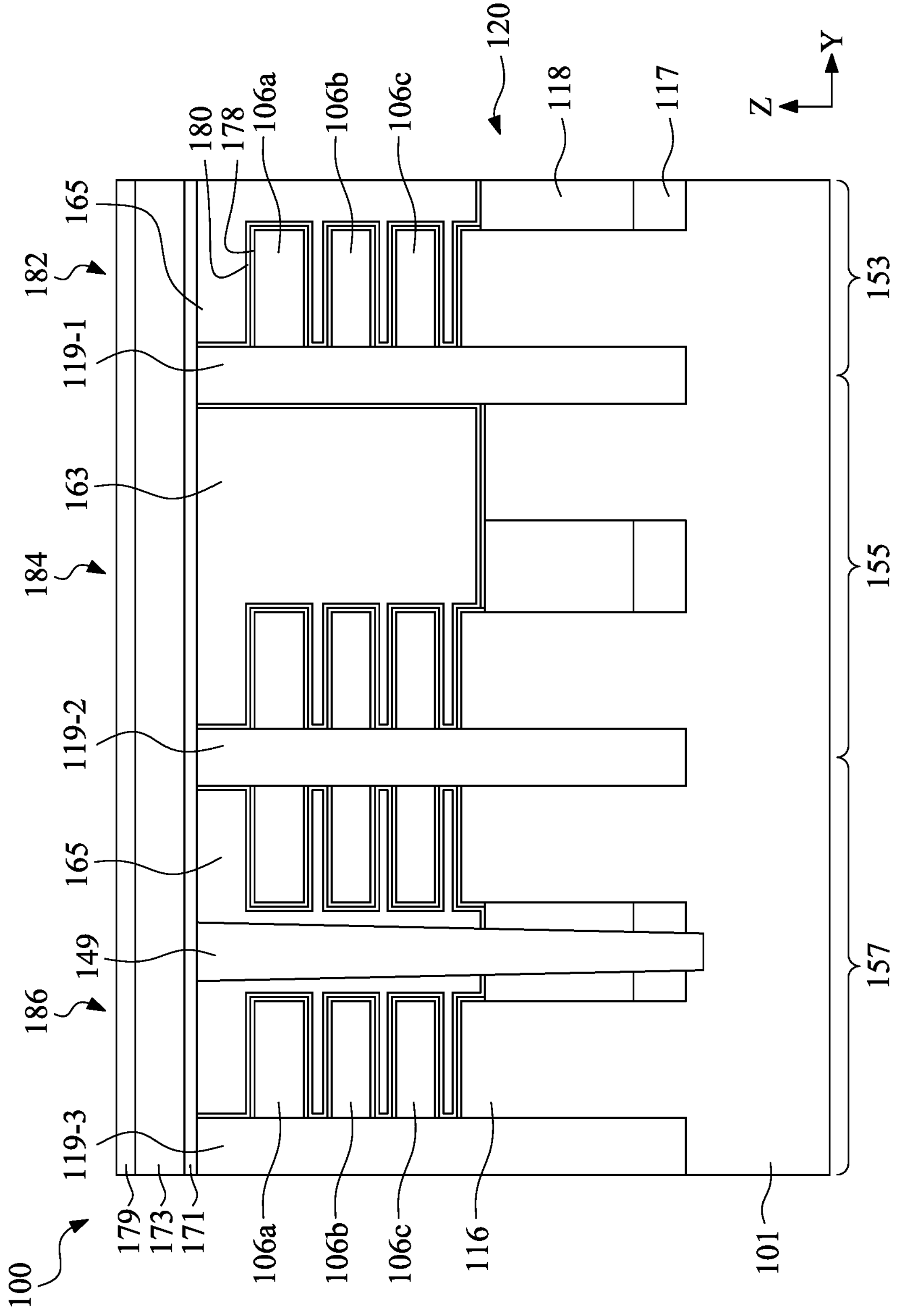
Figure 22C:
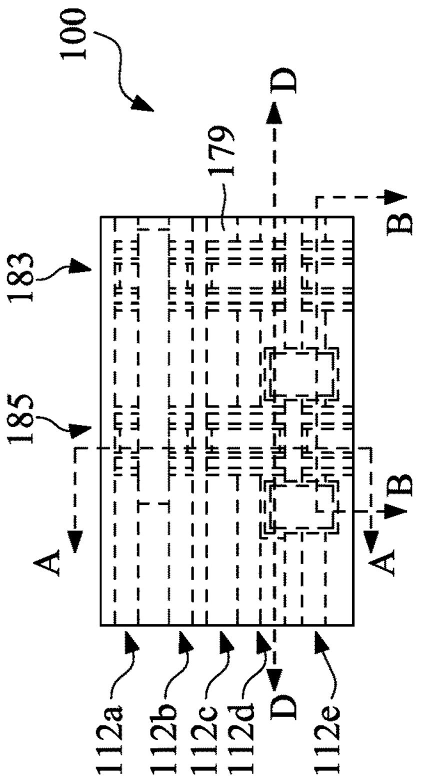
Figure 22B:
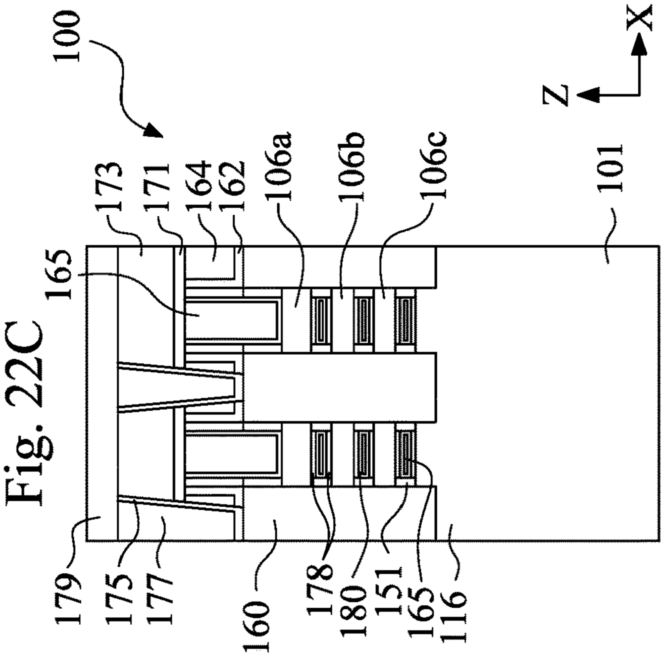
Figure 22D:
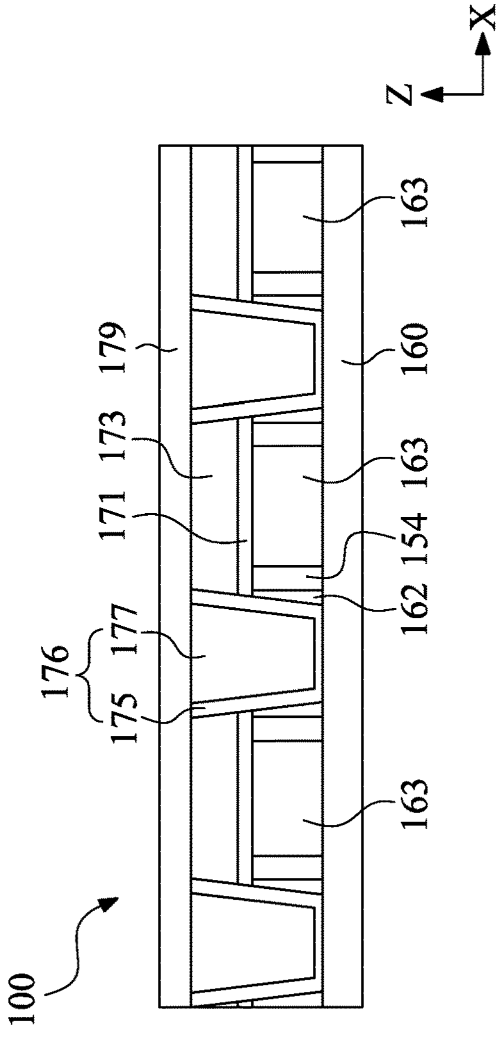

In FIGS. 21A-21C, a first etch stop layer 171 is formed on the top surfaces of the CMG structure 149, the first gate electrode layer 165, the second electrode layer 163, the HK dielectric layer 180, and the dielectric walls 119. The first etch stop layer 171 may include a nitrogen-containing material, such as silicon nitride, silicon carbon nitride, silicon oxynitride, carbon nitride, or the like, or a combination thereof. In some embodiments, the first etch stop layer 171 includes a carbide and a nitride. In some embodiments, the first etch stop layer 171 includes an oxide and a nitride. The first etch stop layer 171 may be formed by CVD, PECVD, ALD, or any suitable deposition technique. In some embodiments, the first etch stop layer 171 includes SiN. Thereafter, a second interlayer dielectric (ILD or ILD1) layer 173 is formed on the first etch stop layer 171. The materials for the second ILD layer 173 may include the same material as the first ILD layer 164, and may be deposited by a PECVD process or other suitable deposition technique.

After the formation of the second ILD layer 173, S/D contact openings are formed through the second ILD layer 173, the first etch stop layer 171, the first ILD layer 164, and the CESL 162 to expose a top surface of the epitaxial S/D features 160. A silicide layer (not shown) is then formed on the exposed epitaxial S/D features 160, and a S/D contact 176 is formed in the S/D contact openings on the silicide layer. The S/D contact 176 may include a barrier layer 175 and an electrically conductive material layer 177 formed on the barrier layer 175. The S/D contact 176 may be electrically connected to the epitaxial S/D features 160. The barrier layer 175 may include TiN, TaN, or the like, and the electrically conductive material layer 177 may include Ru, Mo, Co, Ni. W, Ti, Ta, Cu, Al, TiN, TaN, or the like. FIGS. 21D-26D illustrate cross-sectional side views of various stages of manufacturing the semiconductor device structure 100 taken along line D-D of FIG. 21C, in accordance with some embodiments. It should be noted that additional S/D contact 176 and gate electrode layers 163 are also shown in FIG. 26D for easy of discussion.

The S/D contact 176 may be formed by first depositing the barrier layer 175 on the second ILD layer 173 and within the S/D contact openings by a conformal deposition process, such as an ALD process. The electrically conductive material layer 177 is then formed on the barrier layer 175. The electrically conductive material layer 177 fills up the S/D contact openings and over the second ILD layer 173. A planarization operation, such as a CMP method, is then performed until the second ILD layer 173 is exposed. After the planarization operation, the top surfaces of the second ILD layer 173, the barrier layer 175, and the electrically conductive material layer 177 are substantially co-planar.

In FIGS. 22A-22D, a second etch stop layer 179 is formed on the second ILD layer 173. The second etch stop layer 179 may include the same material as the first etch stop layer 171, and may be deposited using the same fashion as the first etch stop layer 171. In some embodiments, the first and second etch stop layers 171, 179 may include the same material but with different ratio of the composition in order to have different etch selectivity. The first and second etch stop layers 171, 179 may be a single layer or a multi-layer structure. The first etch stop layer 171, the second ILD layer 173, and the second etch stop layer 179 may have a combined thickness of about 20 nm to about 60 nm, for example about 25 nm to about 30 nm.

In FIGS. 23A-23D, gate contact openings 181 and bridge contact openings 187 are formed. The gate contact openings 181 and bridge contact openings 187 are intended to be filled with a conductive material to form conductive features therein. The gate contact openings 181 extend through the second etch stop layer 179, the second ILD layer 173, and the first etch stop layer 171 to expose the gate electrode layer (e.g., gate electrode layers 163, 165). In various embodiments, the gate contact openings 181 are formed at regions where the dielectric walls 119 are located. In some embodiments, the gate contact openings 181 may be formed through a first patterned resist layer (not shown) at selected regions where the dielectric wall 119 separates gate electrode layers 163, 165 and each gate electrode layers 163, 165 surrounds an effective nanosheet channel region (e.g., first semiconductor layers 106*a*-*c*). The bridge contact openings 187 may be formed through the second etch stop layer 179 at selected regions where the gate electrode layers 163/165 and S/D contacts 176 are located. The bridge contact openings 187 therefore overlap with the gate contact opening 181. The gate contact openings 181 and bridge contact openings 187 may be formed by any suitable process, such as one or more etch processes. In some embodiments, the gate contact openings 181 and the bridge contact openings 187 are a result of a dual-damascene process. The gate contact opening 181 may be a via opening formed through the second etch stop layer 179, the second ILD layer 173, and the first etch stop layer 171 to expose a portion of the gate electrode layers 163, 165. The bridge contact opening 187 may be a trench opening formed in the second etch stop layer 179. In some embodiments, the bridge contact opening 187 is formed so that it is disposed directly above the gate contact opening 181 and extended over the S/D contact 176 and the gate electrode layer 163, 165. Depending on the design layout, at least one gate contact opening 181 may be disposed at the region where the fin structure 112*d* was partially removed, as one exemplary embodiment shown in FIGS. 23A and 23C. More or less gate contact openings 181 and bridge contact openings 187 are also contemplated.

Figure 23A:
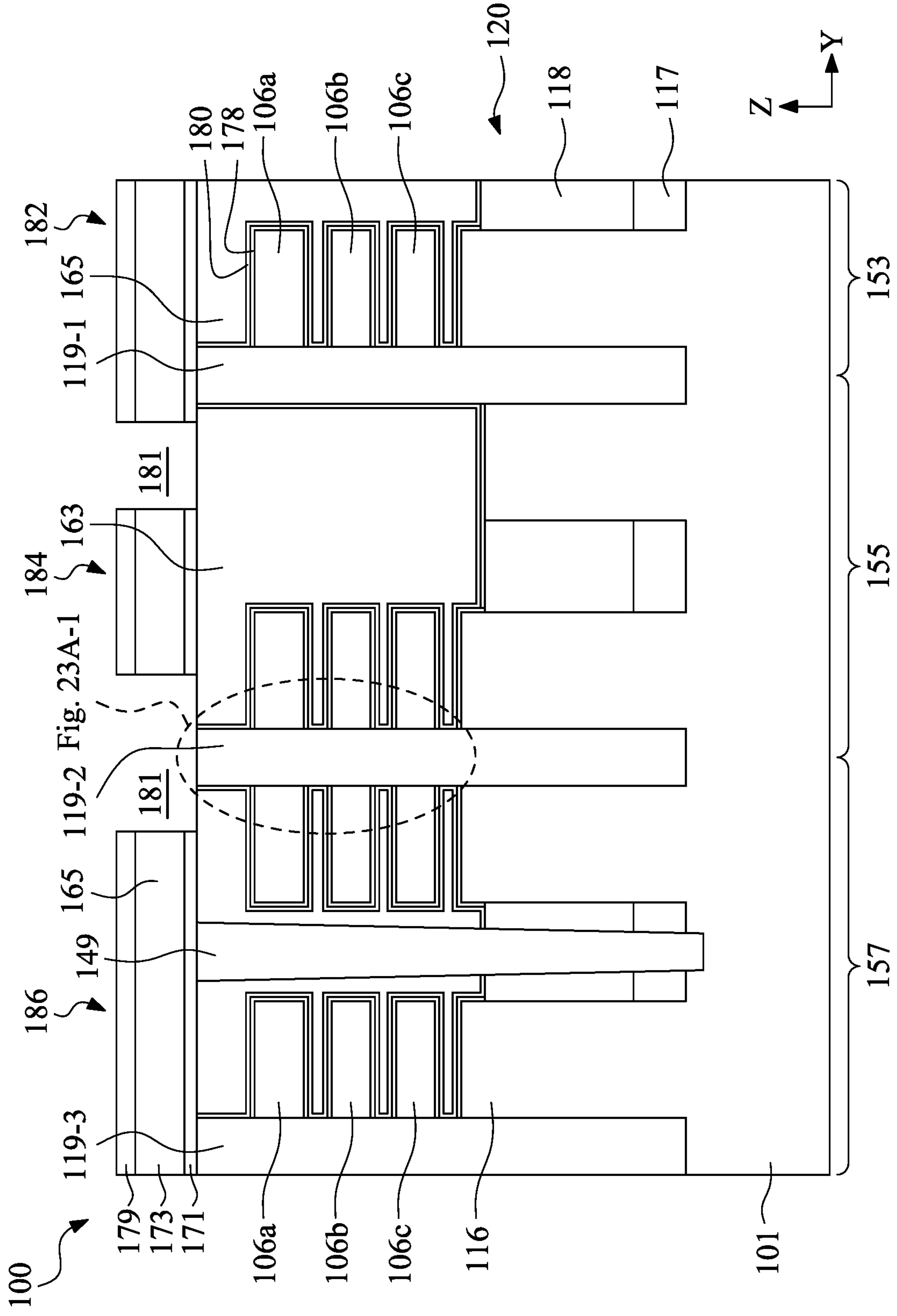
Figures 1, 23A:
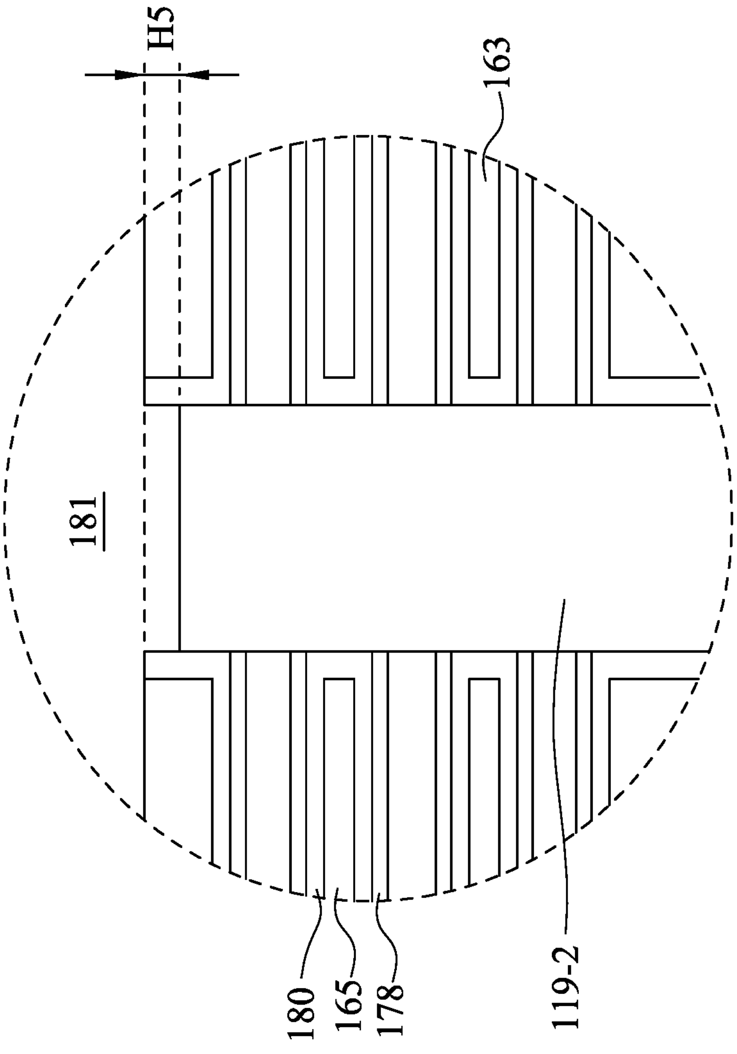
Figure 23C:
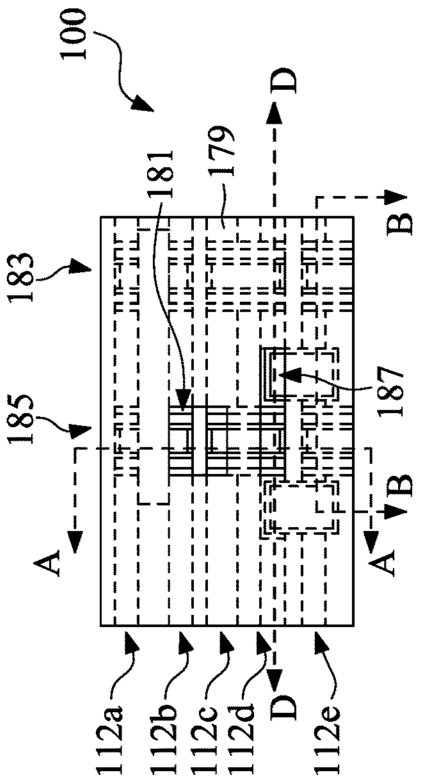
Figure 23B:
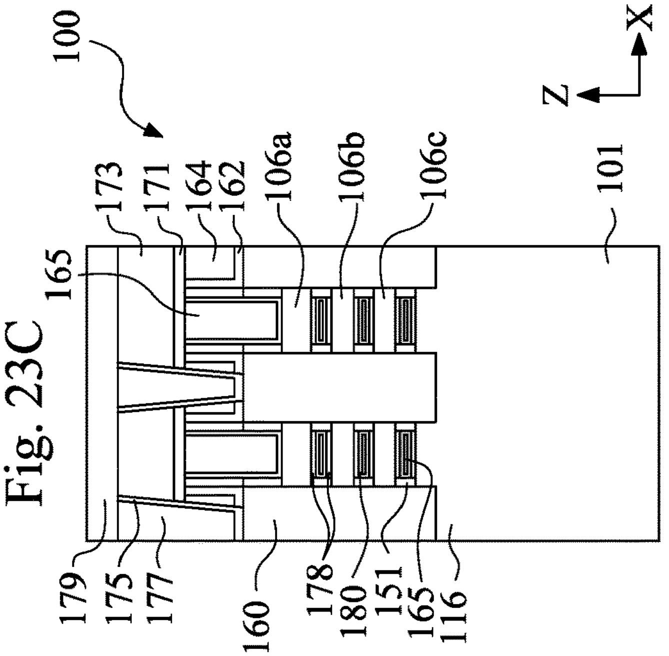
Figure 23D:
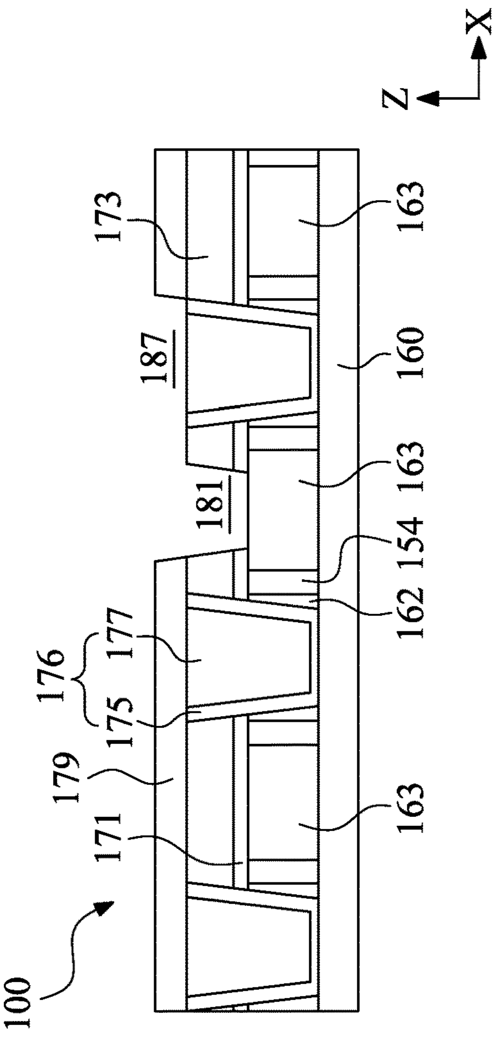
Figure 24A:
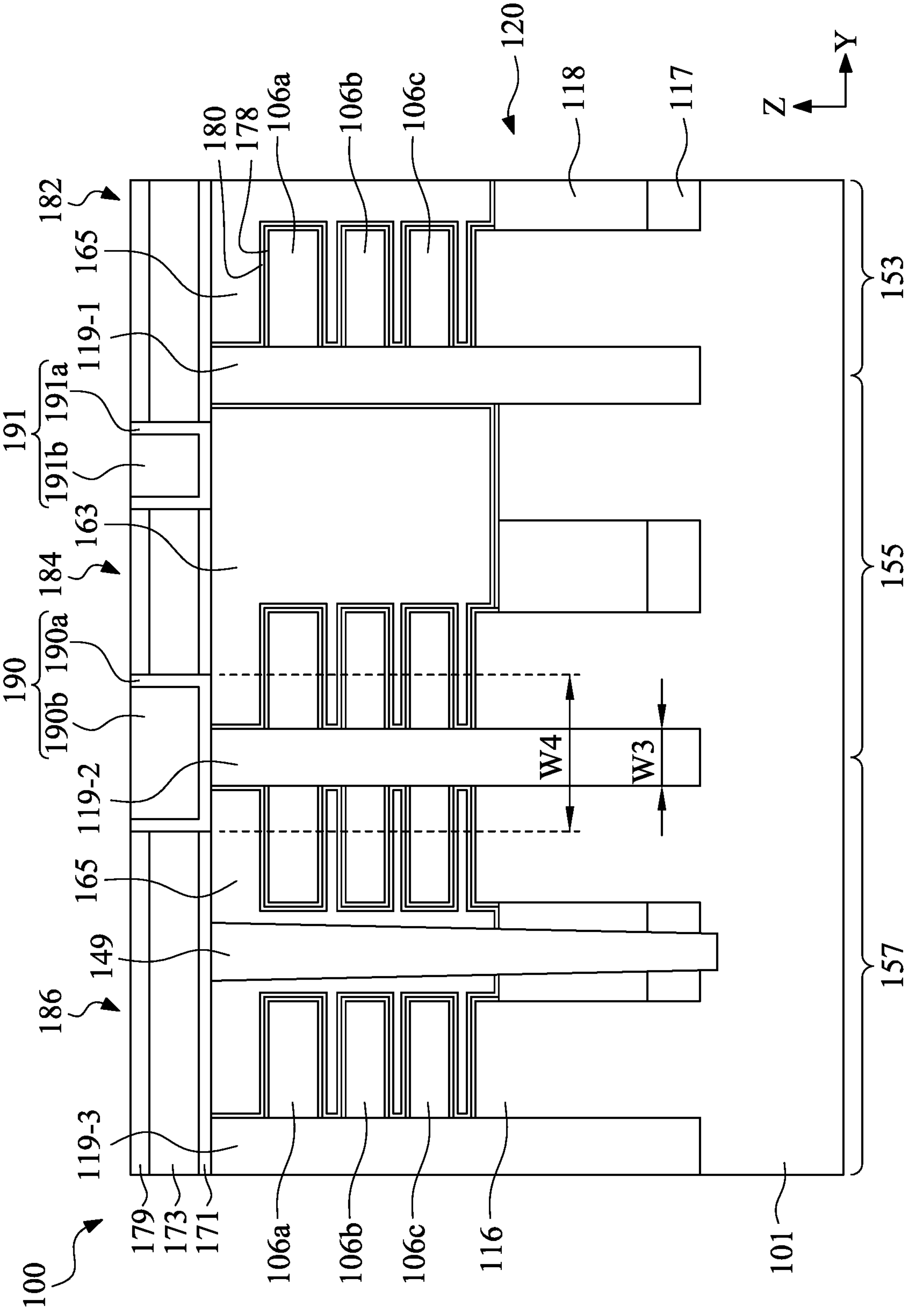
Figure 24C:
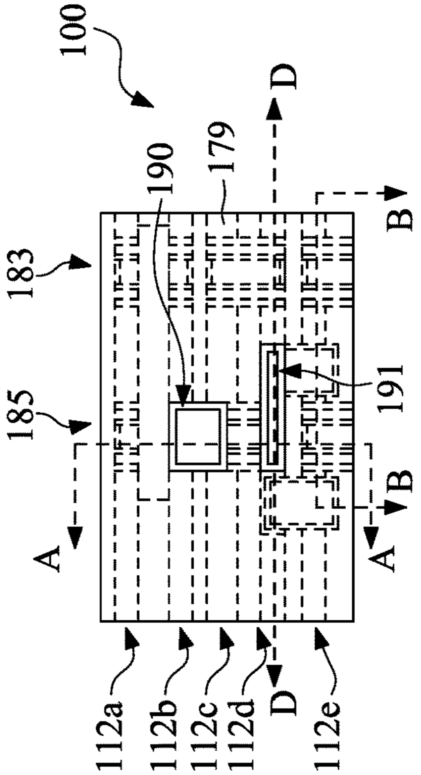
Figure 24B:
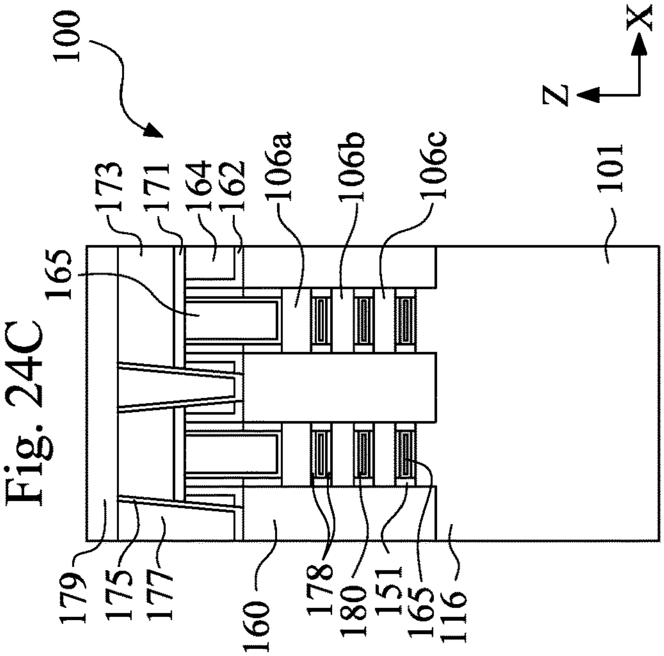
Figure 24D:
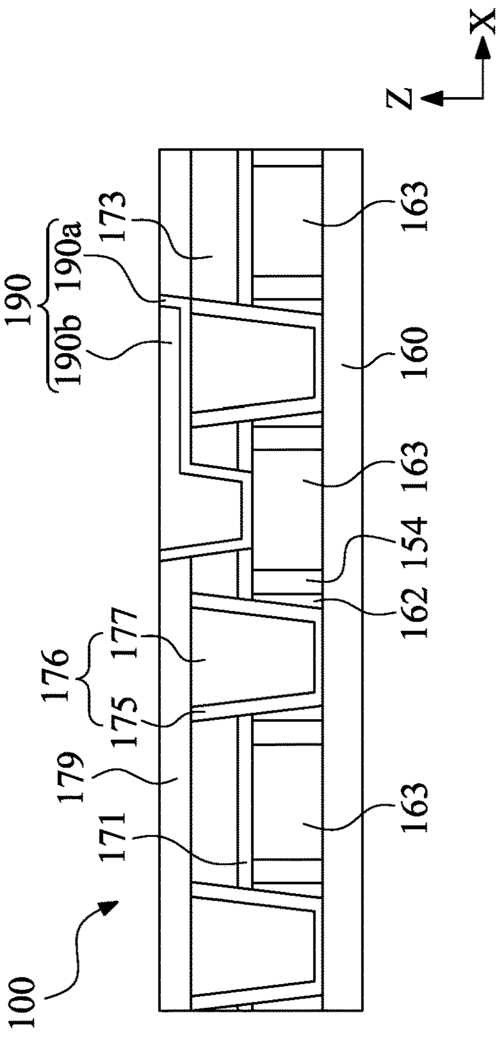
Figure 25A:
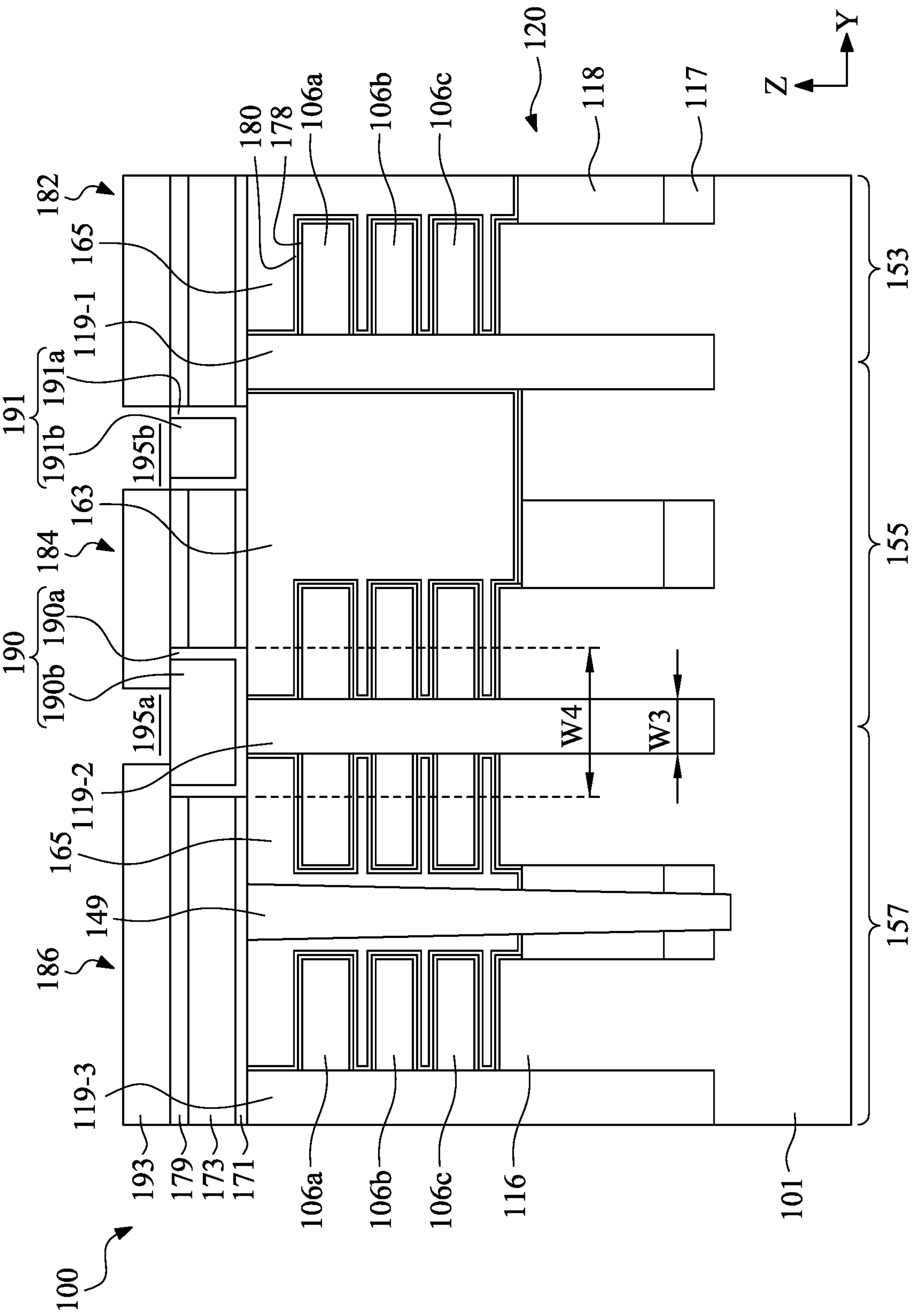
Figure 25C:
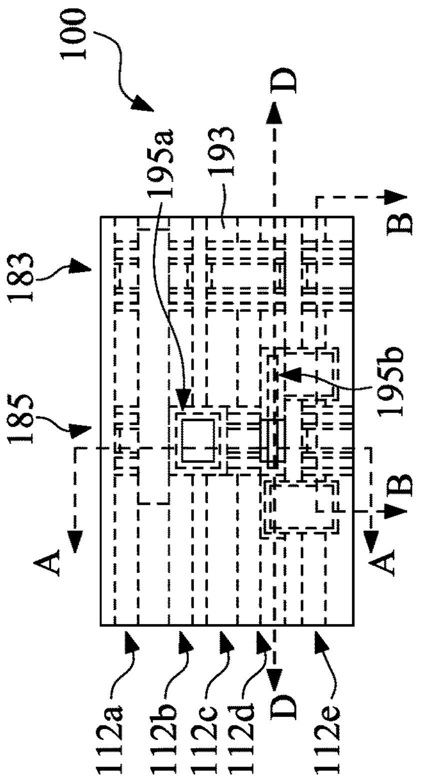
Figure 25B:
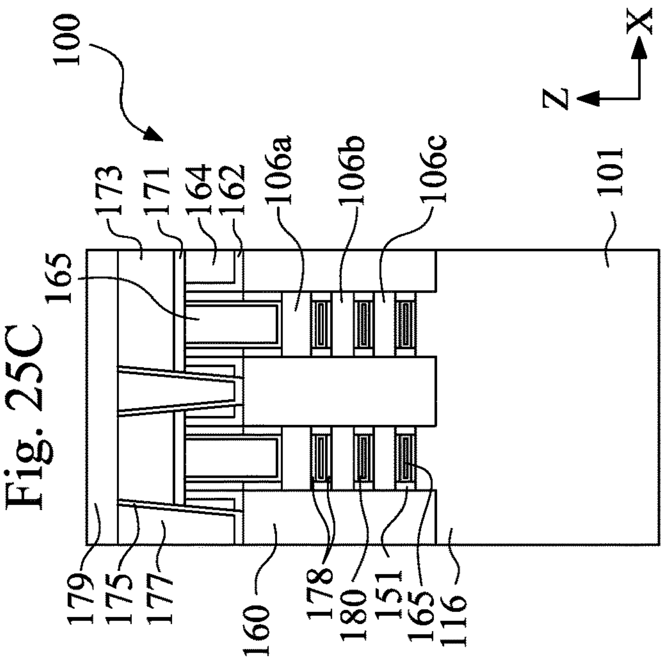
Figure 25D:
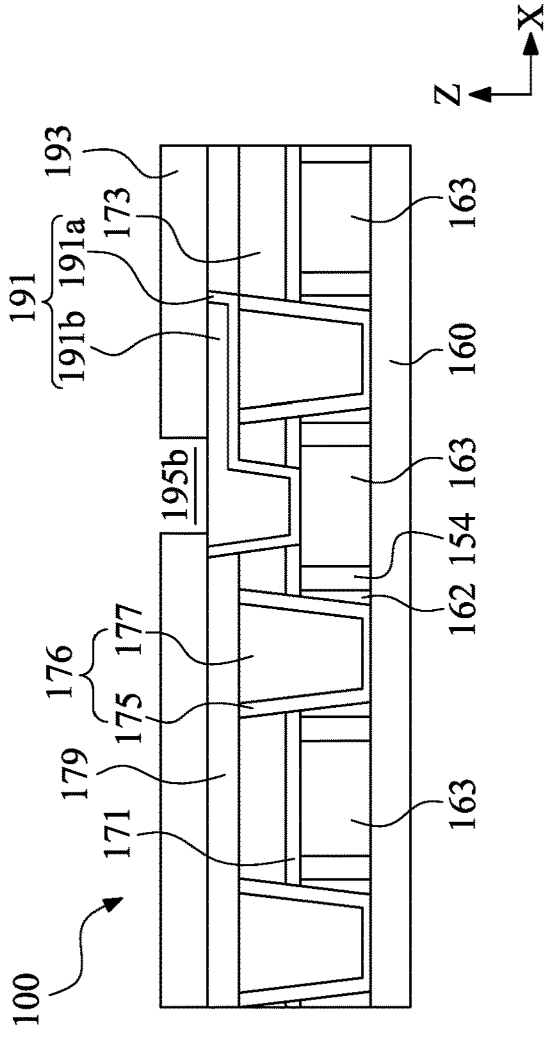

FIG. 23A-1 illustrates an enlarged view of a portion of the semiconductor device structure 100 of FIG. 23A, in accordance with some embodiments. As shown in FIG. 23A-1, the one or more etch processes may be performed so that the gate contact openings 181 further extends into a portion of the dielectric walls 119. In such cases, the dielectric wall 119 (e.g., dielectric wall 119-2) may be recessed so that the top surface of the dielectric wall 119 is at a level below the top surface of the gate electrode layers 163, 165 by a height H5. In some embodiments, the height H5 is in a range of about 1 nm to about 3 nm. The recess of the dielectric walls 119 allows more contact surface area of the subsequent metal gate bridge (190, FIG. 24A) with the gate electrode layers 163, 165, thereby improving gate control of the devices.

In FIGS. 24A-24D, gate bridge contact 190 and metal on gate bridge contact 191 are formed in the gate contact openings 181 and the bridge contact openings 187, respectively. The gate bridge contact 190 may include a barrier layer 190*a* and an electrically conductive material layer 190*b* formed on the barrier layer 190*a*. Likewise, the metal on gate bridge contact 191 may include a barrier layer 191*a* and an electrically conductive material layer 191*b* formed on the barrier layer 191*a*. The barrier layer 190*a*, 191*a* may include the same material as the barrier layer 175, and the electrically conductive material layer 190*b*, 191*b* may include the same material as the electrically conductive material layer 177. A planarization operation, such as a CMP method, is then performed until the second etch stop layer 179 is exposed. After the planarization operation, the top surfaces of the second etch stop layer 179, the barrier layer 190*a*, 191*a*, and the electrically conductive material layer 191*a*, 191*b* are substantially co-planar. The metal on gate bridge contact 191 may be considered as an integrated body having a lower portion (i.e., gate bridge contact 190) in contact with the gate electrode layer (e.g., gate electrode layer 163) and an upper portion extending from over the gate electrode layer to the S/D contact 176.

In various embodiments, the dielectric wall 119 (e.g., dielectric wall 119-2) along the Y-direction may have a width W3 and the gate bridge contact 190 along the Y-direction may have a width W4 that is greater than the width W3. In some embodiments, the width W3 and the width W4 are at a ratio (W3:W4) of about 1:1.5 to about 1:5, for example about 1:2 to about 1:3. Having the gate bridge contact 190 formed with a larger size than that of the dielectric wall 119 ensures that the gate bridge contact 190 is in contact with both the gate electrode layers 163 and gate electrode layer 165, and that the subsequent gate via contact 196 is in direct contact with the gate bridge contact 190, which minimizes the contact failure due to misalignment of the gate via contact 196 with the gate electrode layers 163, 165. The formation of the gate bridge contact 190 on the dielectric walls 119 (e.g., dielectric wall 119-2) allows the subsequent gate via contact 196 (FIG. 26A) to land directly on the gate bridge contact 190 without accidently punching into/through the dielectric walls 119, which may otherwise result in an open circuit failure if the gate via contact 196 were not in contact with the gate electrode layers 163, 165.

In FIGS. 25A-25D, a patterned third ILD layer (ILD2) 193 is formed on the second etch stop layer 179. The third ILD layer 193 may include the same material as the second ILD layer 173 and may be deposited using the same deposition technique as the second ILD layer 173. The patterned third ILD layer 193 defines via contact openings 195*a*, 195*b* at locations where the gate bridge contact 190 (FIG. 24C) and metal on gate bridge contact 191 (FIG. 24C) are located, respectively.

In FIGS. 26A-26D, gate via contact 196 and via bridge contact 197 are formed in the via contact openings 195*a*, 195*b*, respectively. The gate via contact 196 may include a barrier layer 196*a* and an electrically conductive material layer 196*b* formed on the barrier layer 196*a*. Likewise, the via bridge contact 197 may include a barrier layer 197*a* and an electrically conductive material layer 197*b* formed on the barrier layer 197*a*. The barrier layer 196*a*, 197*a* may include the same material as the barrier layer 175, and the electrically conductive material layer 196*b*, 197*b* may include the same material as the electrically conductive material layer 177. A planarization operation, such as a CMP method, is then performed until the third ILD layer 193 is exposed. After the planarization operation, the top surfaces of the third ILD layer 193, the barrier layer 196*a*, 197*a*, and the electrically conductive material layer 196*a*, 197*b* are substantially co-planar.

Figure 26A:
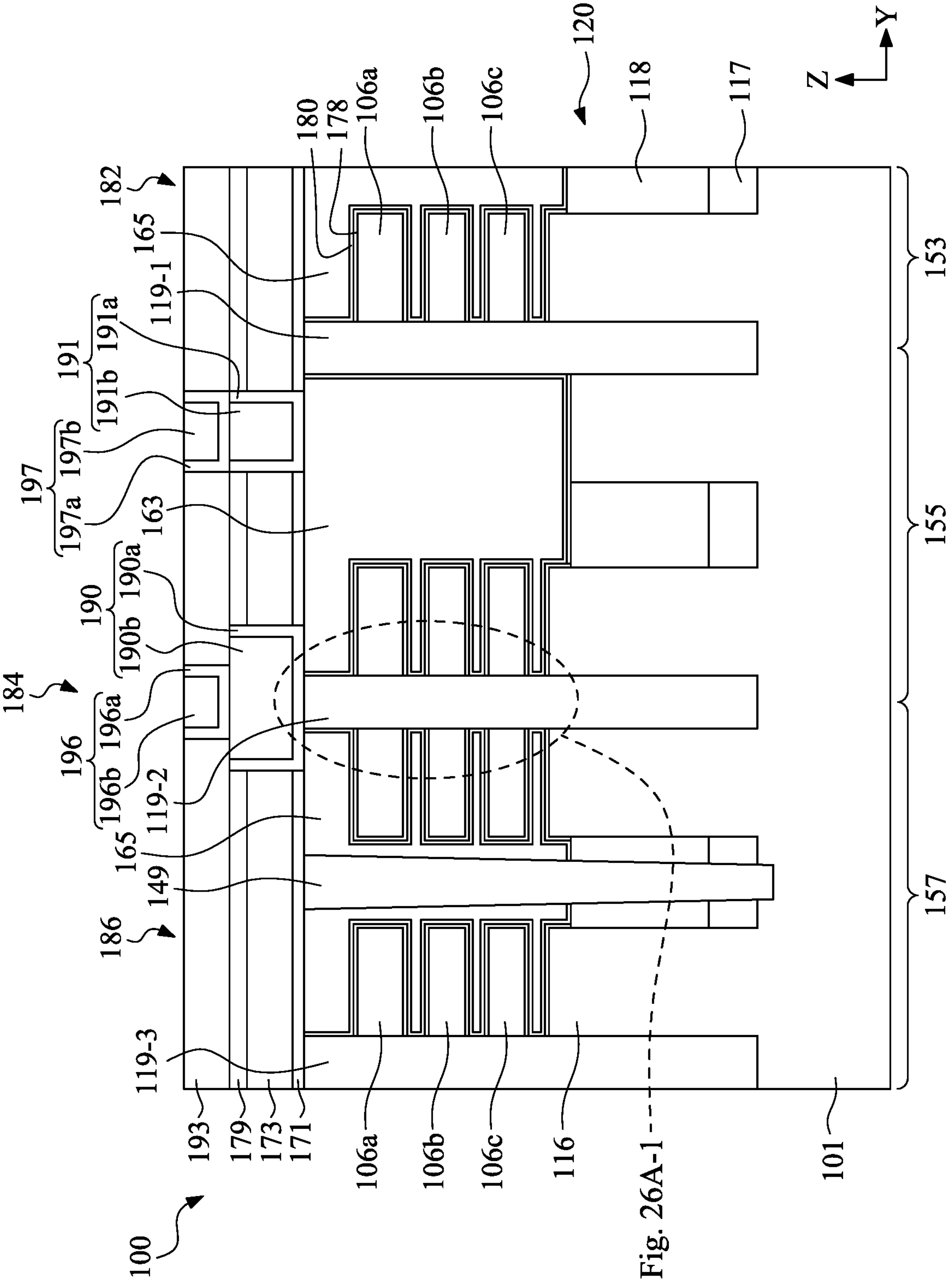
Figures 1, 26A:
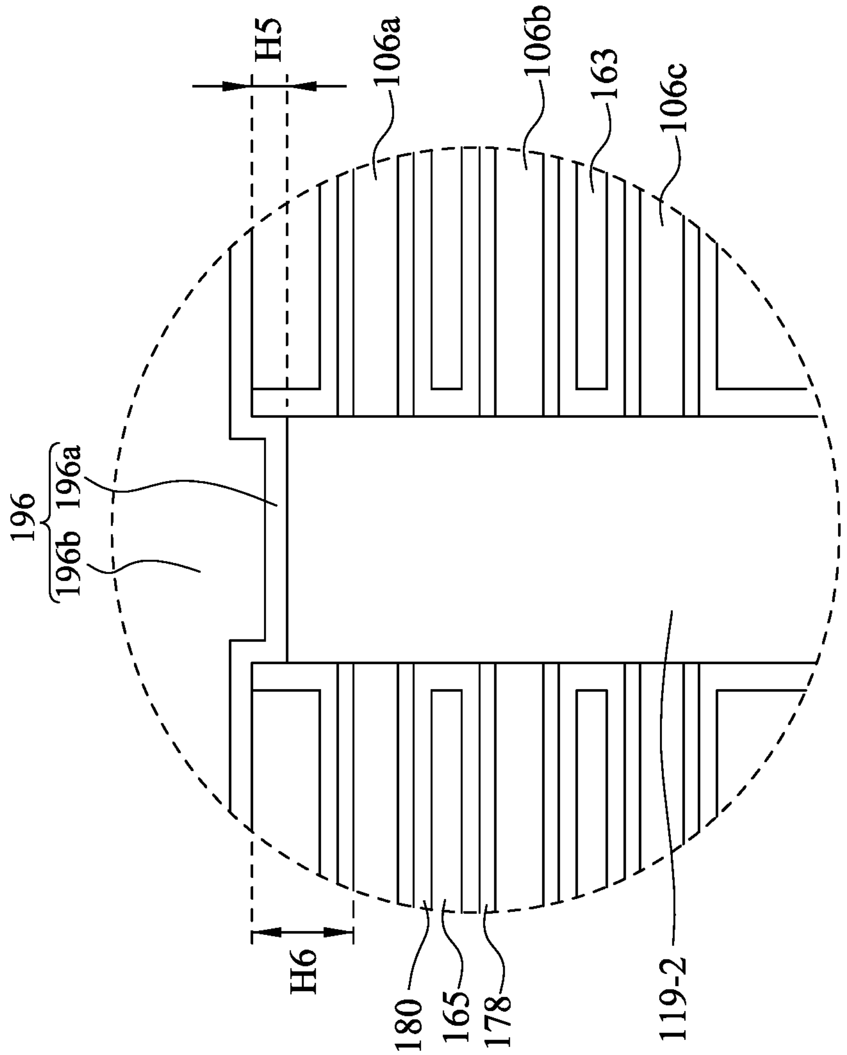
Figure 26C:
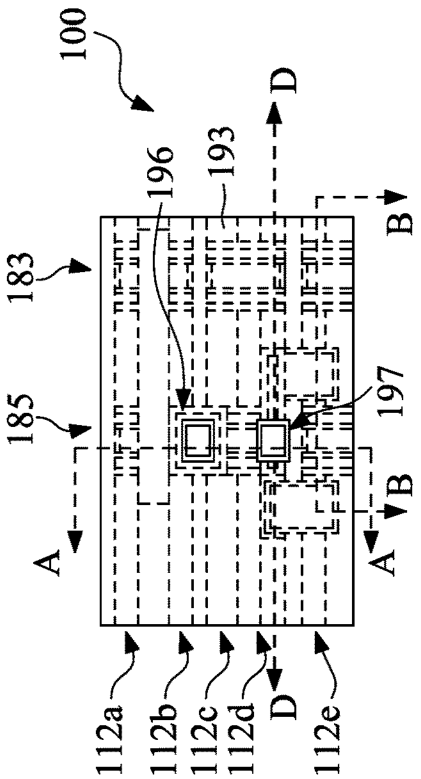
Figure 26B:
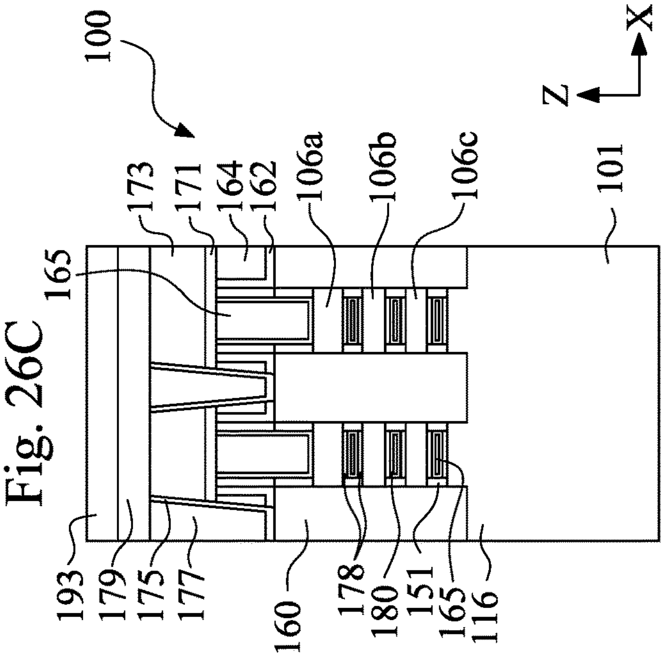
Figures 1, 26C:
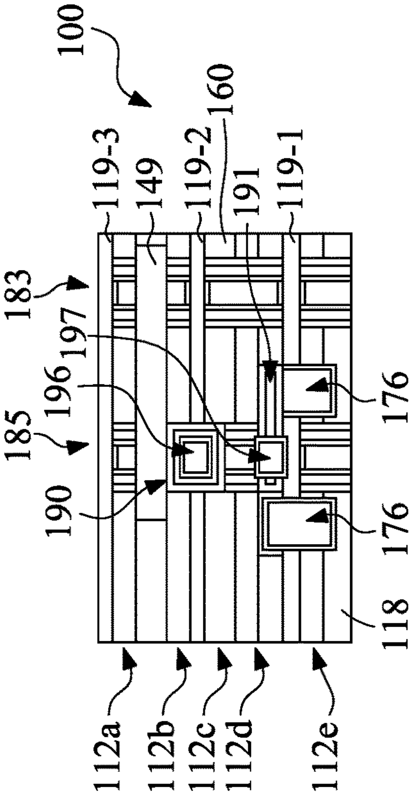
Figure 26D:
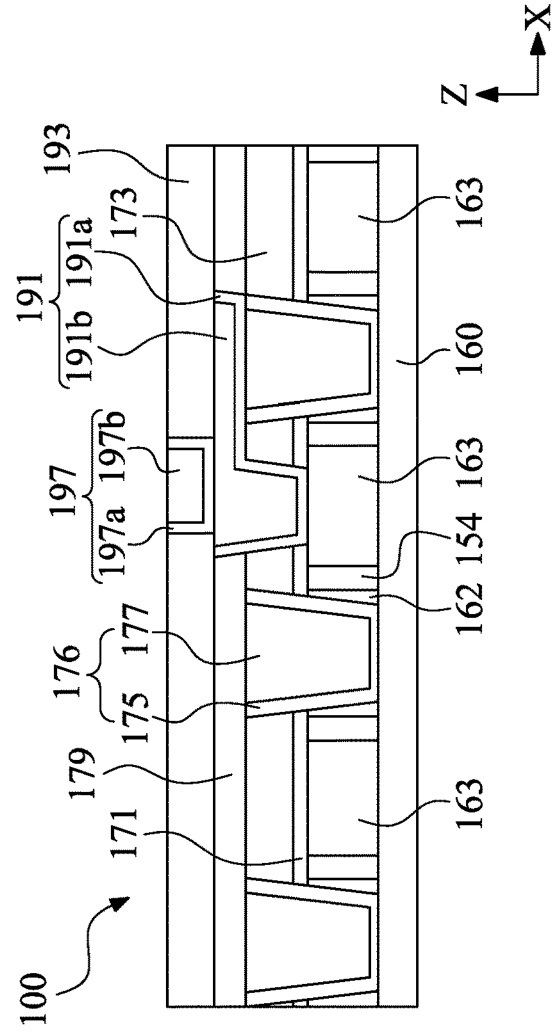

FIG. 26A-1 illustrates a portion of a bottom of the gate via contact 196 is further extended into a top portion of the dielectric wall 119 (e.g., dielectric wall 119-2). Specifically, portions of the barrier layer 196*a* and the electrically conductive material layer 196*b* are extended into the top portion of the dielectric wall 119-2. Therefore, the effective contact area between the gate via contact 196 and the gate electrode layers 163, 165 is increased. FIG. 26C-1 is a top view of the semiconductor device structure 100 of FIG. 26C showing locations of various devices/elements, in accordance with some embodiments. For the sake of illustration purpose, certain layers such as the ILD layers 173, 193, the etch stop layers 171, 179, etc., have been omitted. In addition, various features, such as the S/D contact 176, the gate bridge contact 190, the metal on gate bridge contact 191, the gate via contact 196, the via bridge contact 197, etc., are not drawn to scale. Instead, the dimensions of the various features may be arbitrarily increased or reduced for clarity of illustration. In some embodiments, the height H6 between the top surface of the gate electrode layer (e.g., gate electrode layer 165) and the top surface of the topmost first semiconductor layer 106*a* may be in a range of about 15 nm or less, for example about 3 nm to about 10 nm. The height H6 may correspond to the gate height of the gate electrode layers 163, 165.

Figure 27A:
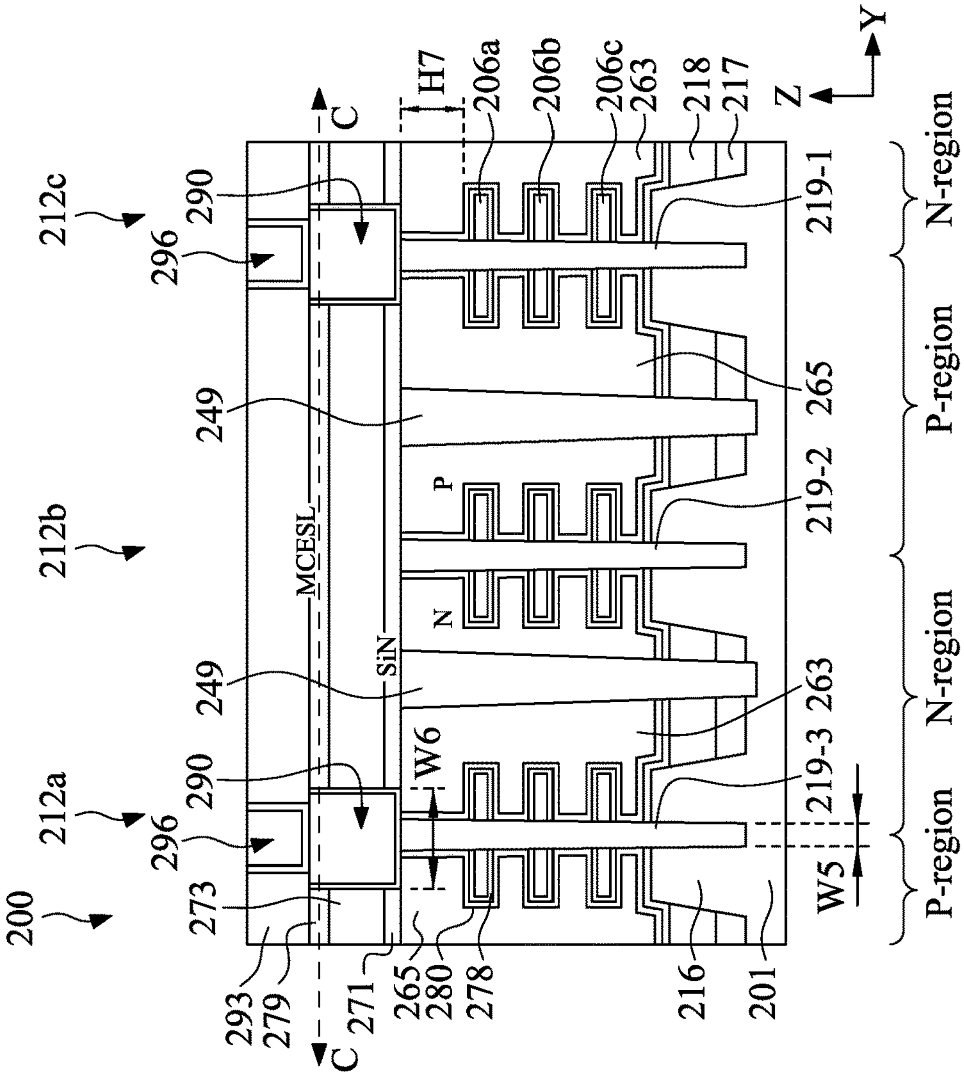
FIG. 27A is a cross-sectional view of a semiconductor device structure, in accordance with some alternative embodiments.
Figure 27B:
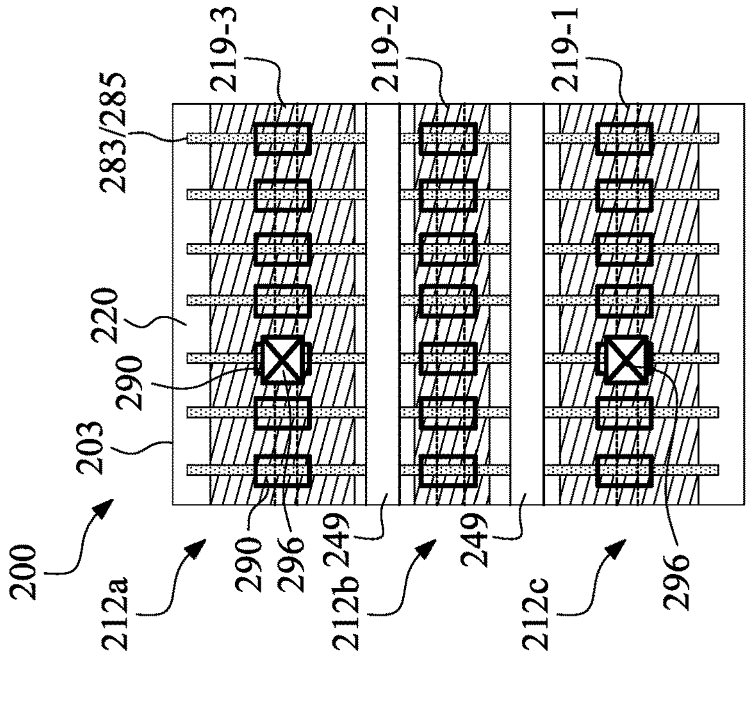
FIG. 27B is a top view of the semiconductor device structure of FIG. 27A, in accordance with some embodiments.
Figure 27C:
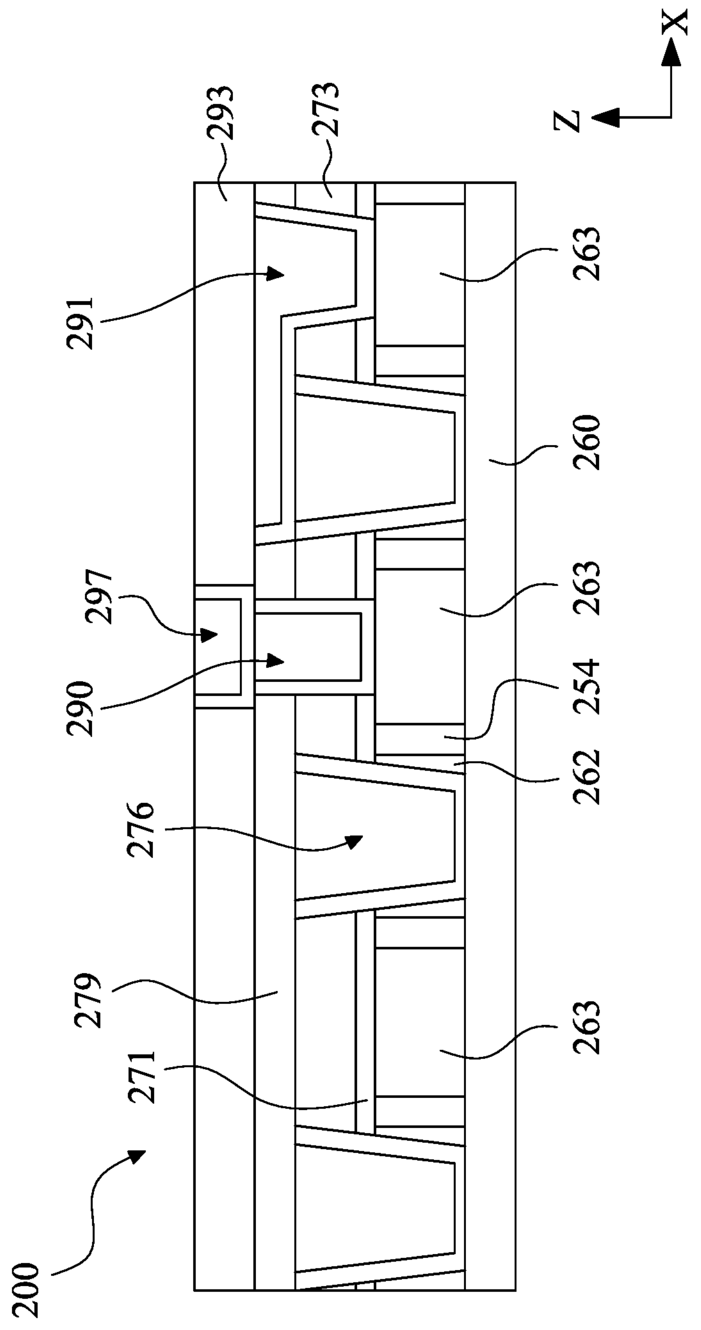
FIG. 27C is a cross-sectional side view of the semiconductor device structure taken along line C-C of FIG. 27A, in accordance with some embodiments.

FIG. 27A is a cross-sectional view of a semiconductor device structure 200 in accordance with some alternative embodiments. FIG. 27B is a top view of the semiconductor device structure 200 of FIG. 27A, which may represent a portion of design layout of active fin structures in a logic cell 203. FIG. 27C is a cross-sectional side view of the semiconductor device structure 200 taken along line C-C of FIG. 27A, in accordance with some embodiments. The embodiment in FIG. 27A is similar to the embodiment of FIG. 26A except that certain fin structures, such as a fin structure 212*c*, are not partially removed. Since the semiconductor device structure 200 has features similar to that of the semiconductor device structure 100 of FIG. 26A, the features of the semiconductor device structure 200 will be assigned with reference numerals in the form of "2xx" that are identical or substantially similar to features of the semiconductor device structure 100 having reference numerals in the form "1xx" for the purpose of simplicity and clarity. Most of the features in FIG. 27A-27C are similar to the features shown in FIG. 26A and therefore will not be repeated for the sake of brevity.

As can be seen in FIGS. 27A-27C, the fin structures 212*a*, 212*b*, 212*c* are extended along the Y-direction and a plurality of metal gate structures 283/285 are extended over the fin structures 212*a*, 212*b*, 212*c* along the X-direction. The isolation structure or so-called cut metal gate (CMG) structures 349 are disposed across the metal gate structures 283/285. Gate bridge contacts 290 are formed directly on the dielectric walls 219 and in contact with both the gate electrode layers 263, 265. The gate via contact 296 is formed on the gate bridge contact 290, which is in contact with the gate electrode layer (e.g., gate electrode layer 263). The gate bridge contact 290 extend through the second etch stop layer 279, the second ILD layer 273, and the first etch stop layer 271, and the gate via contact 296 extend through the third ILD layer 293 to contact with the gate bridge contact 290. Likewise, the dielectric wall 219 along the Y-direction may have a width W5 and the gate bridge contact 290 along the Y-direction may have a width W6 that is greater than the width W5. In some embodiments, the width W5 and the width W6 are at a ratio (W5:W6) of about 1:1.5 to about 1:5, for example about 1:2 to about 1:3. Having the gate bridge contact 290 formed with a larger size than that of the dielectric wall 219 ensures that the gate bridge contact 290 is in contact with both the gate electrode layers 263 and gate electrode layer 265, and that the gate via contact 296 is in direct contact with the gate bridge contact 290, which minimizes the contact failure due to misalignment of the gate via contact 296 with the gate electrode layers 263, 265. The formation of the gate bridge contact 290 on the dielectric walls 219 (e.g., dielectric wall 219-3) allows the gate via contact 296 to land directly on the gate bridge contact 290 without accidently punching into/through the dielectric walls 219, which may otherwise result in an open circuit failure if the gate via contact 296 were not in contact with the gate electrode layers 263, 265.

In some embodiments, the height H7 between the top surface of the gate electrode layer (e.g., gate electrode layer 263) and the top surface of the topmost first semiconductor layer 206*a* may be in a range of about 15 nm or less, for example about 3 nm to about 10 nm. The height H7 may correspond to the gate height of the gate electrode layers 163, 165. When the gate height is kept at about 15 nm or below, the overlap distance between the metal on gate bridge contact 291 and the source/drain contact 276 is decreased, which in turn reduces overall capacitance for the device.

FIG. 27C further illustrates the semiconductor device structure 200 includes a metal on gate bridge contact 291 and a via bridge contact 297. The metal on gate bridge contact 291 may include a lower portion in contact with the gate electrode layer (e.g., gate electrode layer 263) and an upper portion extending from over the gate electrode layer 263 to over the S/D contact 276. The via bridge contact 297 extends through the third ILD layer 293 and in direct contact with the gate bridge contact 290. The via bridge contact 297 is electrically connected to the gate electrode layer 263 via the gate bridge contact 290.

Figure 28:
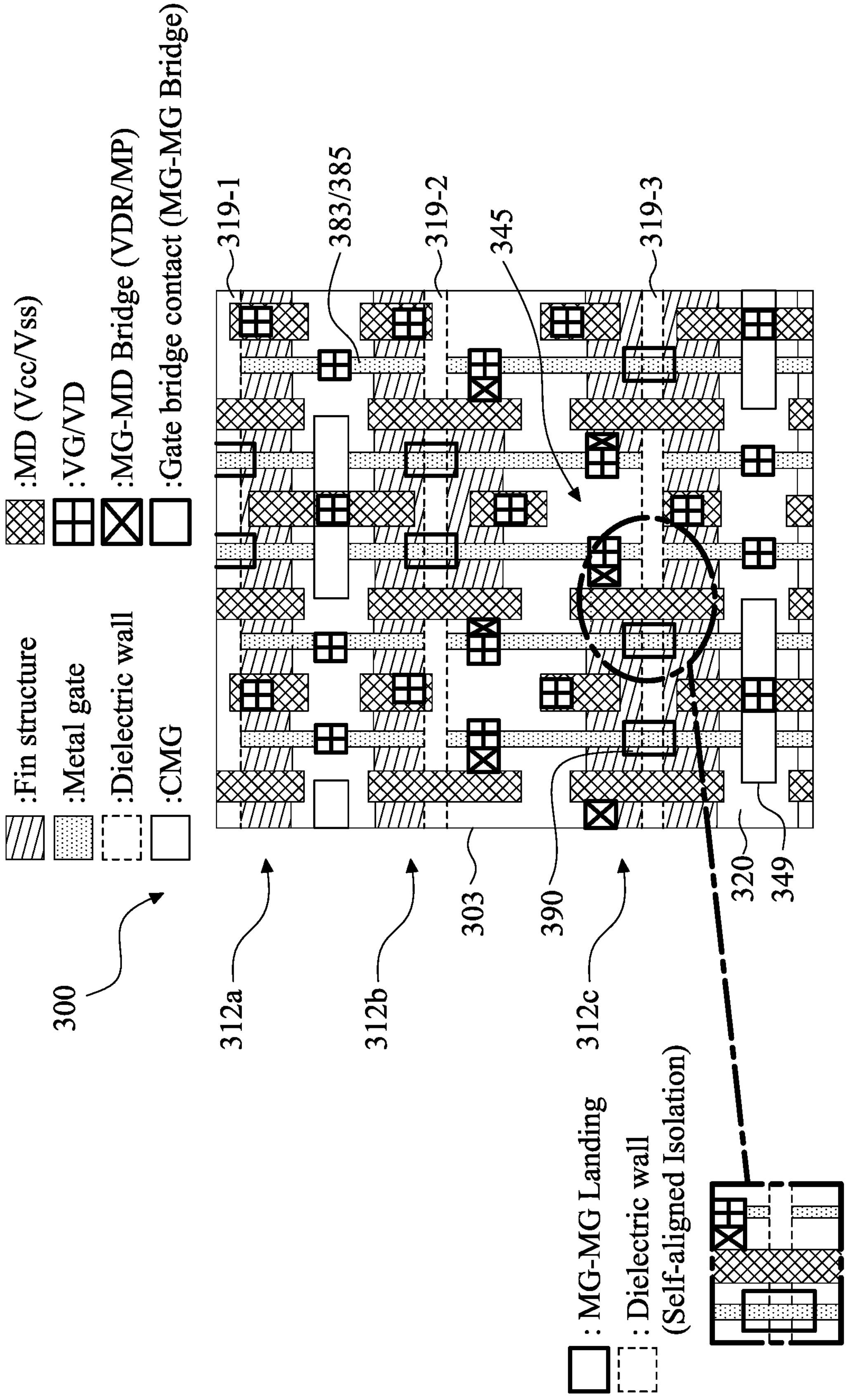
FIG. 28 is a top view of a semiconductor device structure, in accordance with some embodiments.

FIG. 28 is a top view of a semiconductor device structure 300, which may represent a portion of design layout of active fin structures in a SRAM cell 303, in accordance with some embodiments. 103. The features of the semiconductor device structure 300 will be assigned with reference numerals in the form of "3xx" that are identical or substantially similar to features of the semiconductor device structure 100 having reference numerals in the form "1xx" for the purpose of simplicity and clarity. Most features in FIG. 28 are similar to the features shown in FIG. 27B and therefore will not be repeated for the sake of brevity. In one embodiment, the semiconductor device structure 300 is a forksheet 6T SRAM cell including pull-up (PU) transistors, pass-gate (PG) transistors, and pull-down (PD) transistors. Likewise, gate bridge contacts 390 are formed directly on the dielectric walls 319 (319-1, 319-2, 319-3) and in contact with both P-type and N-type gate electrode layers (in the metal gate structure 383/385). The isolation structure or cut metal gate (CMG) structures 349 are disposed across the metal gate structures 383/385 at selected regions. The formation of the gate bridge contact 390 on the dielectric walls 319 (e.g., dielectric wall 319-3) allows gate via contact (not shown, such as gate via contact 296 in FIGS. 27A and 27B) to land directly on the gate bridge contact 390 without accidently punching into/through the dielectric walls 319. In addition, the source/drain contact (MD) and the metal gate (MG) located at the end-cut region 345 can be electrically connected through MG-MD bridge, which allows CMG structures 349 to cut on the STI 320 instead of the dielectric walls 319. As a result, the CMG etch-through damage to the dielectric walls 319 and VG high-R and/or open risk (due to VG landing on dielectric wall) are prevented, which is advantageous for scaling and design feasibility.

It is understood that the semiconductor device structures 100, 200 may undergo further complementary metal oxide semiconductor (CMOS) and/or back-end-of-line (BEOL) processes to form various features such as transistors, contacts/vias, interconnect metal layers, dielectric layers, passivation layers, etc. For example, the semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 160 to a backside power rail (e.g., positive voltage VDD or negative voltage VSS) through the backside contacts. Depending on the application, the source or drain feature/terminal of the epitaxial S/D features 160 and the gate electrode layers 163, 165 may be connected to a frontside power source.

Various embodiments described herein offer multiple advantages over the state-of-art technology. According to embodiments of the present disclosure, a gate bridge contact is formed between and in contact with a gate via contact and a dielectric wall. The gate bridge contact is larger in size (e.g., width) than that of the gate via contact and the dielectric wall to ensure electrical contact with gate electrode layers at N-type region and P-type region. The larger size of the gate bridge contact also allows a gate via contact to land directly on the gate bridge contact without accidently punching into/through the dielectric walls, which may otherwise result in an open circuit failure if the gate via contact were not in contact with the gate electrode layer. The use of the gate bridge contact avoid possible damage to the dielectric walls and the gate electrode layers (and thus contact failure) due to misalignment of the gate via contact with the gate electrode layers. In addition, after formation of the gate electrode layers, a planarization process may be performed on the gate electrode layers until gate electrode layers at N-type region and gate electrode layers at P-type region are fully blocked by the dielectric wall. This keeps the gate height at a minimum so that the overlap distance between the metal gate contact and source/drain contact can be reduced for a lower capacitance of the device. Lastly, the use of the gate bridge contact allows cut metal gate (CMG) structures to be formed at regions between adjacent dielectric walls instead of on the dielectric walls. As a result, the CMG structures are less likely to land on (and damage) the dielectric walls due to larger spacing between the adjacent dielectric walls. Even if the CMG structure is slightly misaligned, the CMG structure can still properly separate the gate structures as intended without the risk of damaging the dielectric walls.

An embodiment is a semiconductor device structure. The structure includes a first dielectric wall, a plurality of first semiconductor layers vertically stacked and extending outwardly from a first side of the first dielectric wall, a plurality of second semiconductor layers vertically stacked and extending outwardly from a second side of the first dielectric wall. The structure also includes a first gate electrode layer surrounding at least three surfaces of each of the first semiconductor layers, the first gate electrode layer having a first conductivity type, and a second gate electrode layer surrounding at least three surfaces of each of the second semiconductor layers, the second gate electrode layer having a second conductivity type opposite the first conductivity type. The structure further includes a gate bridge contact disposed on the first dielectric wall, and a gate via contact disposed on the gate bridge contact.

Another embodiment is a semiconductor device structure. The structure includes a first dielectric wall, a plurality of first semiconductor layers vertically stacked and extending outwardly from a first side of the first dielectric wall, a second dielectric wall disposed in parallel with the first dielectric wall, a plurality of second semiconductor layers vertically stacked and extending outwardly from both sides of the second dielectric wall, a third dielectric wall disposed in parallel with the first dielectric wall, a plurality of third semiconductor layers vertically stacked and extending outwardly from a first side of the third dielectric wall, a gate structure disposed over a portion of the first, second, and third dielectric walls, a source/drain contact disposed over a portion of the first dielectric wall and in contact with an epitaxial source/drain feature, a metal on gate bridge contact disposed over the gate structure and in contact with a portion of the gate structure and the source/drain contact, and a gate bridge contact disposed over a portion of the gate structure and in contact with the second dielectric wall.

A further embodiment is a method. The method includes forming first, second, third, and fourth fin structures from a substrate, wherein the first fin structure includes a first plurality of semiconductor layers, the second fin structure includes a second plurality of semiconductor layers, the third fin structure includes a third plurality of semiconductor layers, and the fourth fin structure includes a fourth plurality of semiconductor layers, and wherein each of the first, second, third, and fourth plurality of semiconductor layers comprises first semiconductor layers and second semiconductor layers. The method also includes forming a first dielectric wall between the first fin structure and the second fin structure, forming a second dielectric wall between the third fin structure and the fourth fin structure, forming a sacrificial gate stack over a portion of the first, second, third, and fourth fin structures, and over a portion of the first and second dielectric walls, removing a portion of the first, second, third, and fourth fin structures not covered by the sacrificial gate stack, removing the sacrificial gate stack to expose portions of the first, second, third, and fourth fin structures, selectively removing the second semiconductor layers of the first, second, third, and fourth plurality of semiconductor layers. The method also includes surrounding a first gate electrode layer over at least three surfaces of each of the first semiconductor layer of the third plurality of semiconductor layers, wherein the first gate electrode layer has a first conductivity type. The method further includes surrounding a second gate electrode layer over at least three surfaces of each of the first semiconductor layer of the fourth plurality of semiconductor layers, wherein the second gate electrode layer has a second conductivity type opposite the first conductivity type. The method further includes performing a planarization operation so that top surfaces of the first and second dielectric walls and top surfaces of the first and second gate electrode layers are substantially co-planar, forming a gate bridge contact on the second dielectric wall, and forming a gate via contact on the gate bridge contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

forming first, second, third, and fourth fin structures from a substrate, wherein the first fin structure includes a first plurality of semiconductor layers, the second fin structure includes a second plurality of semiconductor layers, the third fin structure includes a third plurality of semiconductor layers, and the fourth fin structure includes a fourth plurality of semiconductor layers, and wherein each of the first, second, third, and fourth plurality of semiconductor layers comprises first semiconductor layers and second semiconductor layers;

forming a first dielectric wall between the first fin structure and the second fin structure;

forming a second dielectric wall between the third fin structure and the fourth fin structure;

forming a sacrificial gate stack over a portion of the first, second, third, and fourth fin structures, and over a portion of the first and second dielectric walls;

removing a portion of the first, second, third, and fourth fin structures not covered by the sacrificial gate stack;

removing the sacrificial gate stack to expose portions of the first, second, third, and fourth fin structures;

selectively removing the second semiconductor layers of the first, second, third, and fourth plurality of semiconductor layers;

surrounding a first gate electrode layer over at least three surfaces of each of the first semiconductor layers of the third plurality of semiconductor layers, wherein the first gate electrode layer has a first conductivity type;

surrounding a second gate electrode layer over at least three surfaces of each of the first semiconductor layers of the fourth plurality of semiconductor layers, wherein the second gate electrode layer has a second conductivity type opposite the first conductivity type;

performing a planarization operation after formation of the first and second gate electrode layers such that top surfaces of the first and second dielectric walls and top surfaces of the first and second gate electrode layers are substantially co-planar;

forming a cut metal gate (CMG) structure extending through an entire thickness of at least one of the first and second gate electrode layers to electrically isolate adjacent gate regions on opposite sides of the respective first and second dielectric wall;

forming a gate bridge contact on the second dielectric wall after formation of the CMG structure, the gate bridge contact electrically coupling gate electrode layers having a same conductivity type; and forming a gate via contact on the gate bridge contact.

2. The method of claim 1, wherein the CMG structure is in contact with the second gate electrode layer.

3. The method of claim 1, further comprising:

forming an interfacial layer surrounding the at least three surfaces of each of the first semiconductor layer of the third plurality of semiconductor layers and the at least three surfaces of each of the first semiconductor layer of the fourth plurality of semiconductor layers; and forming a high-k dielectric layer on the interfacial layer, wherein the high-k dielectric layer is disposed between the interfacial layer and the first gate electrode layer, and between the interfacial layer and the second gate electrode layer.

4. The method of claim 1, further comprising:

removing the second fin structure disposed on one side of the first dielectric wall.

5. The method of claim 1, wherein the planarization operation is performed such that a height of the dielectric wall above a topmost semiconductor layer is controlled to prevent a gate via contact from punching through the dielectric wall.

6. A method for forming a semiconductor device structure, comprising:

forming a first dielectric wall that laterally separates n-type and p-type forksheet transistor regions;

forming a plurality of first semiconductor layers vertically stacked and extending outwardly from a first side of the first dielectric wall;

forming a plurality of second semiconductor layers vertically stacked and extending outwardly from a second side of the first dielectric wall;

forming a first gate electrode layer surrounding at least three surfaces of each of the first semiconductor layers, and the first gate electrode layer having a first conductivity type;

forming a second gate electrode layer surrounding at least three surfaces of each of the second semiconductor layers, and the second gate electrode layer having a second conductivity type opposite the first conductivity type;

forming a cut metal gate (CMG) structure extending through an entire thickness of the second gate electrode layer, the CMG structure separating the second gate electrode layer into electrically isolated gate regions such that the first gate electrode layer and the second gate electrode layer are electrically isolated across the first dielectric wall;

forming a gate bridge contact on the first dielectric wall after formation of the CMG structure, wherein the gate bridge contact electrically couples gate electrode layers having the same conductivity type; and forming a gate via contact on the gate bridge contact.

7. The method of claim 6, further comprising:

forming a second dielectric wall, wherein the second gate electrode layer is disposed between the first dielectric wall and the second dielectric wall; and forming a plurality of third semiconductor layers vertically stacked and extending outwardly from a first side of the second dielectric wall.

8. The method of claim 7, further comprising:

forming a high-k dielectric layer in contact with a side surface of the first dielectric wall.

9. The method of claim 7, wherein the second gate electrode layer surrounds at least three surfaces of each of the third semiconductor layers.

10. The method of claim 7, wherein the CMG structure is disposed between the first dielectric wall and the second dielectric wall.

11. The method of claim 10, wherein the CMG structure is in contact with the second gate electrode layer.

12. The method of claim 6, wherein the gate bridge contact is further in contact with the first gate electrode layer and the second electrode layer.

13. The method of claim 6, wherein the gate bridge contact has a first width and the first dielectric wall has a second width less than the first width.

14. The method of claim 6, wherein a portion of a bottom of the gate bridge contact is extended into a top portion of the first dielectric wall.

15. The method of claim 6, further comprising:

forming a source/drain contact adjacent to the first gate electrode layer;

forming a metal on gate bridge contact, comprising:

a lower portion in contact with the first gate electrode layer; and an upper portion extending from over the first gate electrode layer to over the source/drain contact; and forming a via bridge contact in contact with the metal on gate bridge contact.

16. A method for forming a semiconductor device structure, comprising:

forming a first dielectric wall;

forming a plurality of first semiconductor layers vertically stacked and extending outwardly from a first side of the first dielectric wall;

forming a second dielectric wall in parallel with the first dielectric wall;

forming a plurality of second semiconductor layers vertically stacked and extending outwardly from both sides of the second dielectric wall;

forming a third dielectric wall in parallel with the first dielectric wall;

forming a plurality of third semiconductor layers vertically stacked and extending outwardly from a first side of the third dielectric wall;

forming a gate structure over a portion of the first, second, and third dielectric walls, the gate structure comprising oppositely doped gate electrode regions separated by at least one cut metal gate (CMG) structure extending through an entire thickness of a gate electrode layer;

forming a source/drain contact over a portion of the first dielectric wall and in contact with an epitaxial source/drain feature;

forming a metal on gate bridge contact over the gate structure and in contact with a portion of the gate structure and the source/drain contact; and forming a gate bridge contact over a portion of the gate structure and in contact with the second dielectric wall, wherein the gate bridge contact is formed after formation of the CMG structure and electrically couples with gate electrode regions having a same conductivity type.

17. The method of claim 16, wherein the gate structure further comprises:

a first gate electrode layer surrounding at least three surfaces of each of the second semiconductor layers located on a first side of the second dielectric wall, and the first gate electrode layer having a first conductivity type; and a second gate electrode layer surrounding at least three surfaces of each of the second semiconductor layers located on a second side of the second dielectric wall, and the second gate electrode layer having a second conductivity type opposite the first conductivity type.

18. The method of claim 17, wherein the CMG structure is disposed between the second dielectric wall and the third dielectric wall.

19. The method of claim 18, wherein the CMG structure is in contact with the second gate electrode layer.

20. The method of claim 17, wherein the metal on gate bridge contact comprises:

a lower portion in contact with the first gate electrode layer; and an upper portion extending from over the first gate electrode layer to over the source/drain contact.

* * * * *